US008873174B2

(12) United States Patent
Gutierrez et al.

(10) Patent No.: US 8,873,174 B2
(45) Date of Patent: Oct. 28, 2014

(54) MOUNTING FLEXURE CONTACTS

(71) Applicant: DigitalOptics Corporation MEMS, Arcadia, CA (US)

(72) Inventors: Roman C. Gutierrez, Arcadia, CA (US); Ankur Jain, Arcadia, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 0 days.

(21) Appl. No.: 14/101,280

(22) Filed: Dec. 9, 2013

(65) Prior Publication Data

US 2014/0097723 A1 Apr. 10, 2014

Related U.S. Application Data

(63) Continuation of application No. 12/946,466, filed on Nov. 15, 2010, now Pat. No. 8,605,375, and a continuation of application No. 12/946,515, filed on Nov. 15, 2010.

(51) Int. Cl.
*G02B 7/00* (2006.01)
*H02N 2/00* (2006.01)
*B81B 7/00* (2006.01)

(52) U.S. Cl.
CPC ........ *H02N 2/005* (2013.01); *B81B 2203/0154* (2013.01); *B81B 2207/07* (2013.01); *B81B 2201/033* (2013.01); *B81B 7/0006* (2013.01)
USPC ........................................................ 359/824

(58) Field of Classification Search
USPC .......................................... 359/824; 438/430
See application file for complete search history.

(56) References Cited

U.S. PATENT DOCUMENTS 2,774,001 A   12/1956 Riedel
4,333,722 A    6/1982 Lee
(Continued)

FOREIGN PATENT DOCUMENTS

EP   1 959 284    8/2008
EP   2 264 507   12/2010
(Continued)

OTHER PUBLICATIONS

Chu et al., "Design, Fabrication and Control of Components in MEMS-Based Optical Pickups," IEEE Transactions on Magnetics, IEEE Service Center, New York, US, vol. 17, No. 2, Feb. 1, 2007, pp. 780-784.

(Continued)

*Primary Examiner* — Joseph P Martinez
(74) *Attorney, Agent, or Firm* — Haynes and Boone, LLP

(57) ABSTRACT

A device may comprise a flexure formed of a first semiconductor material. A first trench may be formed in the flexure. The first trench may separate the first semiconductor material into a first portion and a second portion thereof. An oxide layer may be formed in the first trench. The oxide layer may extend over a top portion of the first semiconductor material. A second semiconductor material may be formed on the oxide layer. The first trench and the oxide layer may cooperate to electrically isolate the first portion and the second portion from one another.

20 Claims, 50 Drawing Sheets

(56) References Cited

U.S. PATENT DOCUMENTS

| | | | |
|---|---|---|---|
| 4,384,778 A | 5/1983 | Lee et al. | |
| 4,408,857 A | 10/1983 | Frank | |
| 4,496,217 A | 1/1985 | Aoyagi | |
| 4,716,432 A | 12/1987 | Stephany | |
| 4,860,040 A | 8/1989 | Tammamura et al. | |
| 5,150,260 A | 9/1992 | Chigira | |
| 5,386,294 A | 1/1995 | Ototake et al. | |
| 5,699,621 A | 12/1997 | Trumper et al. | |
| 5,825,560 A | 10/1998 | Ogura et al. | |
| 5,867,302 A | 2/1999 | Fleming | |
| 5,986,826 A | 11/1999 | Kosaka et al. | |
| 5,995,688 A | 11/1999 | Aksyuk et al. | |
| 6,033,131 A | 3/2000 | Ghosh et al. | |
| 6,068,801 A | 5/2000 | Bodö et al. | |
| 6,205,267 B1 | 3/2001 | Aksyuk et al. | |
| 6,239,473 B1 * | 5/2001 | Adams et al. | 257/419 |
| 6,262,827 B1 | 7/2001 | Ueda et al. | |
| 6,291,875 B1 | 9/2001 | Clark et al. | |
| 6,392,703 B1 | 5/2002 | Uchino et al. | |
| 6,426,777 B1 | 7/2002 | Sato | |
| 6,497,141 B1 | 12/2002 | Turner et al. | |
| 6,535,311 B1 | 3/2003 | Lindquist | |
| 6,675,671 B1 | 1/2004 | Jokiel, Jr. et al. | |
| 6,679,055 B1 | 1/2004 | Ellis | |
| 6,806,991 B1 | 10/2004 | Sarkar et al. | |
| 6,847,907 B1 | 1/2005 | Novotny | |
| 6,850,675 B1 | 2/2005 | Culvet et al. | |
| 6,914,635 B2 | 7/2005 | Ostergard | |
| 6,950,570 B1 | 9/2005 | Novotny | |
| 6,958,777 B1 | 10/2005 | Pine | |
| 7,027,206 B2 | 4/2006 | Mochizuki | |
| 7,038,150 B1 | 5/2006 | Polosky et al. | |
| 7,113,688 B2 | 9/2006 | Calvet et al. | |
| 7,148,603 B1 | 12/2006 | Garcia et al. | |
| 7,154,199 B2 | 12/2006 | Yasuda | |
| 7,190,854 B1 | 3/2007 | Novotny et al. | |
| 7,266,272 B1 | 9/2007 | Calvet et al. | |
| 7,285,879 B2 | 10/2007 | Osaka | |
| 7,359,131 B1 | 4/2008 | Gutierrez et al. | |
| 7,372,074 B2 | 5/2008 | Milne et al. | |
| 7,436,207 B2 | 10/2008 | Rogers et al. | |
| 7,477,842 B2 | 1/2009 | Gutierrez | |
| 7,545,591 B1 | 6/2009 | Tong et al. | |
| 7,555,210 B2 | 6/2009 | Calvet | |
| 7,557,470 B2 | 7/2009 | Culpepper et al. | |
| 7,579,848 B2 | 8/2009 | Bottoms et al. | |
| 7,586,702 B1 | 9/2009 | Huang et al. | |
| 7,645,627 B2 | 1/2010 | Christenson et al. | |
| 7,646,969 B2 | 1/2010 | Calvet et al. | |
| 7,705,909 B2 | 4/2010 | Ishizawa et al. | |
| 7,720,366 B2 | 5/2010 | Iwasaki et al. | |
| 7,838,322 B1 | 11/2010 | Vargo et al. | |
| 7,855,489 B2 | 12/2010 | Hirano | |
| 7,872,394 B1 | 1/2011 | Gritters et al. | |
| 7,990,628 B1 | 8/2011 | Calvet et al. | |
| 8,004,780 B2 | 8/2011 | Gutierrez et al. | |
| 8,178,936 B2 | 5/2012 | Zhe et al. | |
| 8,299,598 B2 | 10/2012 | Moden | |
| 2001/0004420 A1 | 6/2001 | Kuwana et al. | |
| 2002/0006687 A1 | 1/2002 | Lam | |
| 2002/0070634 A1 | 6/2002 | Tai et al. | |
| 2002/0105699 A1 | 8/2002 | Miracky et al. | |
| 2002/0125789 A1 | 9/2002 | Brandt | |
| 2002/0130586 A1 | 9/2002 | Mao et al. | |
| 2003/0026547 A1 | 2/2003 | Trzecieski | |
| 2003/0048036 A1 | 3/2003 | Lemkin | |
| 2003/0062422 A1 | 4/2003 | Fateley et al. | |
| 2003/0063838 A1 | 4/2003 | Hagood et al. | |
| 2003/0076421 A1 | 4/2003 | Dutta | |
| 2003/0086751 A1 | 5/2003 | Culpepper | |
| 2003/0210116 A1 | 11/2003 | Lane et al. | |
| 2004/0048410 A1 | 3/2004 | O'Brien et al. | |
| 2004/0066494 A1 | 4/2004 | Lee et al. | |
| 2004/0136680 A1 | 7/2004 | Medina et al. | |
| 2004/0183936 A1 | 9/2004 | Kim et al. | |
| 2004/0184132 A1 | 9/2004 | Novotny et al. |
| 2004/0189969 A1 | 9/2004 | Mizuno |
| 2004/0201773 A1 | 10/2004 | Ostergard |
| 2005/0000311 A1 | 1/2005 | Storm |
| 2005/0002008 A1 | 1/2005 | De Weerdt et al. |
| 2005/0002086 A1 | 1/2005 | Starweather et al. |
| 2005/0007489 A1 | 1/2005 | Ahn et al. |
| 2005/0095813 A1 | 5/2005 | Zhu et al. |
| 2005/0139542 A1 | 6/2005 | Dickensheets et al. |
| 2005/0148433 A1 | 7/2005 | Wang et al. |
| 2005/0156481 A1 | 7/2005 | Zhou et al. |
| 2005/0219399 A1 | 10/2005 | Sato et al. |
| 2005/0249487 A1 | 11/2005 | Gutierrez |
| 2006/0028320 A1 | 2/2006 | Osaka |
| 2006/0033938 A1 | 2/2006 | Kopf et al. |
| 2006/0056084 A1 | 3/2006 | Araki |
| 2006/0092514 A1 | 5/2006 | Koo et al. |
| 2006/0153556 A1 | 7/2006 | Lee et al. |
| 2006/0183332 A1 | 8/2006 | Kang |
| 2006/0192858 A1 | 8/2006 | Calvet |
| 2006/0193618 A1 | 8/2006 | Calvet |
| 2006/0204242 A1 | 9/2006 | Gutierrez et al. |
| 2006/0209012 A1 | 9/2006 | Hagood, IV |
| 2006/0219006 A1 | 10/2006 | Nasiri et al. |
| 2006/0250325 A1 | 11/2006 | Hagood et al. |
| 2006/0252297 A1 | 11/2006 | Culpepper |
| 2006/0277997 A1 | 12/2006 | Foster et al. |
| 2007/0024155 A1 | 2/2007 | Culvet et al. |
| 2007/0133976 A1 | 6/2007 | Gutierrez et al. |
| 2008/0020573 A1 | 1/2008 | Birkmeyer et al. |
| 2008/0044172 A1 | 2/2008 | Tang et al. |
| 2008/0054757 A1 | 3/2008 | Aksyuk et al. |
| 2008/0198249 A1 | 8/2008 | Tanimura et al. |
| 2008/0240704 A1 | 10/2008 | Takahashi |
| 2008/0279498 A1 | 11/2008 | Sampsell et al. |
| 2008/0309191 A1 | 12/2008 | Chou et al. |
| 2009/0031548 A1 | 2/2009 | Zaitsu et al. |
| 2009/0185796 A1 | 7/2009 | Tsutsumi et al. |
| 2009/0213236 A1 | 8/2009 | Chiou et al. |
| 2009/0244302 A1 | 10/2009 | Tsai |
| 2009/0244668 A1 | 10/2009 | Fujino et al. |
| 2009/0284816 A1 | 11/2009 | Davis et al. |
| 2009/0310959 A1 | 12/2009 | Shih et al. |
| 2010/0232777 A1 | 9/2010 | Tseng et al. |
| 2010/0284081 A1 | 11/2010 | Gutierrez et al. |
| 2011/0026148 A1 | 2/2011 | Tanimura et al. |

FOREIGN PATENT DOCUMENTS

| | | |
|---|---|---|
| JP | 2006-297543 | 11/2006 |
| JP | 2008-010624 | 1/2008 |
| JP | 2010-145264 | 7/2010 |
| JP | 2010-167536 | 8/2010 |
| KR | 2008-0079115 | 8/2008 |
| WO | WO/99/36941 | 7/1999 |
| WO | WO 02/063371 | 8/2002 |
| WO | WO 2006/093934 | 9/2006 |
| WO | WO 2008/061025 | 5/2008 |
| WO | WO 2010/038229 | 4/2010 |

OTHER PUBLICATIONS

Kim et al., Integrated Micro Optical Flying Head with Lens Positioning Actuator for Small Form Factor Data Storage, Transducers '03, 12th International Conference on Solid-State Sensors, Actuators and Microsystems. Digest of Technical Papers (Cat. No. 03TH8664), vol. 1, Jan. 1, 2003, pp. 607-610.

Koga et al. "Electrostatic Linear Microactuator Mechanism for Focusing a CCD Camera"; Journal of Lightwave Technology, vol. 17, No. 1: p. 43-47; Jan. 1999.

Kwon et al., "Large Displacement Vertical Microlens Scanner with Low Driving Voltage," IEEE Photonics Technology Letters, IEEE Service Center, Piscataway, NJ, US, vol. 14, No. 11, Nov. 1, 2002.

(56) References Cited

OTHER PUBLICATIONS

Takahashi et al.; "Switched-Layer Design for SOI Bulk Micromachined XYZ Stage Using Stiction Bar for Interlayer Electrical Connection," Journal of Microelectromechanical Systems, IEEE Service Center, US, vol. 18, No. 4, pp. 818-827, Aug. 1, 2009.

Tsuboi et al., "A Rotational Comb-Driven Micromirror with a Large Deflection Angle and Low Drive Voltage," Technical Digest MEMS. IEEE International Conference on Microelectro Mechanical Systems, Jan. 20, 2002, pp. 532-535.

Wu et al., "Development of Tracking and Focusing Micro Actuators for Dual-Stage Optical Pick-Up Head," Journal of Optics. A, Pure and Applied Optics, Institute of Physics Publishing, Bristol, GB, vol. 8, No. 7, Jul. 1, 2006, pp. S323-S329.

\* cited by examiner

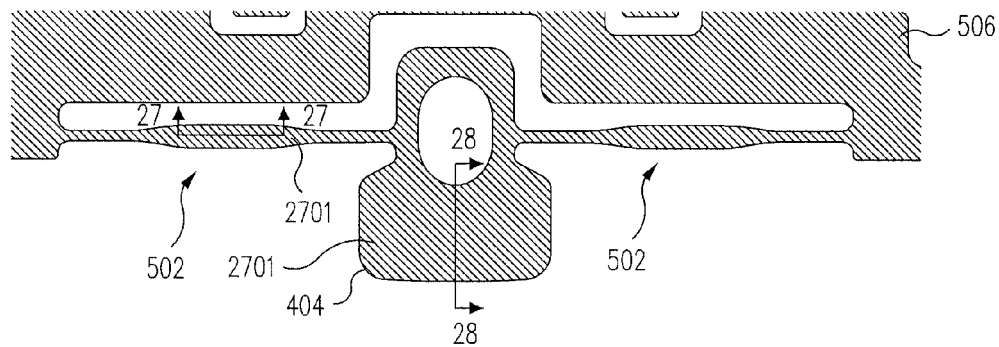
FIG. 26
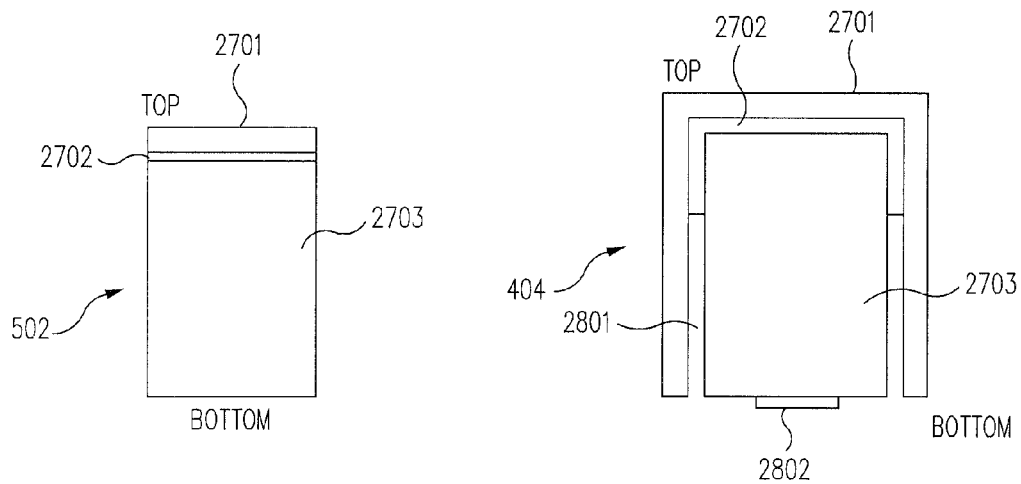
FIG. 27
FIG. 28

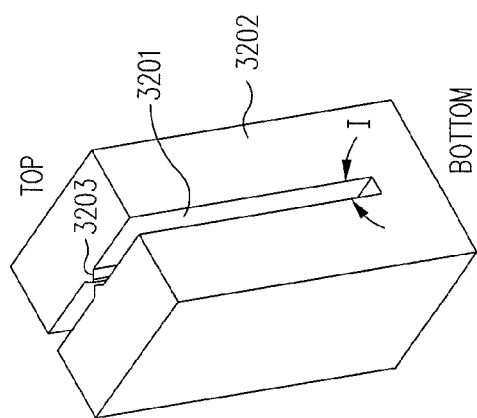
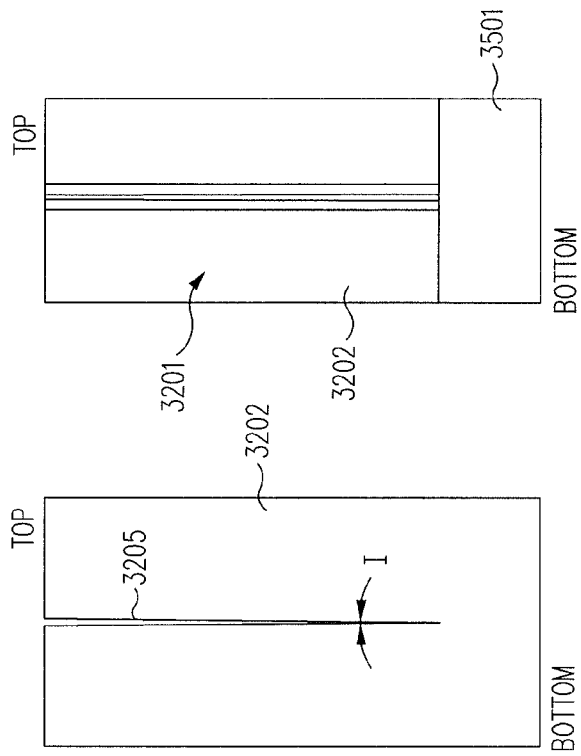
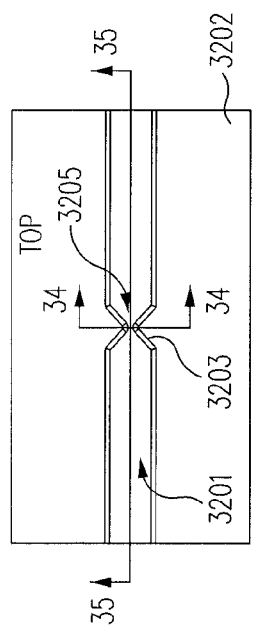
FIG. 35
FIG. 34
FIG. 33
FIG. 32

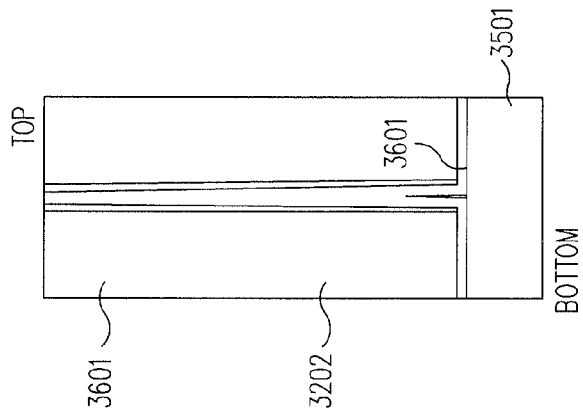
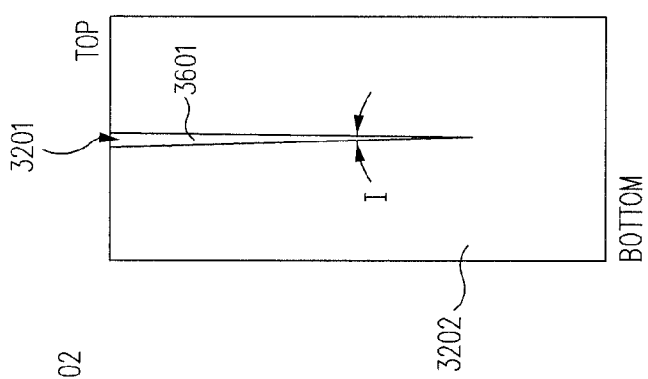
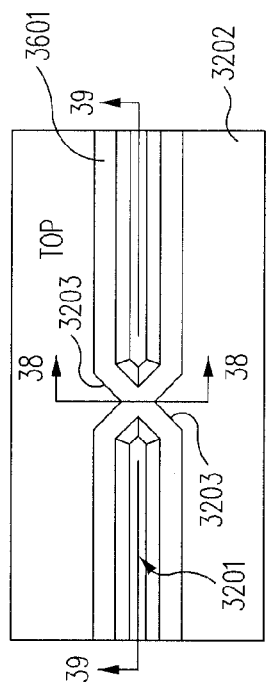
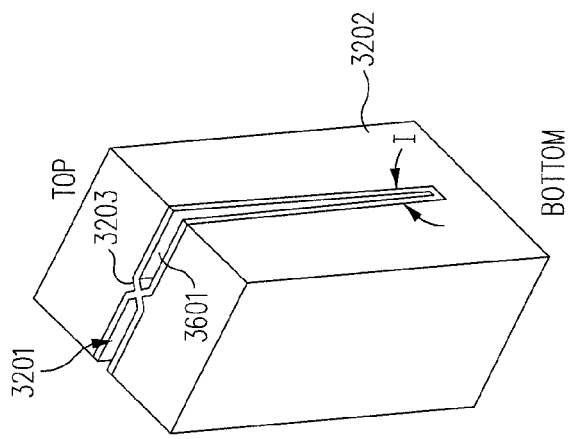
FIG. 39
FIG. 38
FIG. 37
FIG. 36

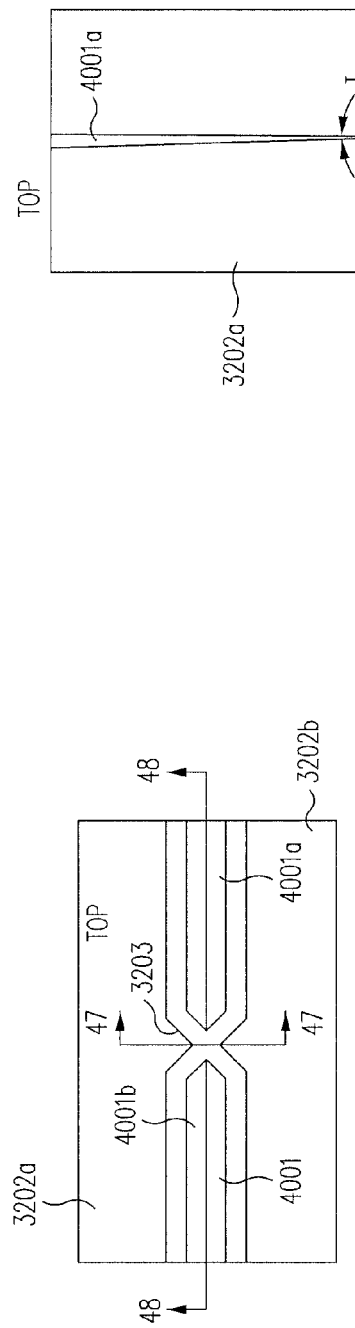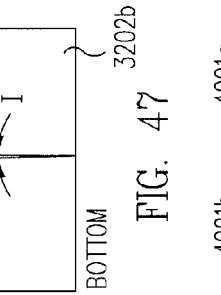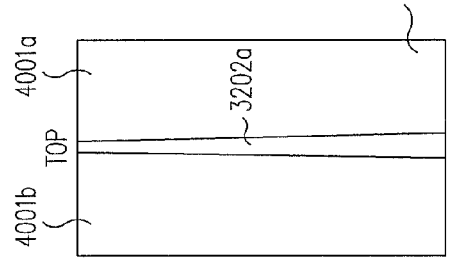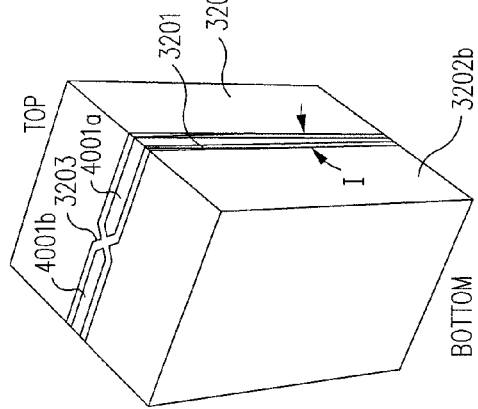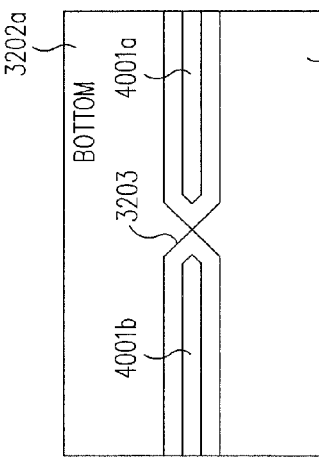

MOUNTING FLEXURE CONTACTS

CROSS REFERENCE TO RELATED APPLICATIONS

This application is a continuation of U.S. patent application Ser. No. 12/946,466 filed Nov. 15, 2010, which is incorporated herein by reference in its entirety as part of the present disclosure.

BACKGROUND

1. Technical Field

This disclosure generally relates to semiconductor manufacturing techniques and more particularly relates, for example, to microelectromechanical systems (MEMS) manufacturing techniques suitable for use in actuators and other devices.

2. Related Art

Actuators for use in miniature cameras and other devices are well known. Such actuators typically comprise voice coils that are used to move a lens for focusing, zooming, or optical image stabilization.

Miniature cameras are used in a variety of different electronic devices. For example, miniature cameras are commonly used in cellular telephones, laptop computers, and surveillance devices. Miniature cameras may have many other applications.

It is frequently desirable to reduce the size of miniature cameras. As the size of electronic devices continues to be reduced, the size of miniature cameras that are part of such electronic devices must typically be reduced as well. Reduction in the size of the miniature cameras may be facilitated via the use of microelectromechanical systems (MEMS) manufacturing techniques. For example, microelectromechanical systems (MEMS) manufacturing techniques may be used to facilitate the fabrication of smaller actuators and the like.

SUMMARY

According to an embodiment, a device may comprise a flexure formed of a first semiconductor material. A first trench may be formed in the flexure. The first trench may separate the first semiconductor material into a first portion and a second portion thereof. An oxide layer may be formed in the first trench. The oxide layer may extend over a top portion of the first semiconductor material. A second semiconductor material may be formed on the oxide layer. The first trench and the oxide layer may cooperate to electrically isolate the first portion and the second portion from one another.

According to an embodiment, a system may comprise an outer frame and an actuator formed to the outer frame. A flexure may be formed of a first semiconductor material and may be formed to the outer frame. A first trench may be formed in the flexure and may separate the first semiconductor material into a first portion and a second portion thereof. An oxide layer may be formed in the first trench and may extending over a top portion of the first semiconductor material. A second semiconductor material may be formed on the oxide layer. The first trench and the oxide layer may cooperate to electrically isolate the first portion and the second portion from one another.

According to an embodiment, a method may comprise forming a flexure. A trench may be formed within the flexure. An oxide layer may be formed within the trench. A conductive material may be formed upon the oxide layer.

According to an embodiment, a method may comprise applying a voltage to an actuator of an actuator device via a conductor formed in a trench of a flexure of the actuator device. The flexure may attach the actuator device to a lens barrel.

The scope of the disclosure is defined by the claims, which are incorporated into this section by reference. A more complete understanding of embodiments will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

FIG. 26 illustrates the kinematic mount flexure having the electrical contact, in accordance with an embodiment.

FIG. 27 illustrates a cross-section of the electrical contact taken along line 27 of FIG. 26, in accordance with an embodiment.

FIG. 28 illustrates a cross-section of the electrical contact taken along line 28 of FIG. 26, in accordance with an embodiment.

FIG. 32 illustrates a perspective view of a substrate with a trench having a pinch formed therein, in accordance with an embodiment.

FIG. 33 illustrates a top view of the substrate, in accordance with an embodiment.

FIG. 34 illustrates a cross-sectional view of the substrate taken along line 34 of FIG. 33, in accordance with an embodiment.

FIG. 35 illustrates a cross-sectional view of the substrate taken along line 35 of FIG. 33, in accordance with an embodiment.

FIG. 36 illustrates a perspective view of the substrate having an oxide layer formed therein, in accordance with an embodiment.

FIG. 37 illustrates a top view of the substrate, in accordance with an embodiment.

FIG. 38 illustrates a cross-sectional view of the substrate taken along line 38 of FIG. 37, in accordance with an embodiment.

FIG. 39 illustrates a cross-sectional view of the substrate taken along line 39 of FIG. 37, in accordance with an embodiment.

FIG. 44 illustrates a perspective view of the substrate after a wafer thinning and oxide removal process, in accordance with an embodiment.

FIG. 45 illustrates a top view of the substrate, in accordance with an embodiment.

FIG. 46 illustrates a bottom view of the substrate, in accordance with an embodiment.

FIG. 47 illustrates a cross-sectional view of the substrate taken along line 47 of FIG. 45, in accordance with an embodiment.

FIG. 48 illustrates a cross-sectional view of the substrate taken along line 48 of FIG. 45, in accordance with an embodiment.

Embodiments of the disclosure and their advantages are best understood by referring to the detailed description that follows. It should be appreciated that like reference numerals are used to identify like elements illustrated in one or more of the figures.

DETAILED DESCRIPTION

Figure 1:
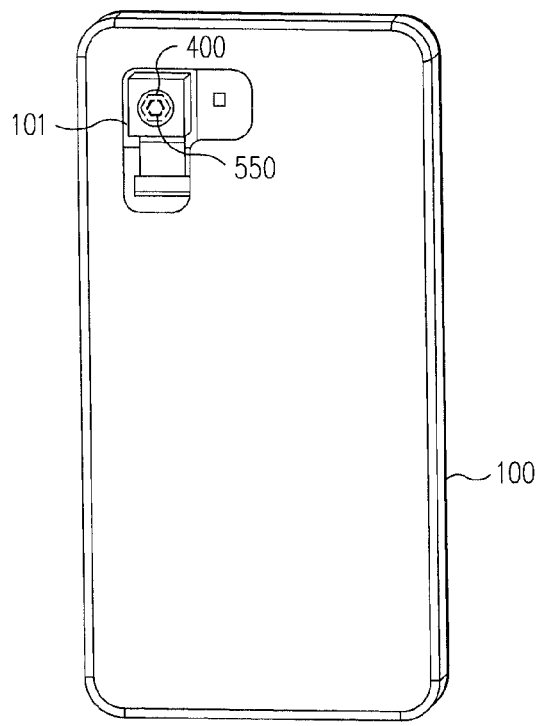
FIG. 1 illustrates an electronic device having an actuator device, in accordance with an embodiment.

An actuator device suitable for use in a wide variety of different electronic devices is disclosed in accordance with various embodiments. The actuator device may be adapted for use in a camera, such as a miniature camera, for example. The actuator device may be used to either manually or automatically focus the miniature camera. The actuator device may be used to zoom the miniature camera or to provide optical image stabilization for the miniature camera. The actuator device may be used to align the optics within the camera. The actuator device may be used for any other desired application in an electronic device or in any other device.

In accordance with one or more embodiments, the actuator device may comprise one or more MEMS actuators. The actuator device may be formed using monolithic construction. The actuator device may be formed using non-monolithic construction.

The actuator device may be formed using contemporary fabrication techniques, such as etching and micromachining, for example. Various other fabrication techniques are contemplated.

The actuator device may be formed of silicon (e.g., single crystal silicon and/or polycrystalline silicon). The actuator device may be formed of other semiconductors such as silicon, germanium, diamond, and gallium arsenide. The material of which the actuator device is formed may be doped to obtain a desired conductivity thereof. The actuator device may be formed of a metal such as tungsten, titanium, germanium, aluminum, or nickel. Any desired combination of such materials may be used.

Motion control of the actuator device and/or items moved by the actuator device is disclosed in accordance with various embodiments. The motion control may be used to facilitate a desired movement of an item while mitigating undesired movement of the item. For example, the motion control may be used to facilitate movement of a lens along an optical axis of the lens, while inhibiting other movements of the lens. Thus, the motion control may be used to facilitate movement of the lens in single desired translational degree of freedom while inhibiting movement of the lens in all other translational degrees of freedom and while inhibiting movement of the lens in all rotational degrees of freedom. In another example, the motion control may facilitate movement of the lens in all three translational degrees of freedom while inhibiting movement of the lens in all rotational degrees of freedom.

Thus, an enhanced miniature camera for standalone use and for use in electronic devices may be provided. The miniature camera is suitable for use in a wide variety of different electronic devices. For example, the miniature camera is suitable for use in electronic devices such as cellular telephones, laptop computers, televisions, handheld devices, and surveillance devices.

According to various embodiments, smaller size and enhanced shock resistance are provided. Enhanced fabrication techniques may be used to provide these and other advantages. Such fabrication techniques may additionally enhance the overall quality and reliability of miniature cameras while also substantially reducing the cost thereof.

FIG. 1 illustrates an electronic device 100 having an actuator device 400, in accordance with an embodiment. As discussed herein, the actuator device 400 may have one or more actuators 550. In one embodiment, the actuators 550 may be MEMS actuators, such as electrostatic comb drive actuators. In one embodiment, the actuators 550 may be rotational comb drive actuators.

The electronic device 100 may have one or more actuators 550 for moving any desired component thereof. For example, the electronic device 100 may have an optical device such as a miniature camera 101 that has the actuator 550 for moving optical elements such as one or more movable lenses 301 (shown in FIG. 2) that are adapted to provide focus, zoom, and/or image stabilization. The electronic device 100 may have any desired number of the actuators 550 for performing any desired functions.

The electronic device 100 may be a cellular telephone, a laptop computer, a surveillance device, or any other desired device. The miniature camera 101 may be built into the electronic device 100, may be attached to the electronic device 100, or may be separate (e.g., remote) with respect to the electronic device 100.

Figure 2:
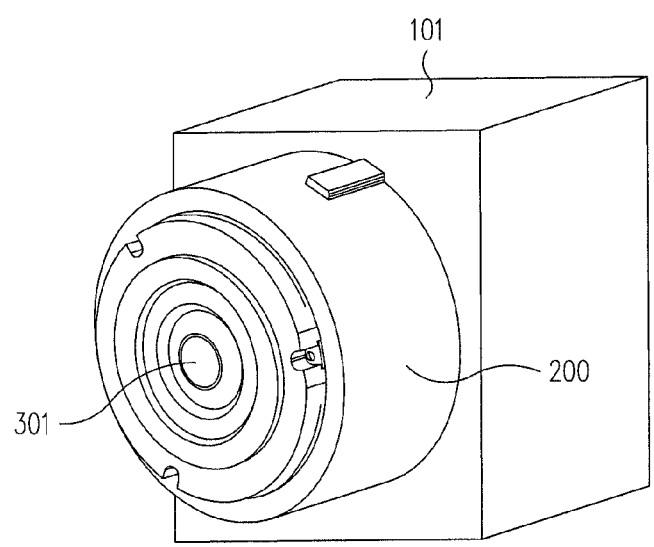
FIG. 2 illustrates a miniature camera having a lens barrel, in accordance with an embodiment.

FIG. 2 illustrates the miniature camera 101 having a lens barrel 200, in accordance with an embodiment. The lens barrel 200 may contain one or more optical elements, such as the movable lens 301, which may be moved by the actuator device 400 (shown in FIG. 1). The lens barrel 200 may have one or more optical elements which may be fixed. For example, the lens barrel 200 may contain one or more lenses, apertures (variable or fixed), shutters, mirrors (which may be flat, non-flat, powered, or non-powered), prisms, spatial light modulators, diffraction gratings, lasers, LEDs and/or detectors. Any of these items may be fixed or may be movable by the actuator device 400.

The actuator device 400 may move non-optical devices such as samples that are provided for scanning. The samples may be either biological samples or non-biological samples. Examples of biological samples include organisms, tissues, cells, and proteins. Examples of non-biological samples include solids, liquids, and gases. The actuator device 400 may be used to manipulate structures, light, sound, or any other desired thing.

The optical elements may be partially or fully contained within the lens barrel 200. The lens barrel 200 may have any desired shape, For example, the lens barrel 200 may be substantially round, triangular, rectangular, square, pentagonal, hexagonal, octagonal, or of any other shape or cross-sectional configuration. The lens barrel 200 may be either permanently or removably attached to the miniature camera 101. The lens barrel 200 may be defined by a portion of a housing of the miniature camera 101. The lens barrel 200 may be partially or completely disposed within the miniature camera 101.

Figure 3A:
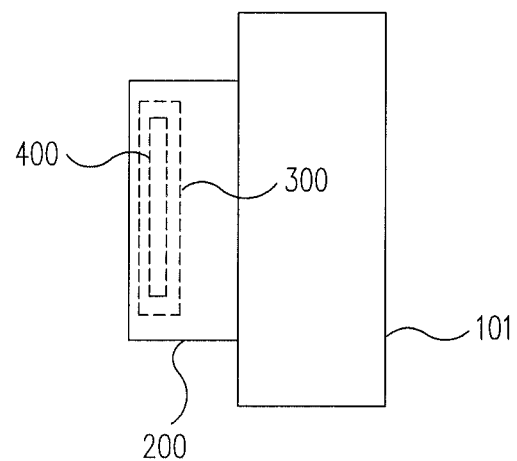
FIG. 3A illustrates the lens barrel having an actuator module disposed therein, in accordance with an embodiment.

FIG. 3A illustrates an actuator module 300 disposed within the lens barrel 200, in accordance with an embodiment. The actuator module 300 may contain the actuator device 400. The actuator device 400 may be completely contained within the lens barrel 200, partially contained within the lens barrel 200, or completely outside of the lens barrel 200. The actuator device 400 may be adapted to move optical elements contained within the lens barrel 200, optical elements not contained within the lens barrel 200, and/or any other desired items.

Figure 3B:
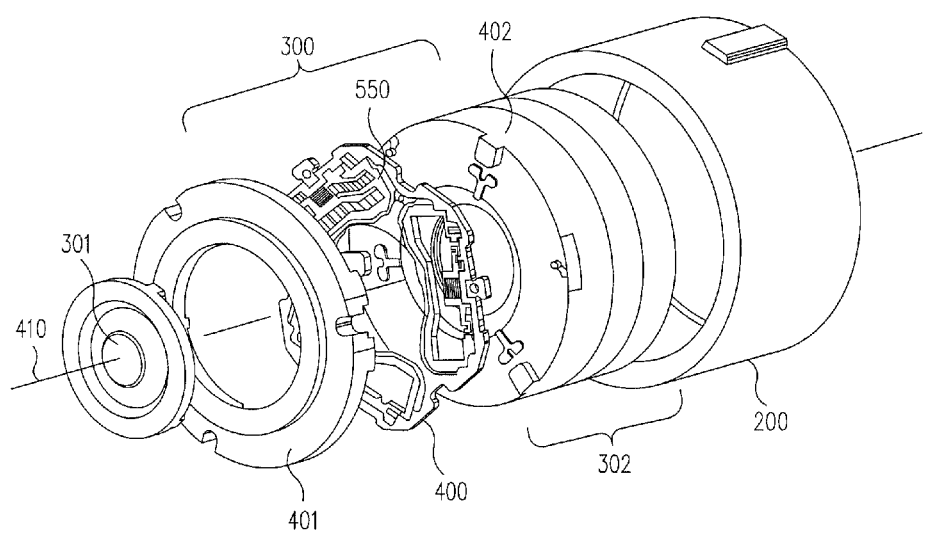
FIG. 3B illustrates the lens barrel and an actuator module in an exploded view, in accordance with an embodiment.

FIG. 3B illustrates the lens barrel 200 and the actuator module 300 in an exploded view, in accordance with an embodiment. The movable lens 301 is an example of an optical element that may be attached to the actuator device 400 and may be moved thereby. The actuator device 400 may be disposed intermediate an upper module cover 401 and a lower module cover 402.

Additional optical elements, such as fixed (e.g., stationary) lenses 302 may be provided. The additional optical elements may facilitate focus, zoom, and/or optical image stabilization, for example. Any desired number and/or type of movable (such as via the actuator device 400) and fixed optical elements may be provided.

Figure 4:
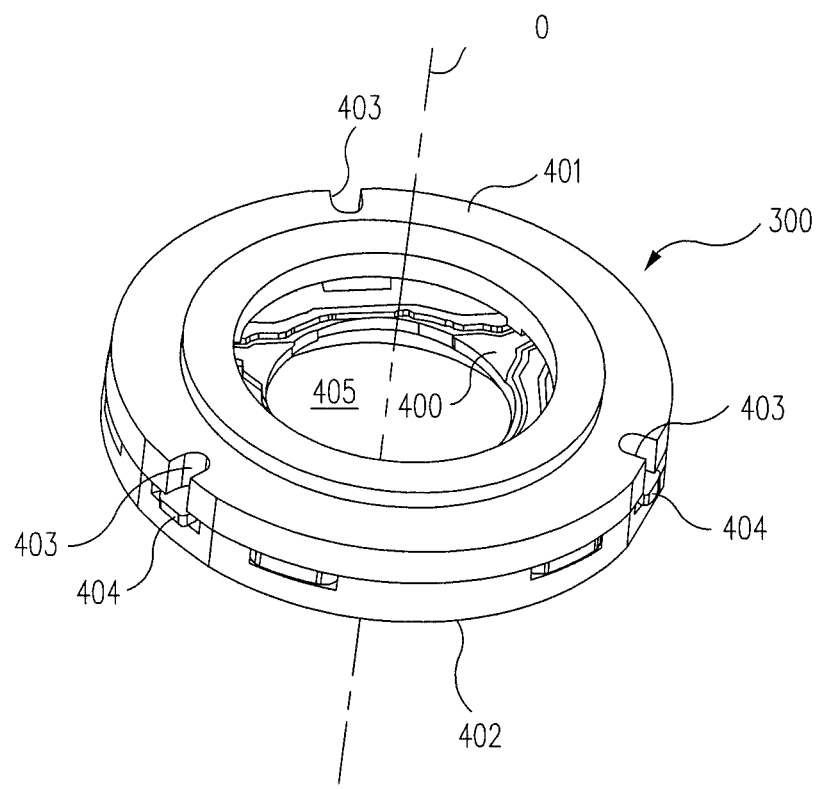
FIG. 4 illustrates the actuator module having the actuator device disposed therein, in accordance with an embodiment.

FIG. 4 illustrates the actuator module 300, in accordance with an embodiment. The actuator module 300 may be disposed partially or completely within the miniature camera 101. The actuator device 400 may be disposed partially or completely within the actuator module 300. For example, the actuator device 400 may be sandwiched substantially between an upper module cover 401 and a lower module cover 402.

The actuator module 300 may have any desired shape. For example, the actuator module 300 may be substantially round, triangular, square, rectangular, pentagonal, hexagonal, octagonal, or of any other shape or cross-sectional configuration.

In one embodiment, the lens barrel 200 may be substantially round in cross-sectional configuration and the actuator module 300 may be substantially round in cross-sectional configuration. The use of a substantially round lens barrel 200 and a substantially round actuator module 300 may facilitate an advantageous reduction in size. The reduction in size may be facilitated, for example, because round lenses are commonly preferred. The use of a substantially round lens barrel 200 and a substantially round actuator module 300 with round lenses tends to result in a reduction of wasted volume and thus tends to facilitate a reduction in size.

As discussed herein, one or more optical elements, such as the movable lens 301, may be disposed in an opening 405 (e.g., a hole) formed in the actuator module 300. Actuation of the actuators 550 may effect movement of the optical elements along their optical axis 410, for example. Thus, actuation of the actuators 550 may move one or more lenses to effect focusing or zoom, for example.

The actuator module 300 may have cutouts 403 formed therein to facilitate assembly of the actuator module 300 and alignment of the actuator device 400 contained therein. The cutouts 403 and/or electrical contacts 404 partially disposed within the cutouts 403 may be used to facilitate alignment of the actuator module 300 with respect to the lens barrel 200.

Figure 5A:
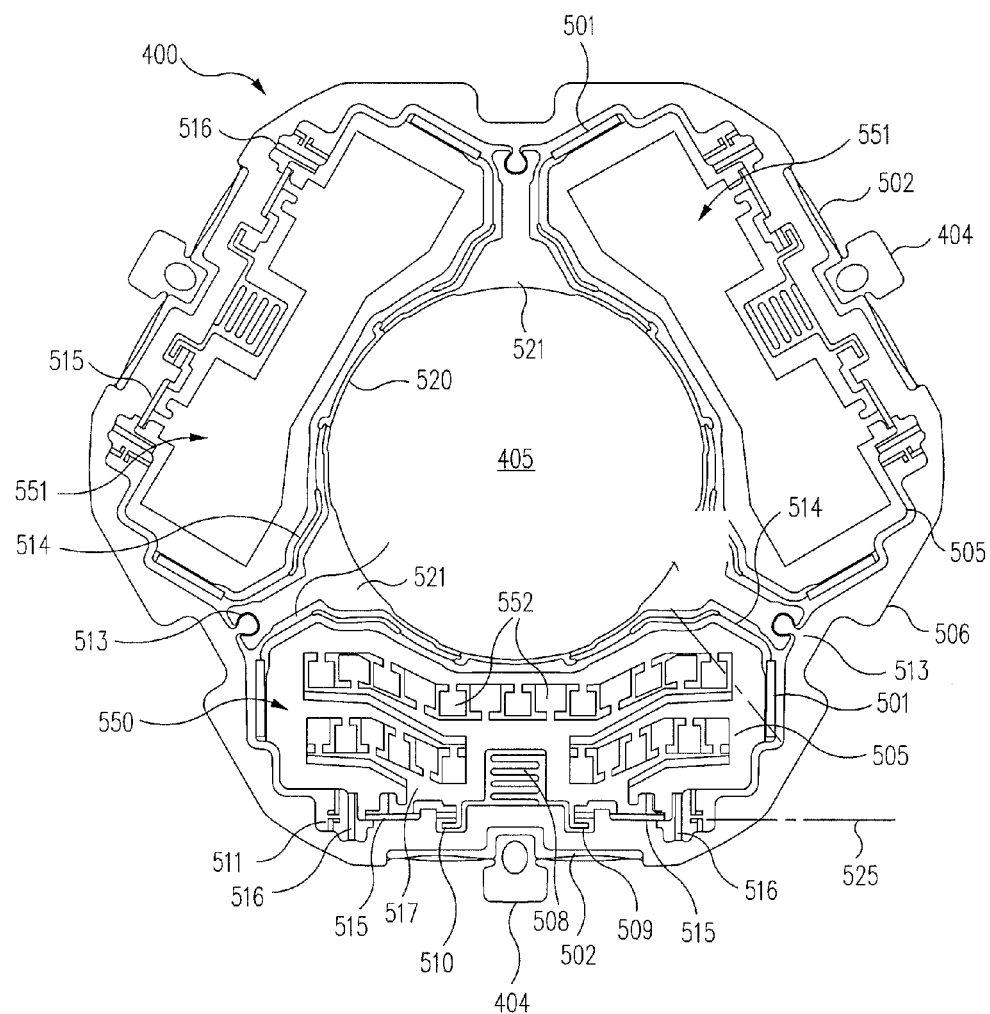
FIG. 5A illustrates a top view of the actuator device, in accordance with an embodiment.

FIG. 5A illustrates a top view of the actuator device 400 having the electrical contacts 404, the opening 405, inner hinge flexures 501, kinematic mount flexures 502, movable frames 505, an outer frame 506, serpentine contact flexures 508, deployment torsional flexures 509, deployment stops 510, flap dampers 511, ball-in-socket snubbers 513, cantilever flexures 514, motion control torsional flexures 515, outer hinge flexures 516, a fixed frame 517, a platform 520, lens pads 521, a pivot axis 525, the actuators 550, spaces 551, and blocks 552, in accordance with an embodiment.

Blocks 552 (FIG. 5A) are shown to represent teeth 560 (see FIGS. 5B and 7) of the actuator 550 in some figures. Those skilled in the art will appreciate that comb drives typically comprise a large number of very small teeth 560 that are difficult to show graphically on a drawing of this scale. For example, the actuator 550 may have between 1 and 10,000 teeth on each side thereof and may have approximately 2,000 teeth on each side thereof. Thus, in one embodiment, the blocks 552 may not represent the actual configuration of the teeth 560, but rather are shown in place of the teeth 560 to better illustrate the operation of the actuators 550, as discussed herein.

In accordance with an embodiment, the actuator device 400 may be substantially hexagonal in shape. The hexagonal shape readily facilitates placement of the actuator device 400 within the substantially round lens barrel 200. The hexagonal shape also facilitates efficient use of wafer real estate. Other shapes are contemplated.

The actuator device 400 may have a plurality of the actuators 550. Only one actuator 550 is illustrated in detail in FIG. 5A. The spaces 551 are shown in FIG. 5A for two additional actuators 550 that are not illustrated in detail. Thus, in one embodiment the actuator device 400 may have three actuators 550 disposed in a substantially radially symmetric pattern about the opening 405 such that the actuators 550 are spaced approximately 120° apart from one another. The actuator device 400 may have any desired number of the actuators 550 disposed in any desired pattern. As further examples, the actuator device 400 may have two actuators 550 spaced approximately 180° apart from one another or may have four actuators 550 spaced approximately 90° apart from one another.

As discussed herein, the actuators 550 may include one or more MEMS actuators, voice coil actuators, or any other desired type or combination of types of actuators. For example, in one embodiment, each actuator 550 may be a vertical rotational comb drive.

The actuators 550 may cooperate with one another to move a platform 520 along the optical axis 410 (FIG. 3B), which in FIG. 5A is perpendicular to the plane of the actuator device 400. The actuators 550 may cooperate with one another to move the platform 520 in a manner that maintains the platform 520 substantially orthogonal with respect to the optical axis 410 and in a manner that substantially mitigates rotation of the platform 520.

Actuation of the actuators 550 is accomplished by the application of a voltage differential between adjacent teeth 560, represented by blocks 552. Such actuation effects rotation of the actuators 550 to facilitate the herein described movement of the platform 520.

In various embodiments, the platform 520 may be adapted substantially as a ring (e.g., as shown in FIG. 5A). Other shapes are contemplated. The platform 520 may have any desired shape.

Prior to deployment, the actuator device 400 may be a substantially planar structure. For example, the actuator device 400 may be substantially formed from a single, monolithic piece of material, such as silicon. The actuator device 400 may be formed from a single die. The die may be approximately 4 to 5 millimeters across and approximately 150 microns thick, for example.

The actuator device 400 may be formed by a MEMS technique, such as milling or etching. A plurality of actuator devices 400 may be formed upon a single wafer. The overall shape or footprint of the actuator device 400 may be adapted to enhance the formation of a plurality of the actuator devices 400 on a single wafer.

Prior to operation, the fixed frame 517 of each actuator 550 may be deployed to offset the adjacent pairs of teeth 560 represented by blocks 552 with respect to one another, in accordance with an embodiment. Deployment may result in a substantially non-planar overall configuration of the actuator device 400. When deployed, each actuator 550 may have a portion thereof (e.g., the fixed frame 517) extending from the plane of the outer frame 506. The fixed frame 517 may extend from the plane of the outer frame 506 at an angle with respect thereto. Thus, when deployed, the fixed frame 517 may be substantially out-of-plane with respect to the outer frame 506.

Once deployed, the fixed frames 517 may be fixed or locked into position such that they do not move further with respect to the outer frame 506, and are angularly offset or rotated with respect to the outer frame 506 and with respect to the movable frame 505 (when the actuator 550 is not actuated). The fixed frames 517 may be mechanically fixed in position, adhesively bonded in position, or any desired combination of mechanically fixed and adhesively bonded.

Actuation of the actuator 550 may cause the movable frame 505 to rotate toward the deployed fixed frame 517 to effect desired movement of the platform 520. Motion control torsional flexures 515 and outer hinge flexures 516 cooperate to facilitate motion controlled rotation of the movable frame 505, as discussed herein. The movable frame 505 rotates about the pivot axis 525.

Figure 5B:
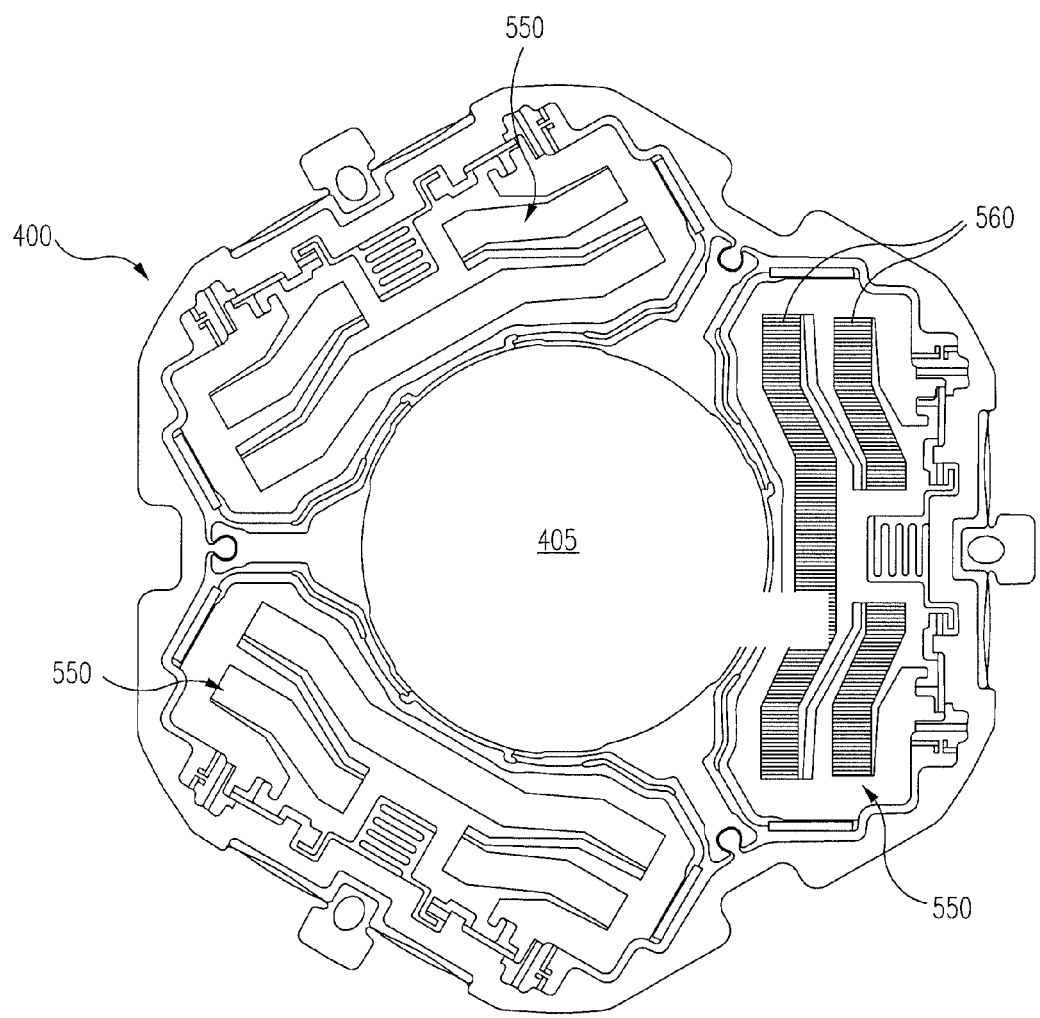
FIG. 5B illustrates a top view of the actuator device, in accordance with an embodiment.

FIG. 5B illustrates a top view of the actuator device 400 having teeth 560 shown in the actuator 550 in place of the blocks 552 representative thereof, in accordance with an embodiment. The teeth 560 shown may be considered to be reduced in number and exaggerated in size for clarity in FIG. 5B.

Figure 6A:
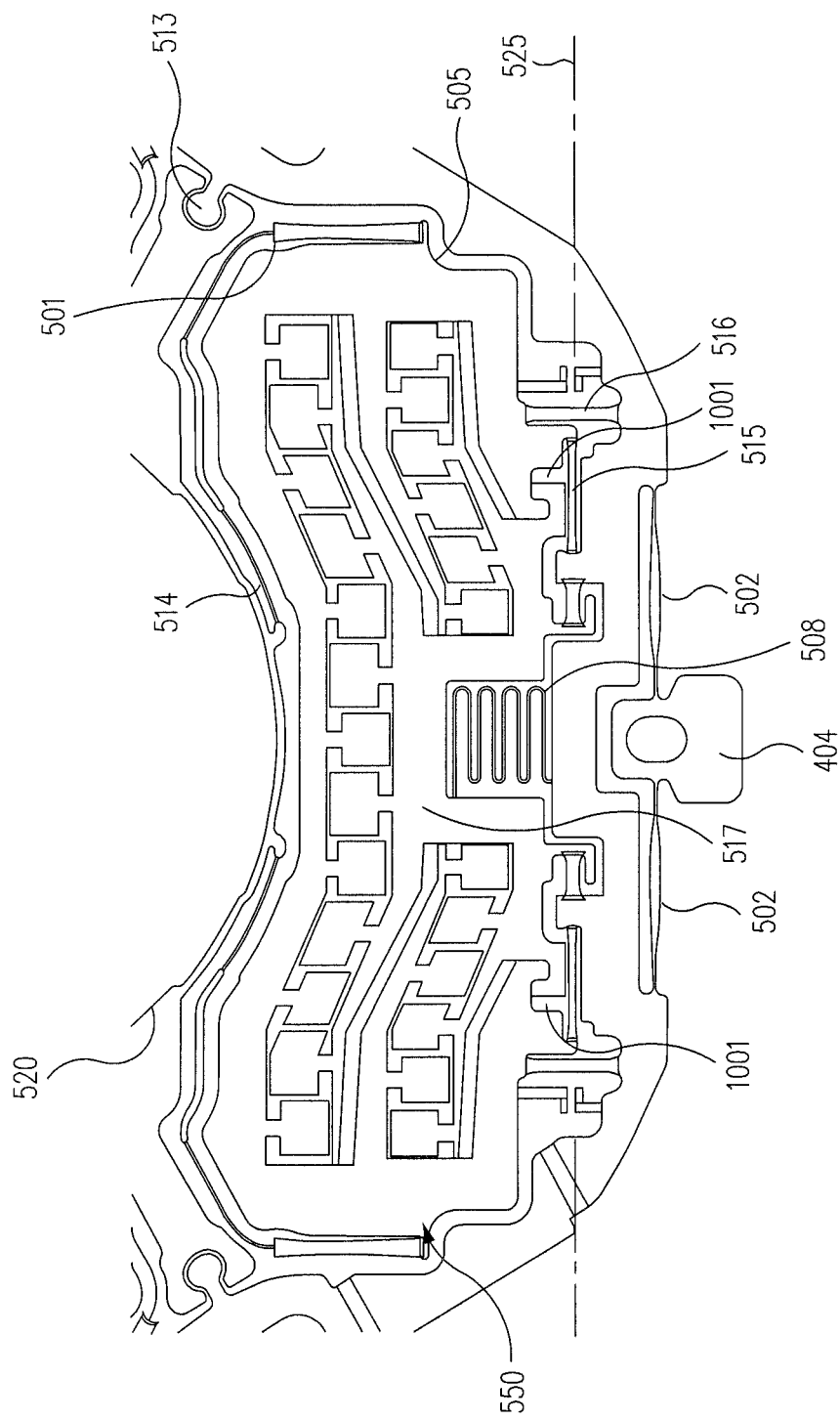
FIG. 6A illustrates a portion of the actuator device, in accordance with an embodiment.

FIG. 6A illustrates a top view of one of the actuators 550 having the inner hinge flexures 501, the ball-in-socket snubbers 513, the movable frame 505, the outer hinge flexures 516, the motion control torsional flexures 515, the cantilever flexures 514, the fixed frame 517, the pivot axis 525, the serpentine contact flexure 508, the pseudokinematic mount and electrical contact 404, and the platform 520, in accordance with an embodiment. FIG. 6A further illustrates a lateral snubber assembly 1001, which is further described herein.

The inner hinge flexure 501 cooperates with the cantilever flexure 514 to transfer desired motion from the movable frame 505 to the platform 520. Thus, actuation of the actuator 550 results in rotation of the movable frame 505, which in turn results in translation of the platform 520, as discussed herein.

The movable frame 505 may pivot on the outer hinge flexures 516 in a fashion similar to a door pivoting on its hinges. Upon the application of a shear force to the actuator device 400, one of the two outer hinge flexures 516 of the actuator 550 may be in tension while the outer hinge flexure 516 may be in compression. The two motion control torsional flexures 515 tend to mitigate undesirable buckling of the outer hinge flexure 516 in such instances.

Each actuator may be substantially disposed within a motion control mechanism that provides comparatively high lateral stiffness and comparatively soft rotational stiffness. In one embodiment, the motion control mechanism may have one or more (e.g., two) outer hinges flexures 516 and may have one or more (e.g., two) motion control torsional flexures 515. Thus, movement of the movable frame 505 may be substantially constrained to desirable rotation thereof.

In one embodiment, the motion control mechanism for one actuator 550 may comprise the outer frame 506, movable frame 505, the motion control torsional flexures 515, the outer hinge flexures 516, the inner hinge flexures 501, the cantilever flexure 514, and the platform 520. In one embodiment, the motion control mechanism may comprise all structures that tend to limit movement of the platform 520 to desired translational movement.

Each actuator 550 may be substantially contained within the motion control mechanism to substantially limit competition for real estate on the actuator device 400, in accordance with an embodiment. Since each actuator 550 and its associated motion control mechanism occupy substantially the same surface area of the actuator device 400, they do not compete for real estate. Thus, as the actuator 550 increases in size, its associated motion control mechanism may also increase in size. In certain embodiments, it is desirable to increase the size of an actuator 550 to increase the force provided thereby. In certain embodiments, it is desirable to also increase the size of the motion control mechanism to maintain its ability to desirably limit movement of the platform 520. The movable frame 550 may be considered as a portion of the motion control mechanism.

Figure 6B:
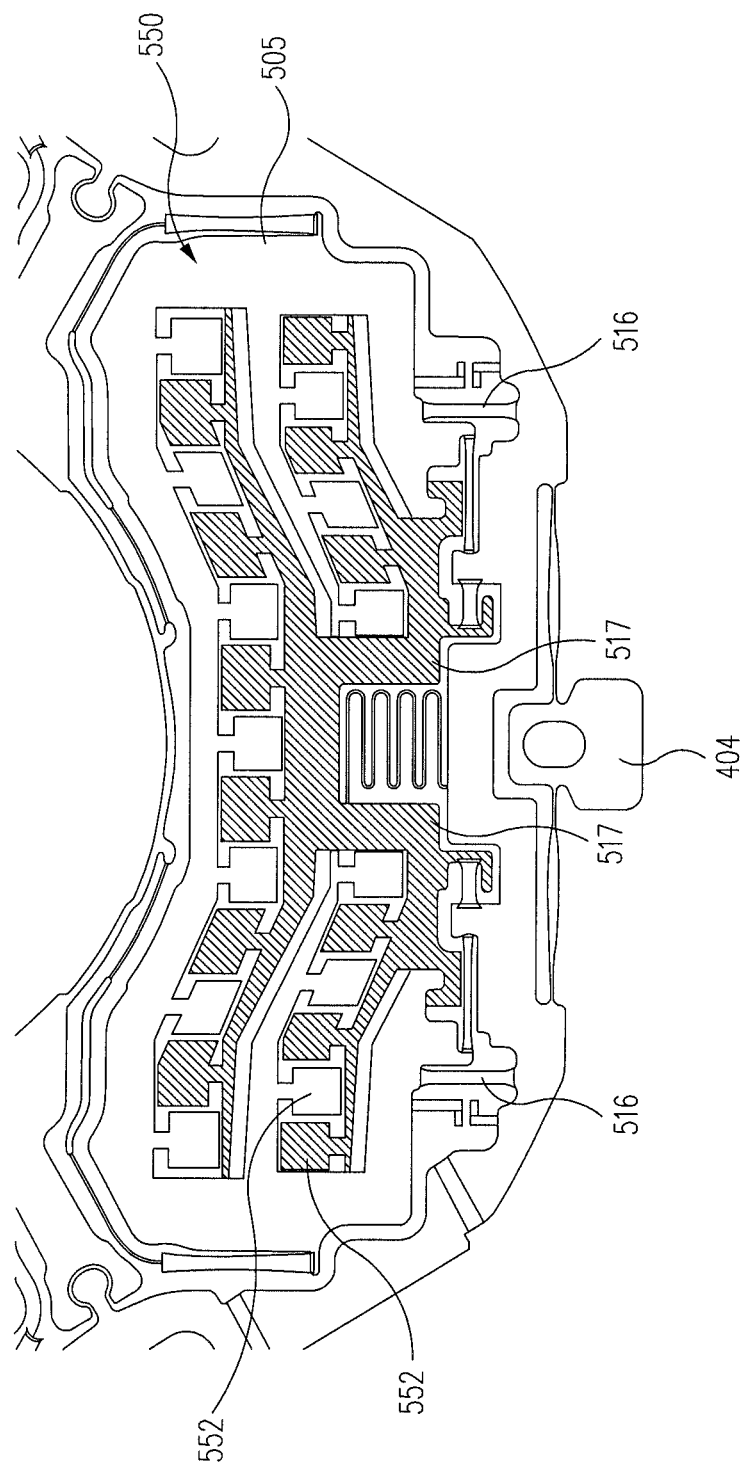
FIG. 6B illustrates a portion of the actuator device, in accordance with an embodiment.

FIG. 6B illustrates the actuator 550 showing the fixed frame 517 shaded for clarity, in accordance with an embodiment. The shaded fixed frame 517 may be deployed to a position out-of-plane of the actuator device 400 and may be fixed in this deployed position.

Figure 7:
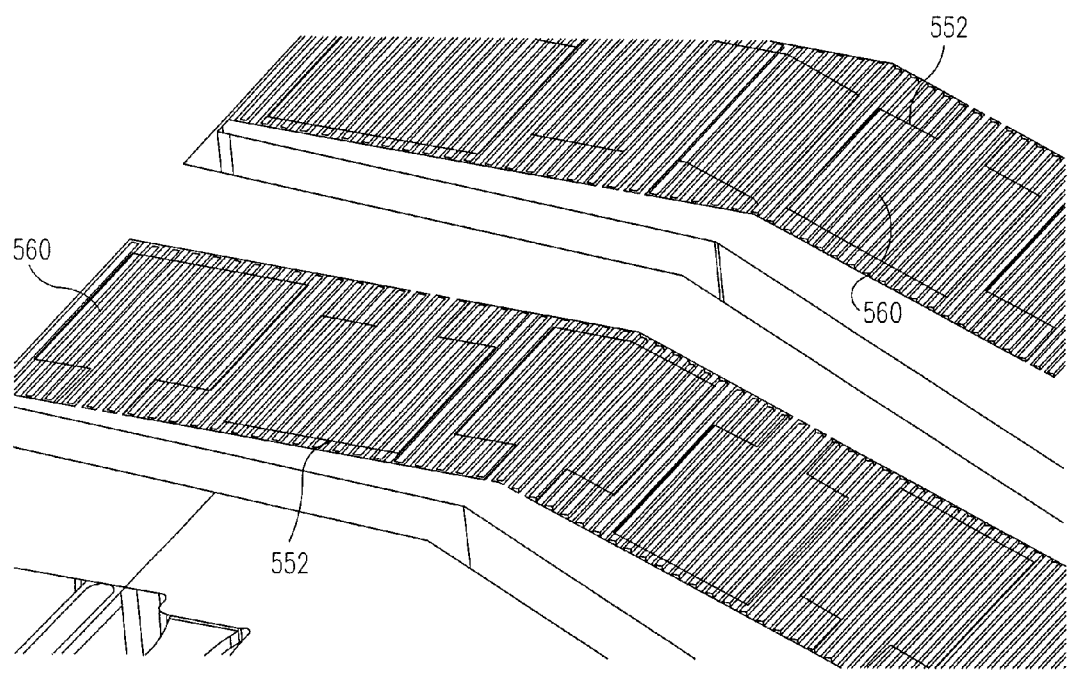
FIG. 7 illustrates portions of the actuator device, in accordance with an embodiment.

The movable frame 505 may support moving portions of the actuator 550, such as some of the teeth 560 (see FIG. 7). The fixed frame 517 may support fixed portions of the actuator 550, such as others of the teeth 560 (see FIG. 7). The application of a voltage to the actuator 550 may cause the movable frame 505 to rotate about the outer hinge flexures 516 toward the fixed frame 517. Removal or reduction of the voltage may permit a spring force applied by the inner hinge flexures 514, the outer hinge flexures 516 and the motion control torsional flexure 515 to rotate the movable frame 505 away from the fixed frame 517. Sufficient clearance between the movable frame 505 and the fixed frame 517 may be provided to accommodate such desired movement.

Figure 6C:
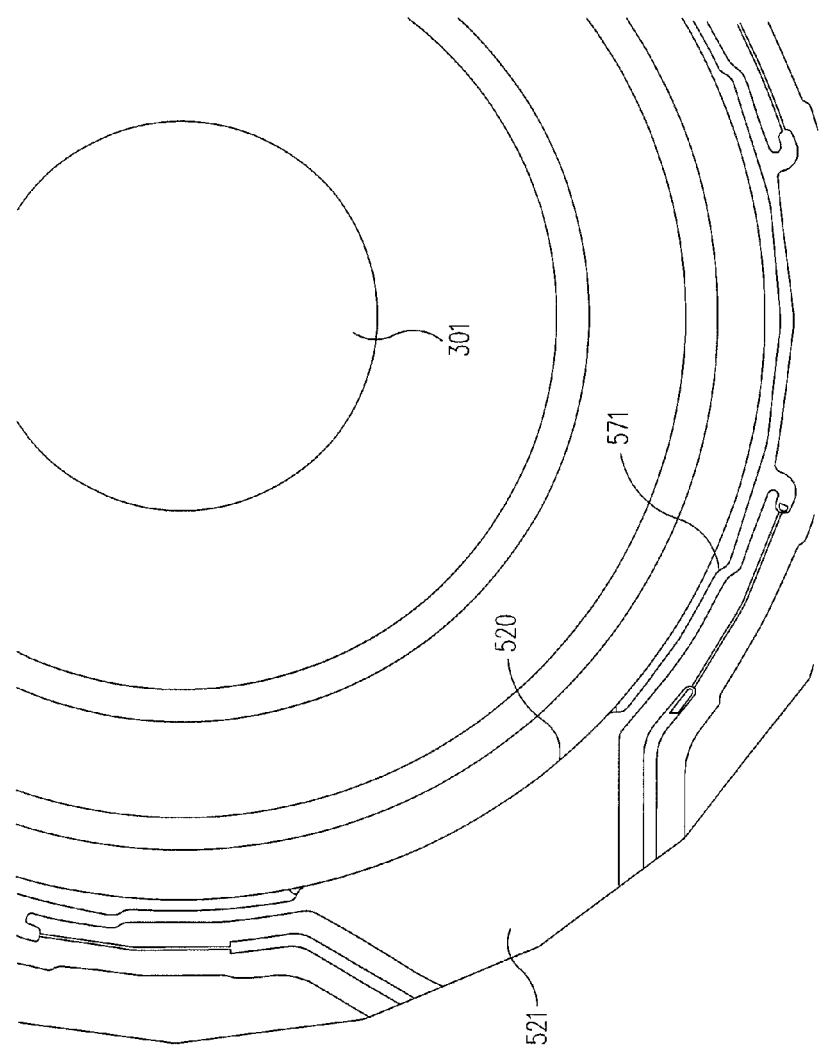
FIG. 6C illustrates a portion of a platform, in accordance with an embodiment.

FIG. 6C illustrates a portion of the platform 520 having radial variations 571, in accordance with an embodiment. In one embodiment, the radial variations 571 may be formed in the platform 520 to permit the platform 520 to expand. The radial variations 571 may be angular bends in the platform 520. Thus, an optical element such as the movable lens 301 may be inserted into the opening 405 of the platform 520, which may expand to receive the movable lens 301 and which may grip the movable lens 301. The opening 405 may expand as the radial variations 571 of the platform 520 deform (e.g., tend to straighten), so as to increase the circumference of the opening 405.

Figure 6D:
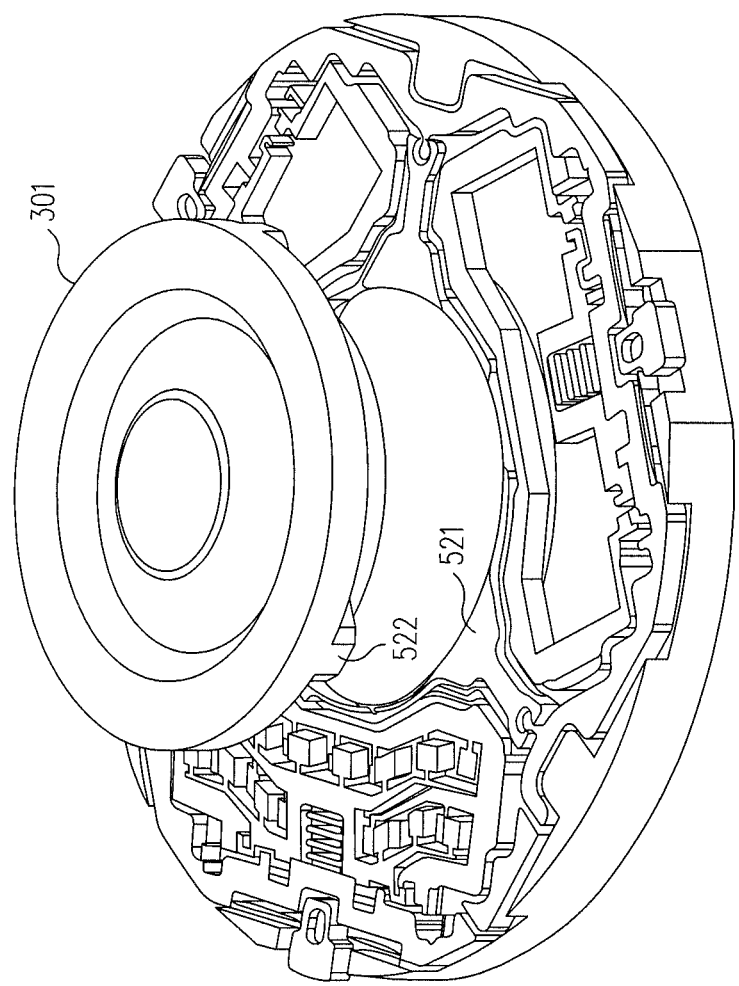
FIG. 6D illustrates a bottom view of a movable lens positioned for mounting to the actuator device, in accordance with an embodiment.
Figure 6E:
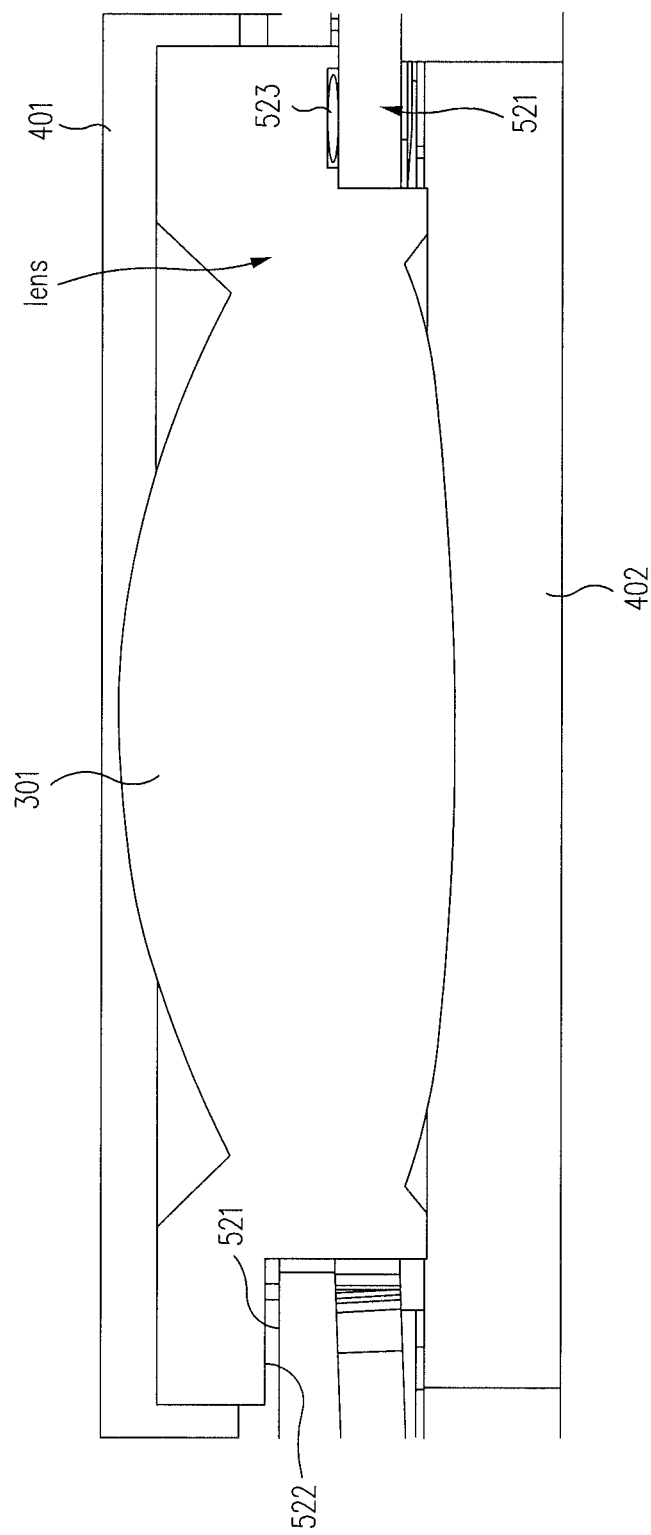
FIG. 6E illustrates a side view of the movable lens mounted to the actuator device, in accordance with an embodiment.

FIG. 6D illustrates a perspective view of a movable lens positioned for mounting to the actuator device 400 and FIG. 6E illustrates a side view of the movable lens 301 attached to the actuator device 400, in accordance with an embodiment. In one embodiment, the movable lens 301 may be adhesively bonded to the platform 550, such as by adhesively bonding standoffs 522 of the movable lens 301 to the lens pads 521. For example, epoxy 523 may be used to adhesively bond the movable lens 301 to the platform 520. The movable lens 301 may be supported by the lens pad 521.

FIG. 7 illustrates a portion of the actuator 550 showing blocks 552 superimposed over the teeth 560 of an actuator 550, in accordance with an embodiment. As discussed herein, the blocks 552 are representative of the teeth 560.

Figure 8:
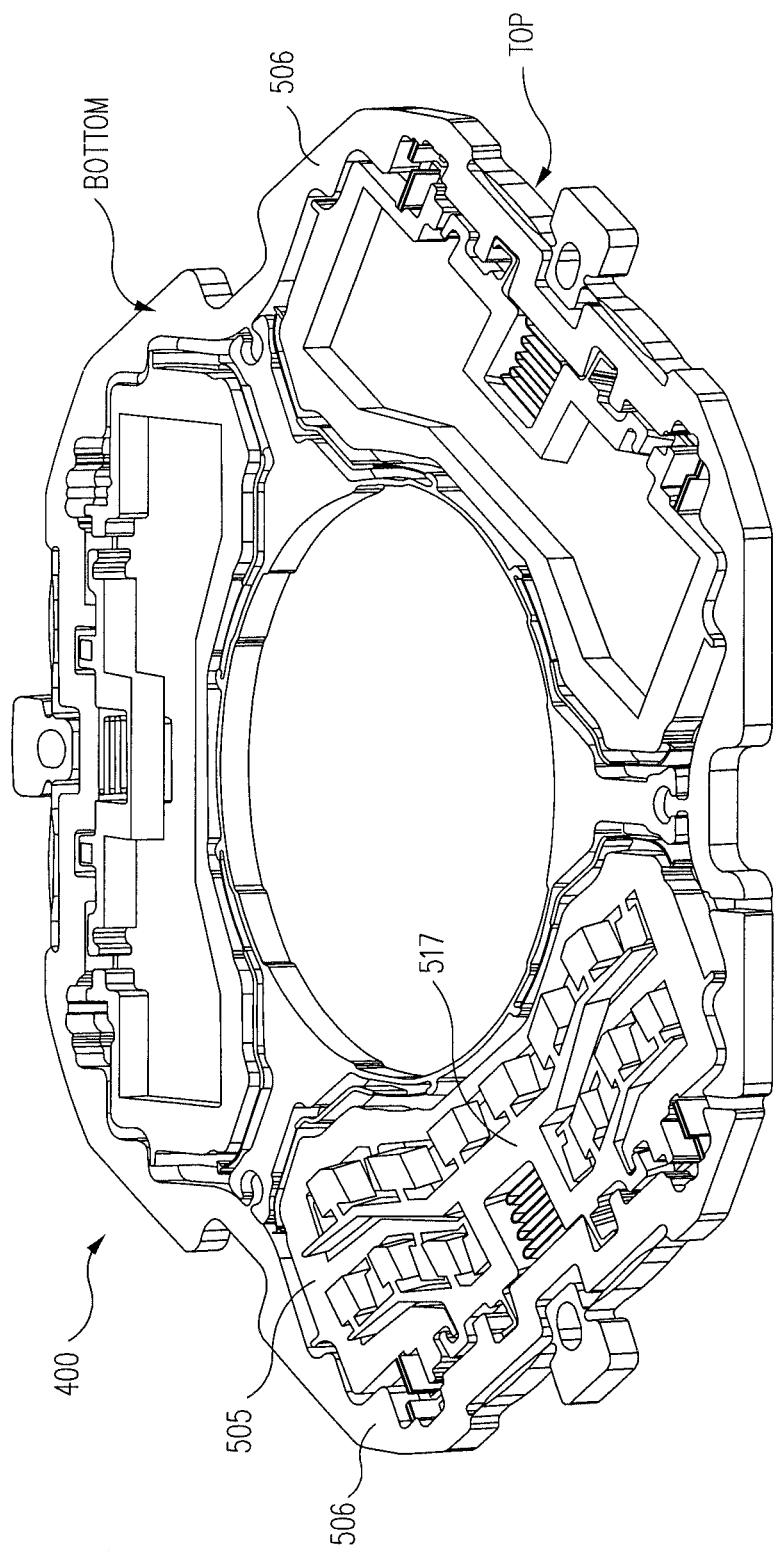
FIG. 8 illustrates a bottom view of the actuator device in a deployed configuration, in accordance with an embodiment.

FIG. 8 illustrates a bottom perspective view of the actuator device 400 in a deployed configuration, in accordance with an embodiment. In the deployed configuration the unactuated movable frame 505 is substantially in-plane with respect to the outer frame 506 and the deployed fixed frame 517 is substantially out-of-plane with respect to the outer frame 506 and the movable frame 505.

A voltage may be applied to each actuator 550 via the electrical contacts 404. For example, two of the three contacts 404 may be used to apply a voltage from the lens barrel 200 to the actuator device 400. The third contact 404 may be unused or may be used to redundantly apply one polarity of the voltage from the lens barrel 200 to the actuator device 400.

Substantially the same voltage may be applied to the three actuators 550 to result in substantially the same movement of the moving frames 505 thereof. Application of substantially the same voltage to the three actuators 550 may result in translation of the platform 520 with respect to the outer frame 506 such that the platform 520 remains substantially parallel to the outer frame 506. Thus, an optical element such as the movable lens 301 may be maintained in a desired alignment as the optical element is moved, such as along an optical axis 410 (FIG. 3B) thereof.

Substantially different voltages may be applied to the three actuators 550 to result in substantially different movements of the moving frames 505 thereof. Substantially different voltages may be applied to the three actuators 550 using the three contacts 404 and a common return. Thus, each contact 404 may apply a separately controlled voltage to a dedicated one of the three actuators 550.

The application of substantially different voltages to the three actuators 550 may result in translation of the platform 520 with respect to the outer frame 506 such that the platform tilts substantially with respect to the outer frame 506. Thus, when substantially different voltages are applied, the platform 520 does not necessarily remain substantially parallel to the outer frame. The application of different voltages to the three actuators 550 may be used to align the platform 520 to the outer frame 506, for example. The application of different voltages to the three actuators 550 may be used to facilitate optical image stabilization or lens alignment, for example.

Figure 9A:
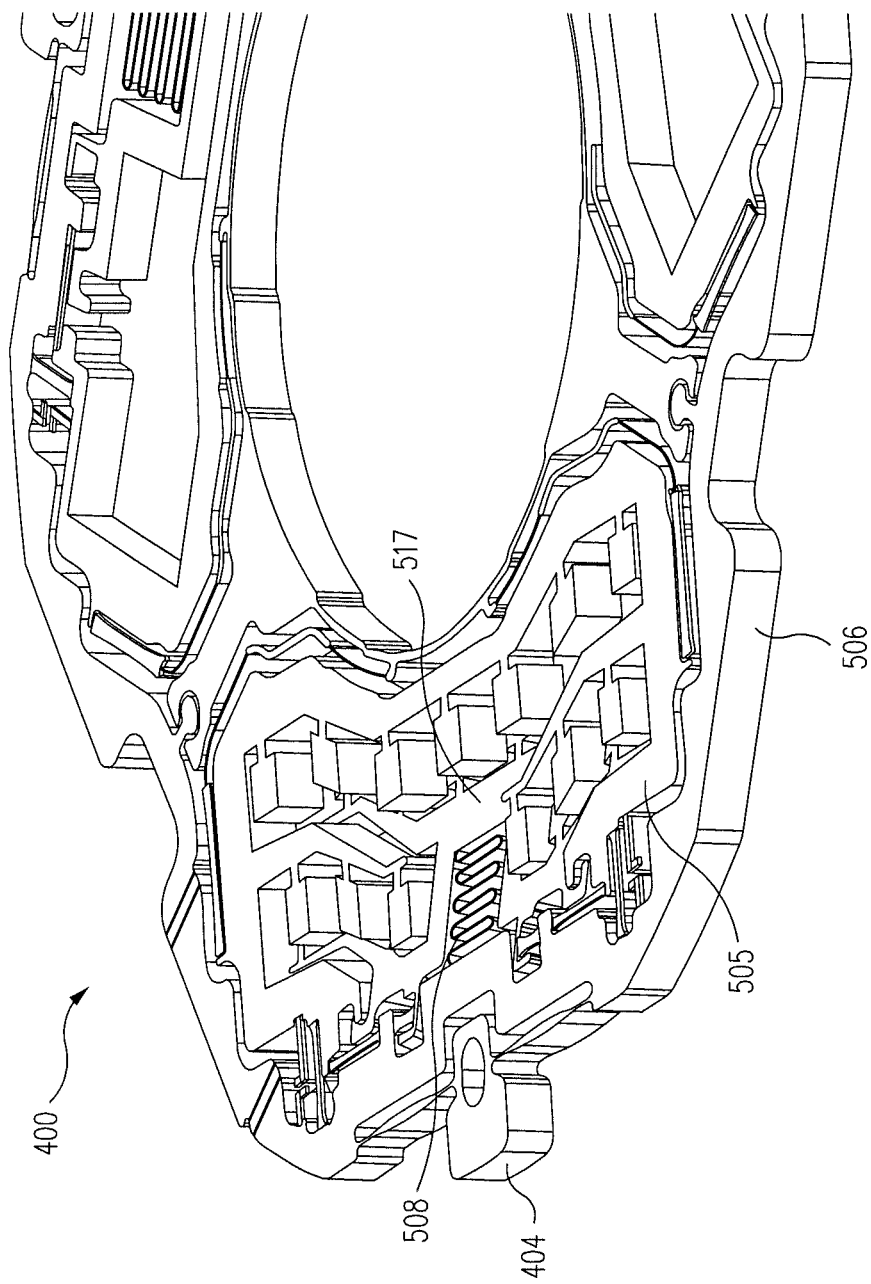
FIG. 9A illustrates a portion of the actuator device in a deployed configuration without any voltage applied thereto, in accordance with an embodiment.

FIG. 9A illustrates a portion of the actuator device 400 in a deployed configuration without any voltage applied thereto, in accordance with an embodiment. Without any voltage applied to the actuator device 400, the movable frame 505 is substantially in-plane with respect to the outer frame 506 and the deployed fixed frame 517 is substantially out-of-plane with respect to the outer frame 506 and the movable frame 505.

Figure 9B:
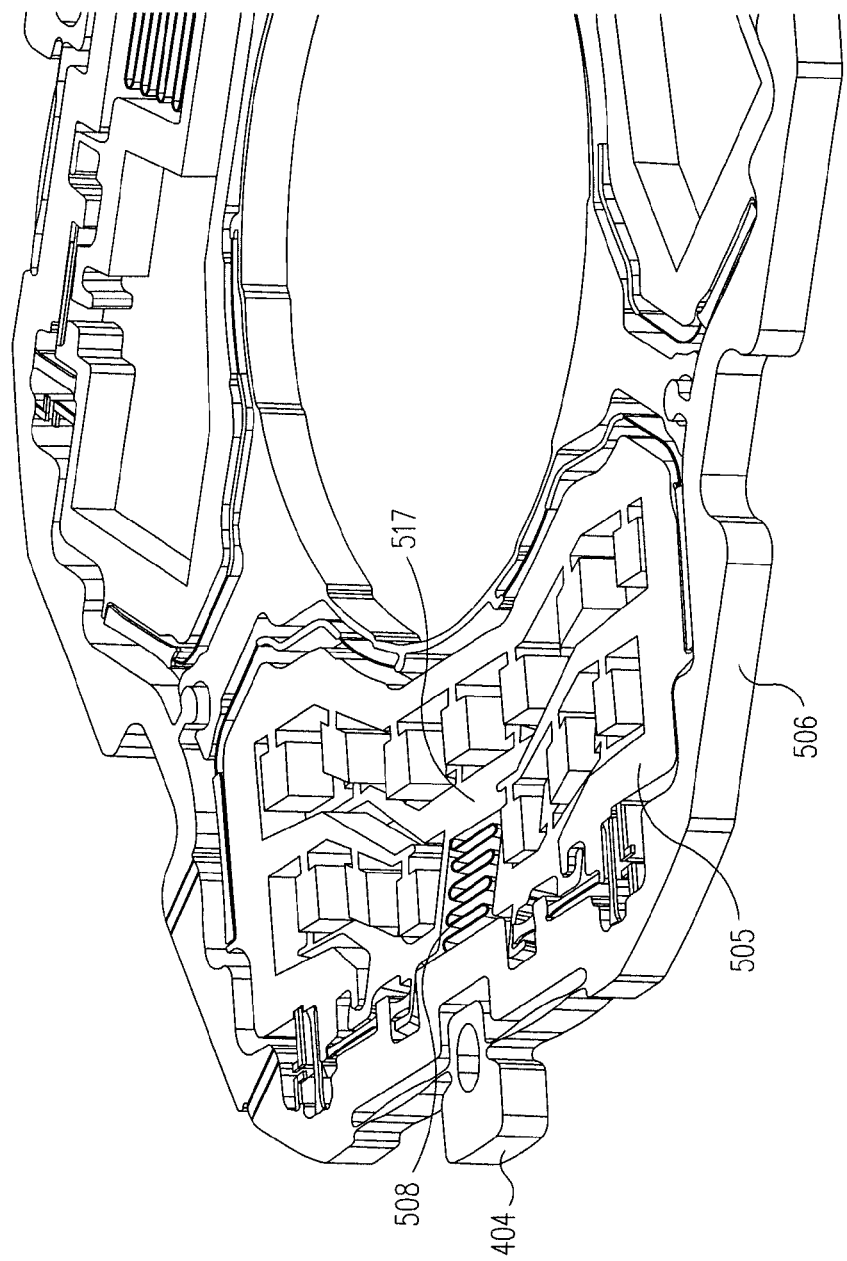
FIG. 9B illustrates a portion of the actuator device in a deployed configuration with a small voltage applied thereto, in accordance with an embodiment.

FIG. 9B illustrates a portion of the actuator device 400 in a deployed configuration with a small voltage applied thereto, in accordance with an embodiment. With the small voltage applied, the movable frame 505 has rotated toward the deployed fixed frame 517 and is in a partially actuated position.

Figure 9C:
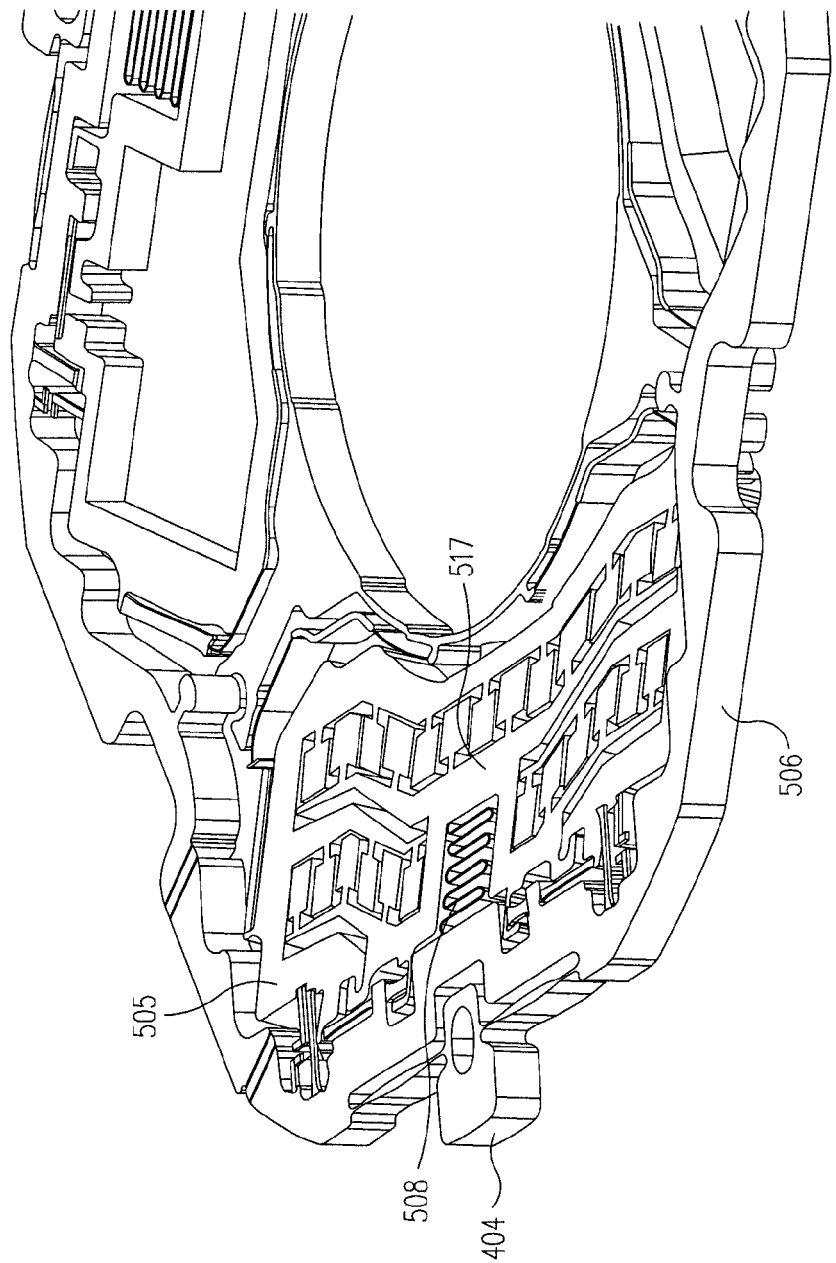
FIG. 9C illustrates a portion of the actuator device in a deployed configuration with a maximum voltage applied thereto, in accordance with an embodiment.

FIG. 9C illustrates a portion of the actuator device 400 in a deployed configuration with a maximum voltage applied thereto, in accordance with an embodiment. As may be seen, the movable frame 505 has rotated further toward the deployed fixed frame 517 and is in a fully actuated position.

Figure 10:
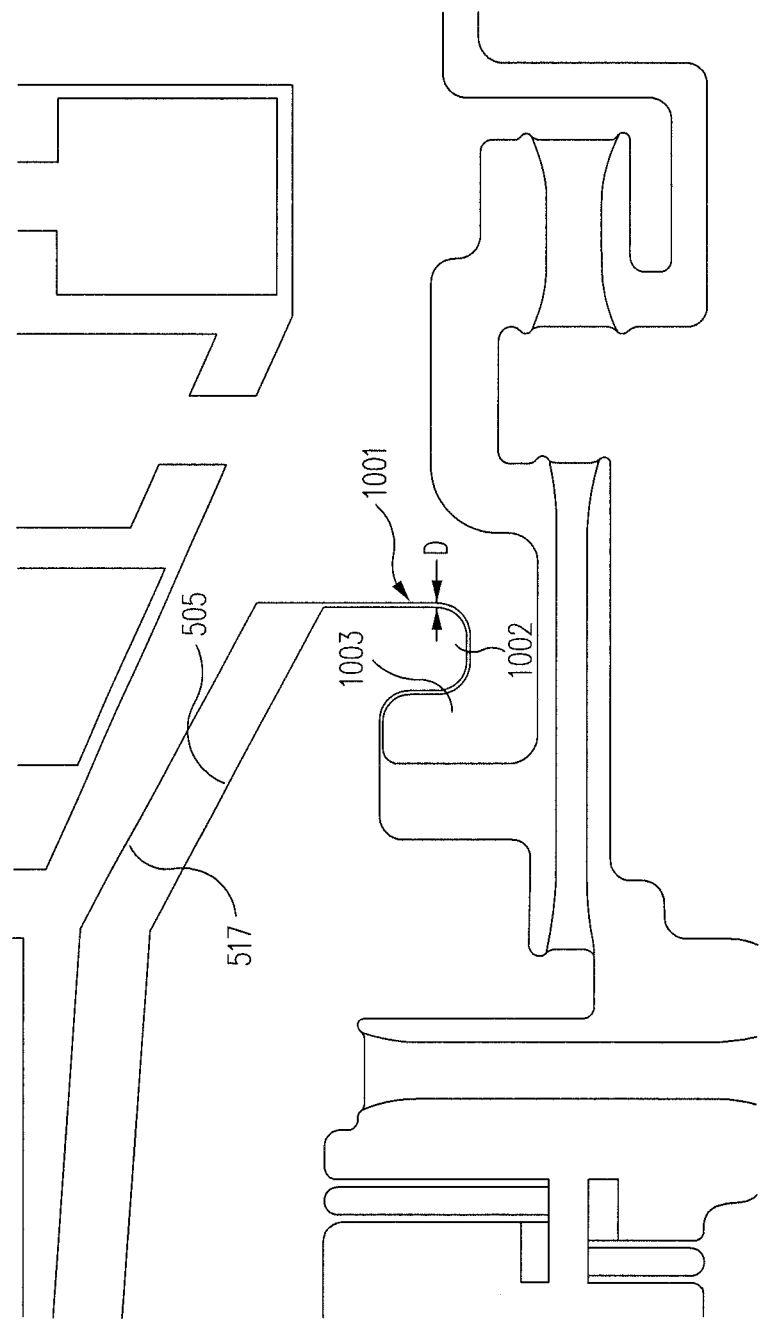
FIG. 10 illustrates a lateral snubber assembly, in accordance with an embodiment.

FIG. 10 illustrates a top view of a lateral snubber assembly 1001, in accordance with an embodiment. The lateral snubber assembly 1001 may have a first snubber member 1002 and a second snubber member 1003. The first snubber member 1002 may be formed upon the fixed frame 517 and the second snubber member may be formed upon the movable frame 505. The first snubber member 1002 and the second snubber member 1003 may cooperate to inhibit undesirable lateral motion of the movable frame 505 with respect to the fixed frame 517 (and consequently with respect to the outer frame 506, as well) during shock or large accelerations. A gap "D" between the first snubber member 1002 and the second snubber member 1003 may approximately 2-3 micrometers wide to limit such undesirable lateral motion.

Figure 11:
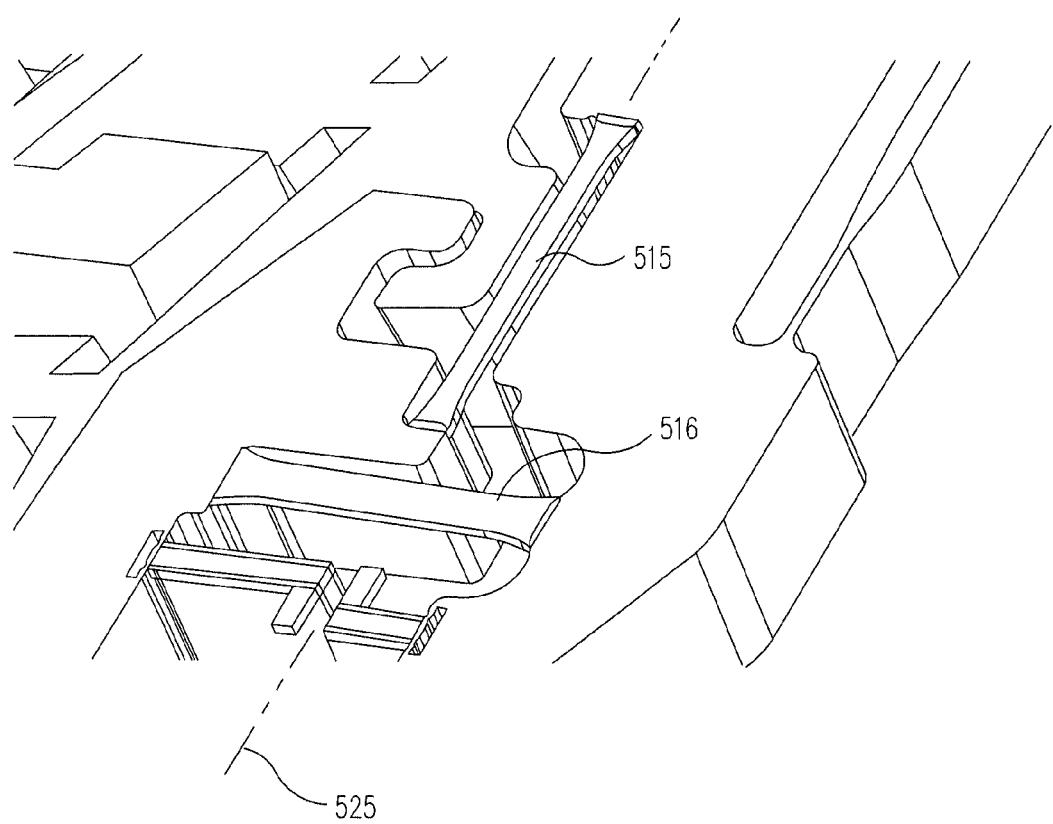
FIG. 11 illustrates a hinge flexure and a motion control torsional flexure, in accordance with an embodiment.

FIG. 11 illustrates a perspective view of the motion control torsional flexure 515 and the outer hinge flexure 516, in accordance with an embodiment. The motion control torsional flexure 515 and the outer hinge flexure 516 may be thinner than other portions of the actuator device 400 to provide the desired stiffness of the motion control torsional flexure 515 and the outer hinge flexure 516. For example, in one embodiment the outer hinge flexures 516, the inner hinge flexures 501, and the motion control torsional flexures 515 may have a width of approximately 100 microns and a thickness of approximately 2-3 microns.

The motion control torsional flexure 515 may be located on the pivot axis 525. In one embodiment, the pivot axis 525 is a line that connects the centers of the two outer hinge flexures 516. In one embodiment, the pivot axis 525 is the hinge line or axis about which the movable frame 506 rotates.

Figure 12:
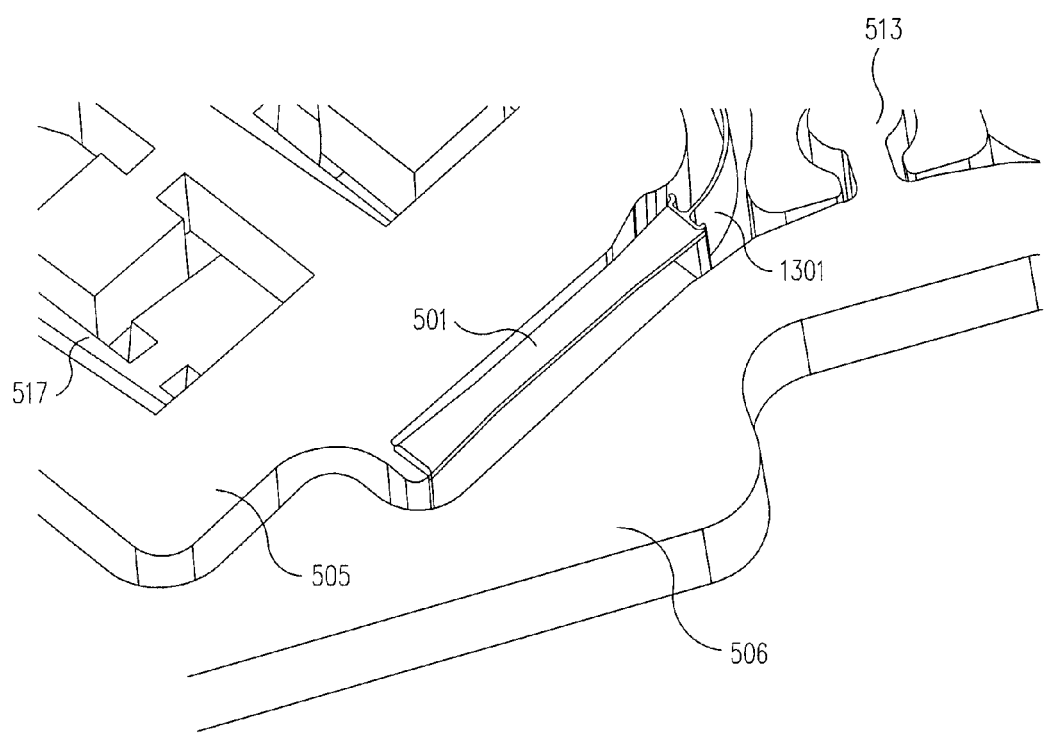
FIG. 12 illustrates an inner motion control hinge, in accordance with an embodiment.

FIG. 12 illustrates a perspective view of an inner hinge flexure 501, in accordance with an embodiment. The inner hinge flexure 501 may be thinner than other portions of the actuator device 400 to provide the desired stiffness of the inner hinge flexure 501. For example, in one embodiment, the inner hinge flexure 501 may be approximately 500 micrometers long, 60 micrometers wide, and 2-3 micrometers thick.

Figure 13:
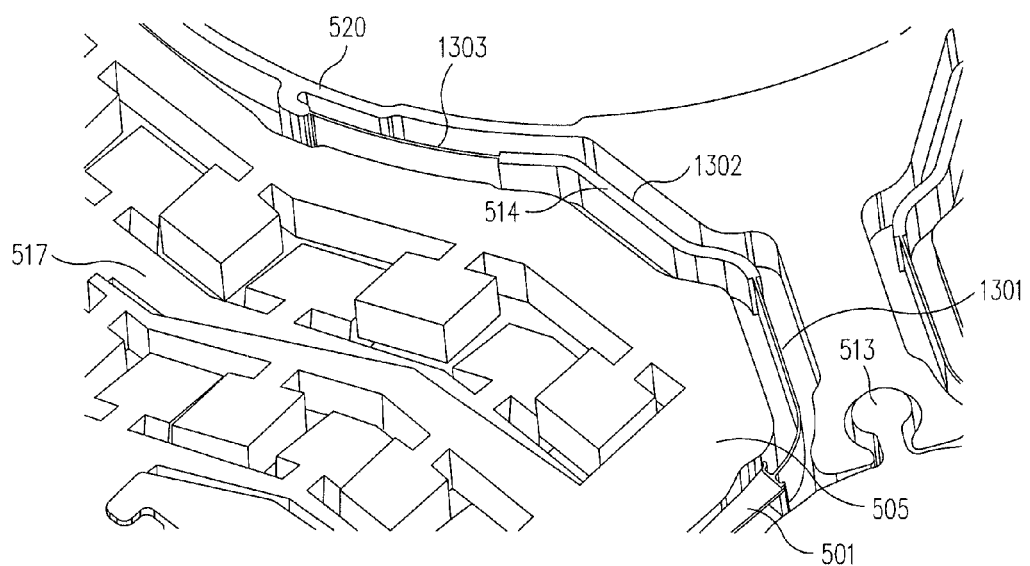
FIG. 13 illustrates a cantilever flexure, in accordance with an embodiment.

FIG. 13 illustrates a perspective view of a cantilever flexure 514 having the inner hinge flexure 501, a first thinned section 1301, a thicker section 1302, and a second thinned section 1303, in accordance with an embodiment. The cantilever flexure 514 may be used to transfer movement of the movable frames 505 to the platform 520. The cantilever flexure 514 may be used to facilitate the conversion of rotation of the movable frames 505 into translation of the platform 520.

The inner hinge flexure 501 may bend to permit the movable frame 505 to rotate while the platform 520 translates. The first thinned section 1301 and the second thinned section 1303 may bend to permit a change in distance between the movable frame 505 and the platform 520 as the movable frame 505 transfers movement to the platform 520.

The cantilever flexure 514 may be thinner proximate the ends thereof and may be thicker proximate the center thereof. Such configuration may determine a desired ratio of stiffnesses for the cantilever flexure 514. For example, it may be desirable to have a comparatively low stiffness radially to compensate for the change in distance between the movable frames 505 and the platform 520 as the movable frame 505 transfers movement to the platform 520.

Figure 14:
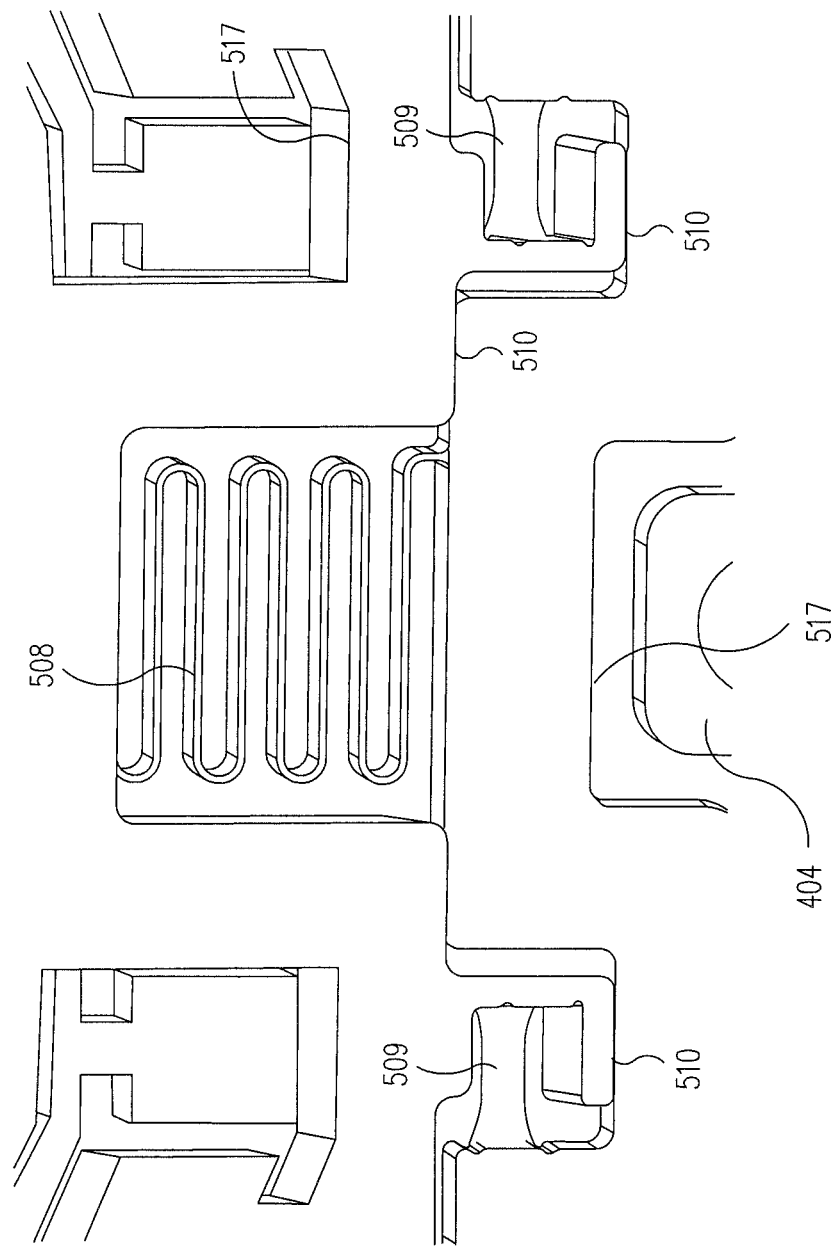
FIG. 14 illustrates a serpentine contact flexure and a deployment torsional flexure, in accordance with an embodiment.

FIG. 14 illustrates a perspective view of the serpentine contact flexure 508 and the deployment torsional flexure 509, in accordance with an embodiment. The serpentine contact flexure 508 may facilitate electrical contact between the electrical contacts 404 and the deployed fixed frame. The deployment torsional flexures 509 may facilitate rotation of the deployed fixed frame 517 with respect to the outer frame 506 during deployment.

Figure 15:
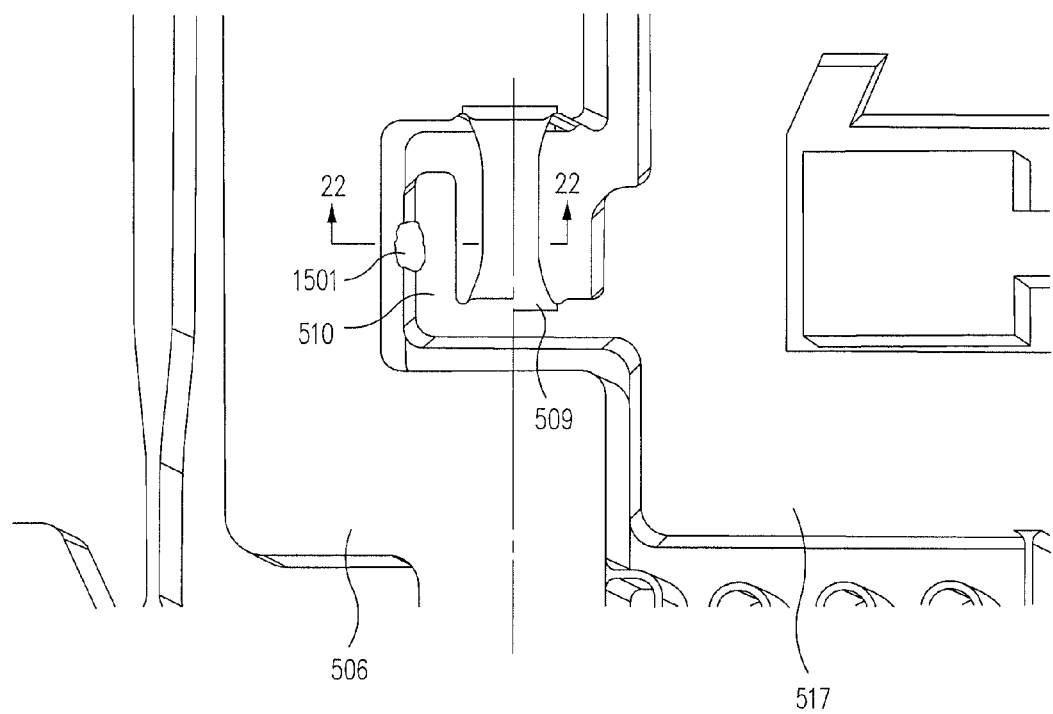
FIG. 15 illustrates a top view of a deployment stop, in accordance with an embodiment.

FIG. 15 illustrates a perspective top view of a deployment stop 510 showing that it does not contact an outer frame 506 on the top side when deployed, in accordance with an embodiment. An epoxy 1501 may be applied to the top surfaces of the deployment stop 510 and the outer frame 506 to fix the deployment stop 510 into position with respect to the outer frame 506. Thus, the epoxy 1501 may fix the deployed fixed frame 517 into position with respect to the outer frame 506. Various portions of the deployed fixed frame 517 may function as the deployment stops 517. For example, other portions of the deployed fixed frame 517 that abut the outer frame 506 when the deployed fixed frame is deployed may function as the deployment stops 510.

Figure 16:
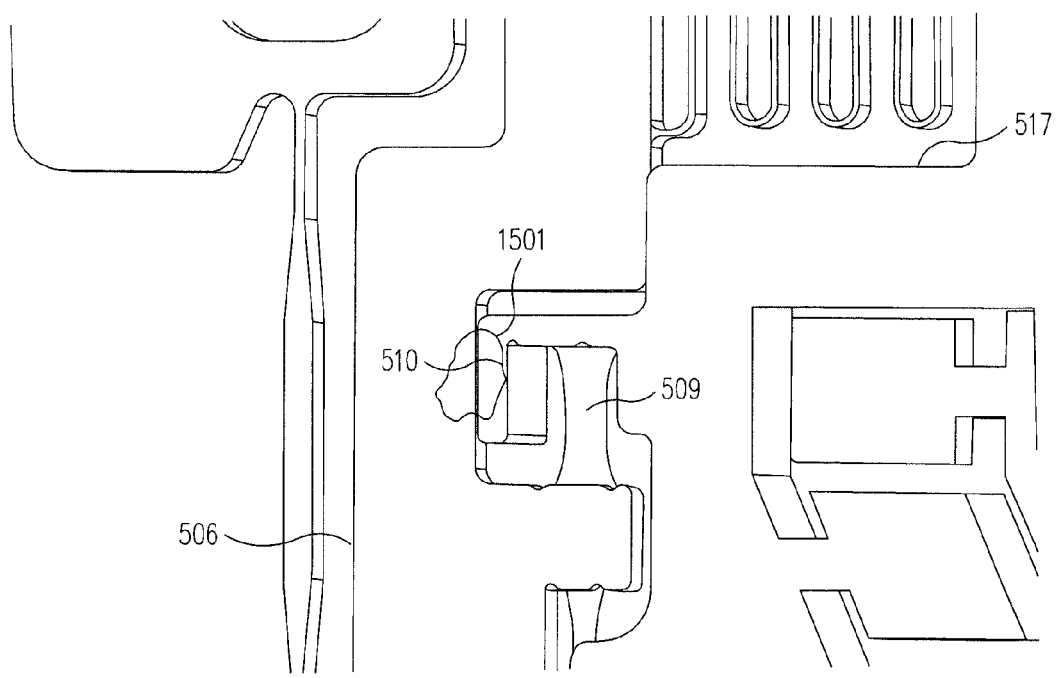
FIG. 16 illustrates a bottom view of the deployment stop, in accordance with an embodiment.

FIG. 16 illustrates a perspective bottom view of the deployment stop 510 showing that it contacts the outer frame 506 on the bottom side when deployed, in accordance with an embodiment. The epoxy 1501 may be applied to the bottom surfaces of the deployment stop 510 and the outer frame 506 to fix the deployment stop 510 into position with respect to the outer frame 506. The epoxy 1501 may be applied to both the top surfaces and the bottom surfaces of the deployment stop 510 and the outer frame 506, if desired.

Figure 17A:
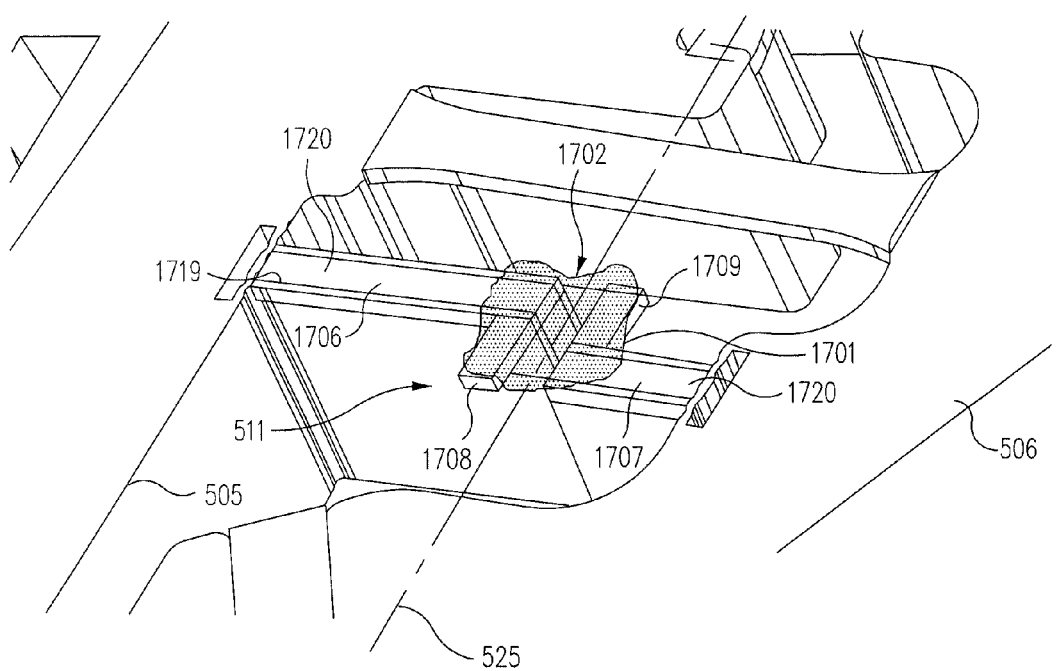
FIG. 17A illustrates a flap damper, in accordance with an embodiment.

FIG. 17A illustrates a perspective view of a flap damper 511, in accordance with an embodiment. The flap damper 511 is located where the desirable relative motion during intended operation, (e.g., actuation) of actuators 550, is comparatively low and where the potential undesirable relative motion during shock is comparatively high. For example, the flap damper 511 may be formed on the pivot axis 525.

A damping material 1701 may extend across a gap 1702 formed between the outer frame 506 and the movable frame 505. The damping material 1701 may have a high damping coefficient. For example, in one embodiment, the damping material 1701 may have a damping coefficient of between 0.7 and 0.9. For example, the damping material 1701 may have a damping coefficient of approximately 0.8. In one embodiment, the damping material 1701 may be an epoxy.

The damping material 1701 may readily permit the desired motion of the movable frame 505 relative to the outer frame 506. The damping material 1701 may inhibit undesired motion of the movable frame 505 relative to the outer frame 506 due to a shock. Thus, the damping material 1701 may permit rotation of the movable frame 505 relative to the outer frame 506 during actuation of the actuators 550 and may inhibit lateral motion and/or out of plane motion of the movable frame 505 relative to the outer frame 506 during a shock.

The flap damper 511 may have a flap 1706 that extends from the movable frame 505 and may have a flap 1707 that extends from the outer frame 506. A gap 1702 may be formed between the flap 1706 and the flap 1707.

An extension 1708 may extend from the flap 1706 and/or an extension 1709 may extend from the flap 1707. The extension 1708 and the extension 1709 may extend the length of the gap 1702 such that more damping material 1701 may be used than would be possible without the extension 1708 and/or the extension 1709.

Trenches 1719 may be formed in flaps 1706 and/or 1707 and a trench material 1720 that is different from the material of the flaps 1706 and 1707 may be deposited within the trenches 1719. For example, the flaps 1706 and 1707 may be formed of single crystalline silicon and the trench material 1720 may be formed of polycrystalline silicon. Any desired combination of materials may be used for the flaps 1706 and 1707 and for the trench material 1720, so as to achieve the desired stiffness of the flaps 1706 and 1707.

Figure 17B:
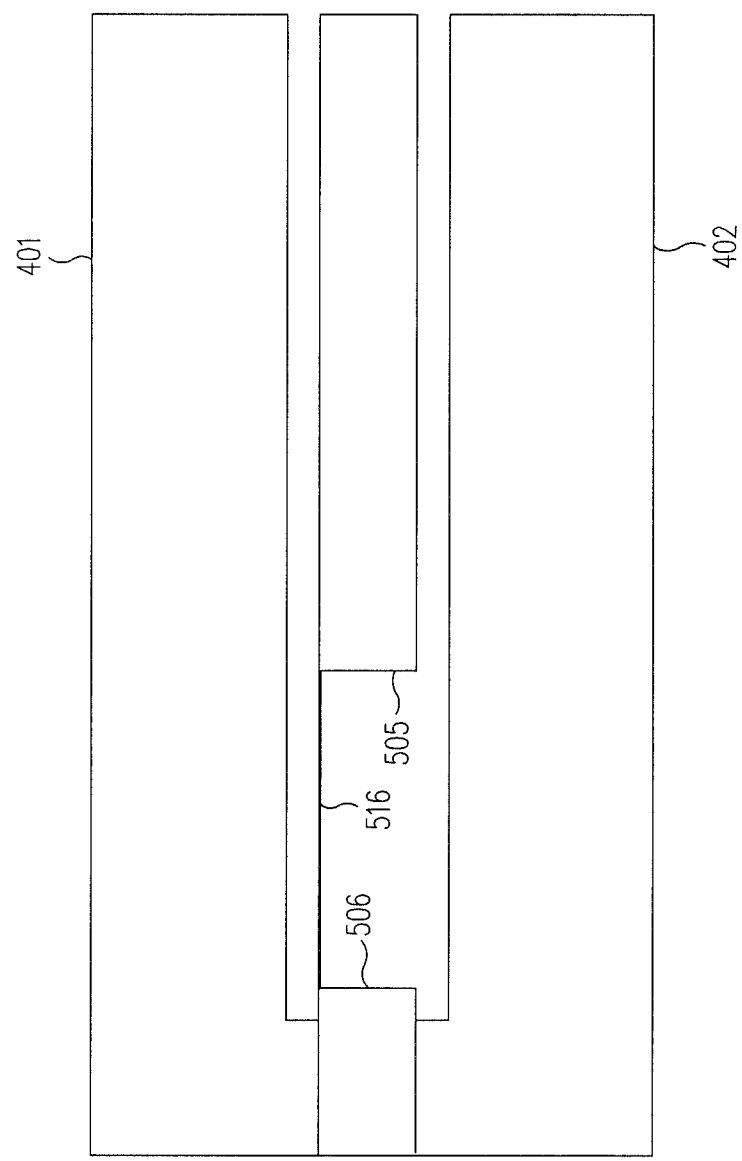
FIG. 17B illustrates a movable frame disposed between an upper module cover and a lower module cover with no shock applied, in accordance with an embodiment.

FIG. 17B illustrates the movable frame 505 disposed between the upper module cover 401 and the lower module cover 402 without a shock being applied thereto. In the absence of a shock, the movable frame 505 remains in its unactuated position and the outer hinge flexure 516 is unbent.

Figure 17C:
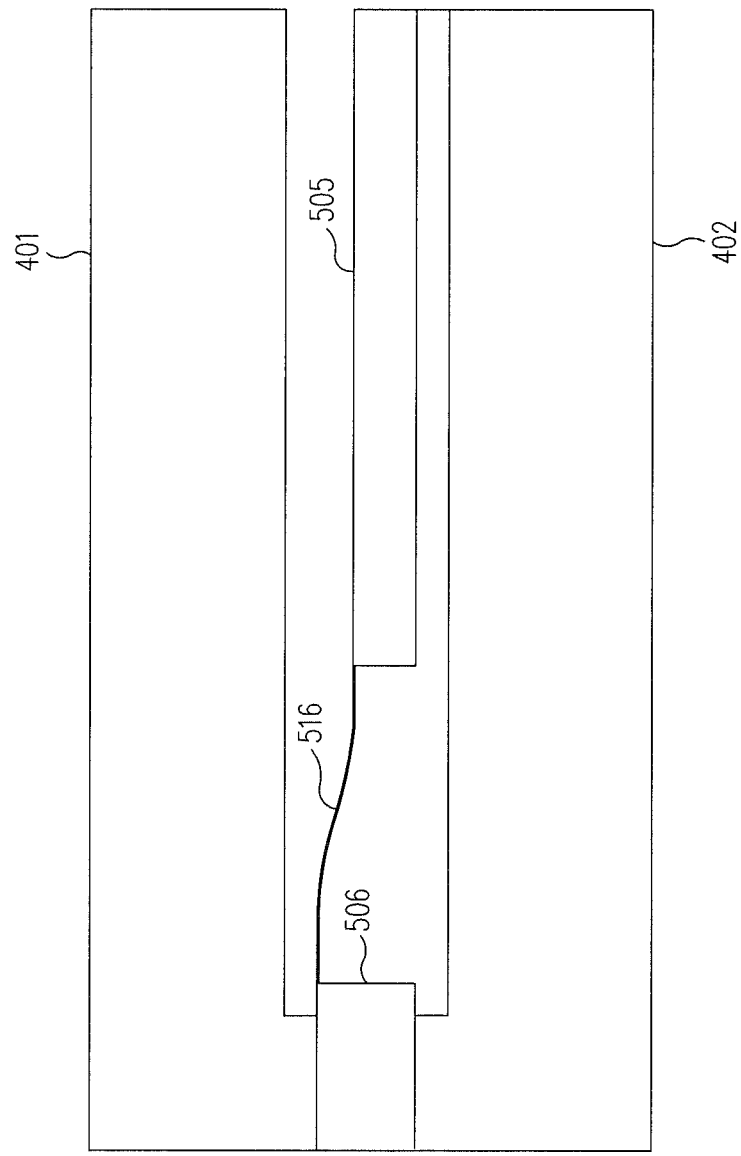
FIG. 17C illustrates the movable frame disposed between the upper module cover and the lower module cover with a shock applied, in accordance with an embodiment.

FIG. 17C illustrates the movable frame 505 after it has been moved to a position against the lower module cover 402 by a shock, such as may be caused by dropping the electronic device 100. Movement of the movable frame 505 may be limited or snubbed by the lower module housing 402 and undesirable double bending of the outer hinge flexure 516 may be limited thereby. In a similar fashion, the upper module housing 401 may limit movement of the movable frame 505 and double bending of the outer hinge flexure 516. Thus, undesirable stress within the outer hinge flexures 516 may be mitigated.

FIGS. 17D-17H illustrate an alternative embodiment of an outer hinge flexure 1752. As illustrated in these figures, in some embodiments, the outer hinge flexures 1752 may be X-shaped for increased control of the motion of the moveable frame 505 in the lateral direction. The outer hinge flexures 516, 1752 may generally tend to bend, such as about a central portion thereof, to facilitate movement of the moveable frame 505 with respect to the outer frame 506. Other shapes are contemplated. For example, the outer hinge flexure 1752 can be shaped like a H, I, M, N, V, W, Y, or may have any other desired shape. Each outer hinge flexure 1752 can comprise any desired number of structures that interconnect the outer frame 506 and the movable frame 505. The structures may be interconnected or may not be interconnected. The structures may be substantially identical with respect to one another or may be substantially different with respect to one another. Each outer hinge flexure 1752 may be substantially identical with respect to each other hinge flexure 1752 or may be substantially different with respect thereto.

The outer hinge flexures 516, 1752 and any other structures may be formed by etching as discussed herein. The outer hinge flexure and any outer structures may comprise single crystalline silicon, polycrystalline silicon, or any combination thereof.

FIGS. 17D-F and 17I-17N show an alternative embodiment of the lateral snubber assembly 1754, another embodiment of which is disused with respect to FIG. 10 herein. The lateral snubber assembly 1754 of FIGS. 17D-F and 17I-17N generally has more rounded curves with respect to the lateral snubber assembly 1001 of FIG. 10.

Figure 17D:
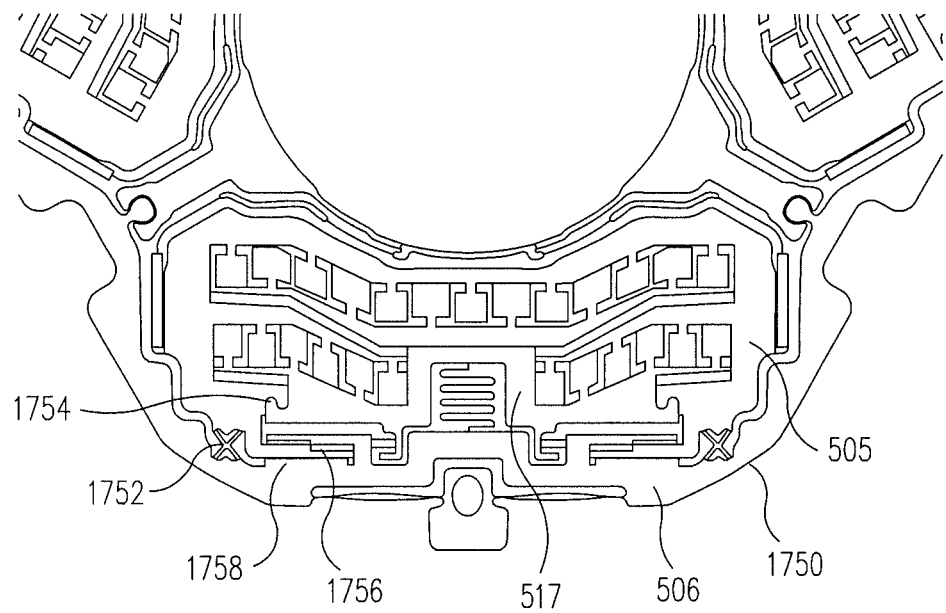
FIG. 17D illustrates a partial top view of another actuator device, in accordance with an embodiment.
Figure 17E:
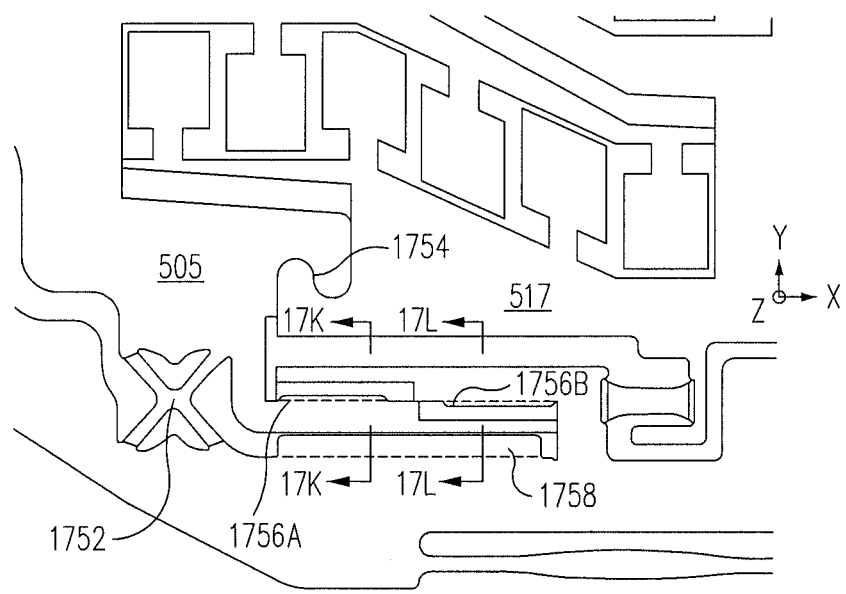
FIG. 17E illustrates an enlarged top view of the actuator device, in accordance with an embodiment.
Figure 17F:
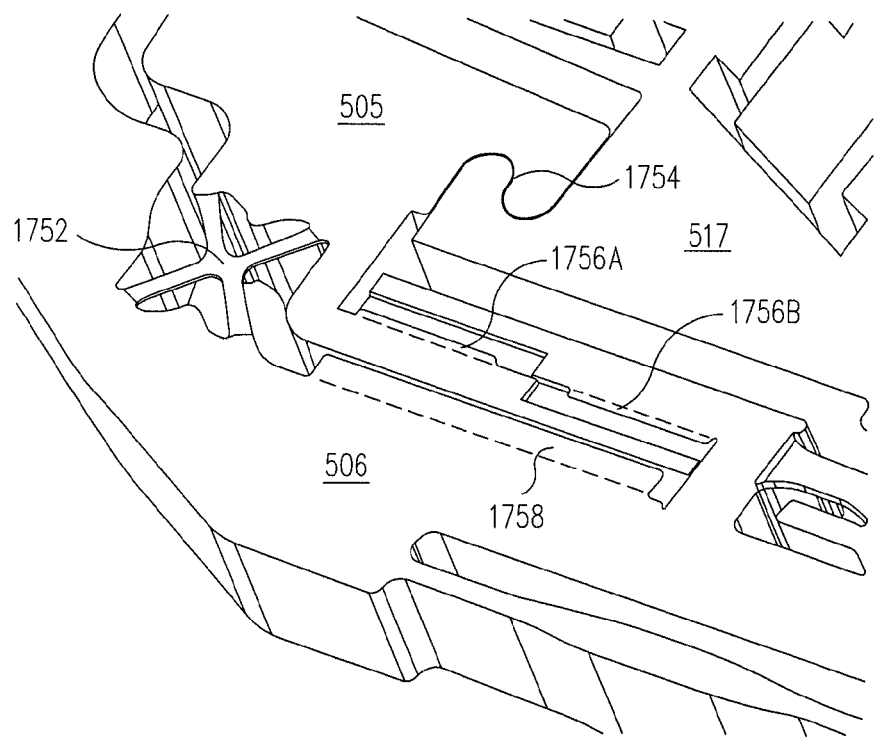
FIG. 17F illustrates an outer hinge flexure, a lateral snubber assembly, a single snubber flap and an interlocking snubber flaps feature of the actuator device, in accordance with an embodiment.
Figure 17G:
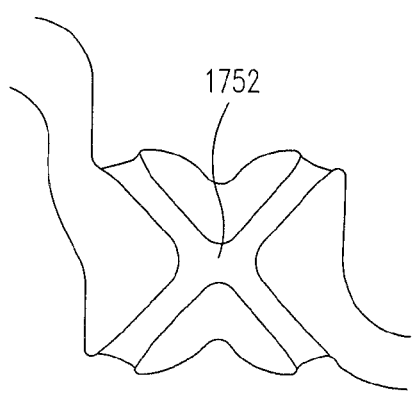
FIGS. 17G and 17H illustrate the outer hinge flexure, in accordance with an embodiment.
Figure 17H:
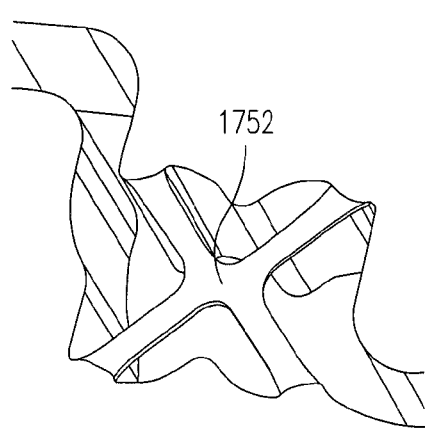
Figure 17I:
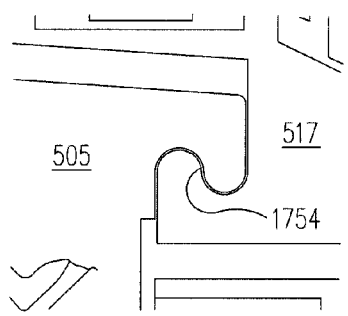
FIGS. 17I and 17J illustrate the lateral snubber assembly, in accordance with an embodiment.
Figure 17J:
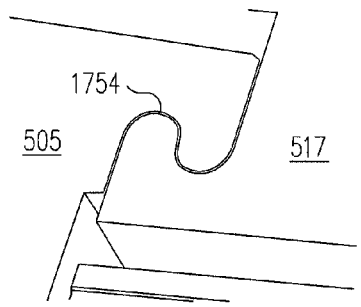

FIGS. 17D-17F illustrate an alternative embodiment of an interlocking snubber flaps feature 1756 useful for constraining both vertical movement of a component, e.g., moveable component 505, in the ±Z directions, as well as lateral movement thereof, i.e., in the ±X and/or ±Y directions. As may be seen in the cross-sectional views of FIGS. 17K, 17L and 17N, the structure of and methods for forming the interlocking flaps feature 1756 are similar to those of the interlocking flaps feature 5000 discussed above in connection with FIGS. 49-53.

As illustrated in FIG. 17F, this interlocking flaps feature includes the formation of a pair of flaps 1756A and 1756B respectively extending from moveable and fixed components 505 and 506 and over a corresponding shoulder 1762 formed on the other, opposing component. The flap 1756A on the moveable component 505 limits motion of the moveable component 505 in the −Z direction, and the flap 1756B on the fixed component 506 limits motion of the moveable component 505 in the +Z direction. Additionally, as illustrated in FIGS. 17K, 17L and 17N, the gap 1760 between the two components 505 and 506, which may be formed as discussed above in connection with FIGS. 49A-49F, may limit motion of the moveable component 505 in the ±X and/or ±Y directions.

Figure 17K:
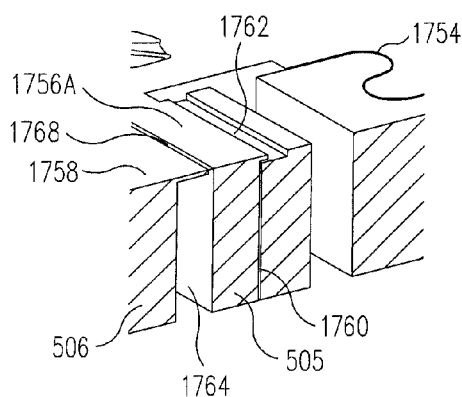
FIGS. 17K and 17L illustrate cross-sectional views of the single snubber flap and the interlocking snubber flaps, in accordance with an embodiment.
Figure 17L:
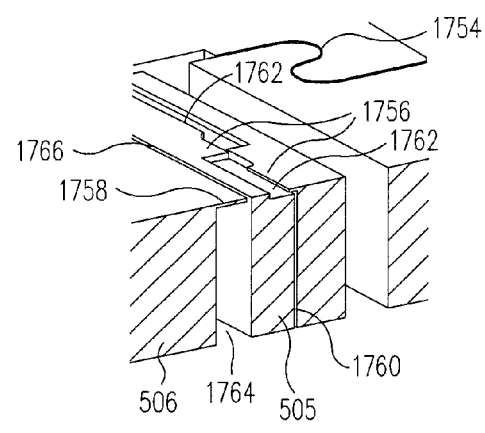
Figure 17M:
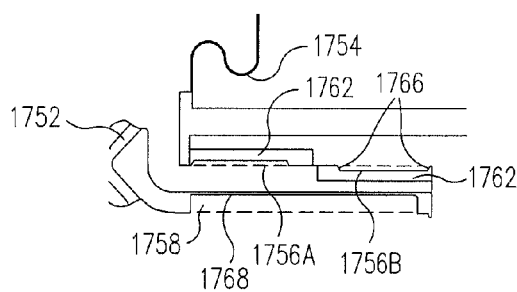
FIG. 17M illustrates a top view of the lateral snubber assembly, the single snubber flap and the interlocking snubber flaps, in accordance with an embodiment.

As illustrated in FIG. 17M, the respective front ends of the flaps 1756A and 1756B may define corners at the opposite ends thereof, and one or more of the corners may incorporate elliptical fillets 1766.

Figure 17N:
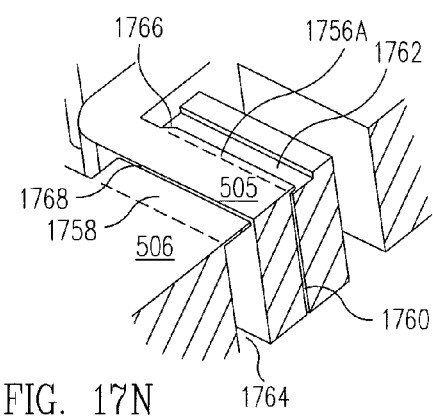
FIG. 17N illustrates cross-sectional views of the single snubber flap and the interlocking snubber flaps, in accordance with an embodiment.

As illustrated in FIGS. 17D-17L and FIGS. 17K-17N, a single snubber flap 1758 may be provided for constraining lateral movement of a component, e.g., moveable component 505, in an actuator device 1750. For example, the snubber flap 1758, which in some embodiments may comprise polysilicon, may extend from a fixed component, e.g., component 506, and toward but not over, the moveable component 505 to limit motion of the moveable component 505 in the lateral, i.e., in the in the ±X and/or ±Y directions. As illustrated in FIGS. 17K, 17L and 17N, the gap 1764 between the fixed and moveable components 505 and 506 can be made relatively larger than the gap 1768 between the snubber flap 1758 and the moveable component 505, such that the snubber flap 1758 does not interfere with normal rotational motion of the movable component 505, but does function to prevent unwanted lateral motion thereof.

Figure 18:
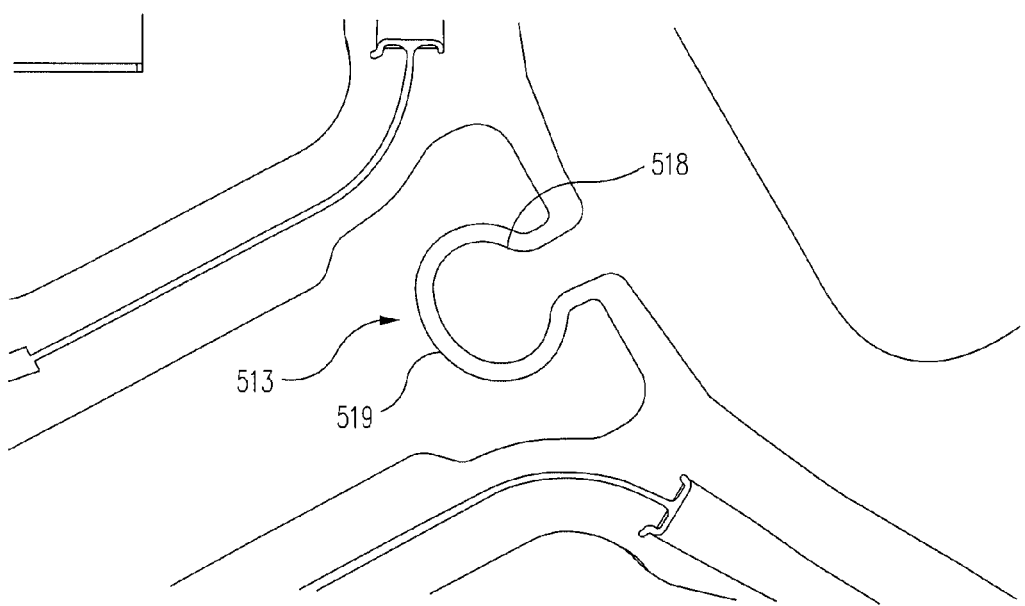
FIG. 18 illustrates a ball-in-socket snubber, in accordance with an embodiment.

FIG. 18 illustrates a ball-in-socket snubber 513, in accordance with an embodiment. The ball-in-socket snubber 513 may have a substantially cylindrical ball 518 that is slidably disposed within a substantially complimentary cylindrical socket 519. The ball-in-socket snubber 513 permit desired movement of the platform 520 with respect to the outer frame 506 and limit other movement.

Figure 19:
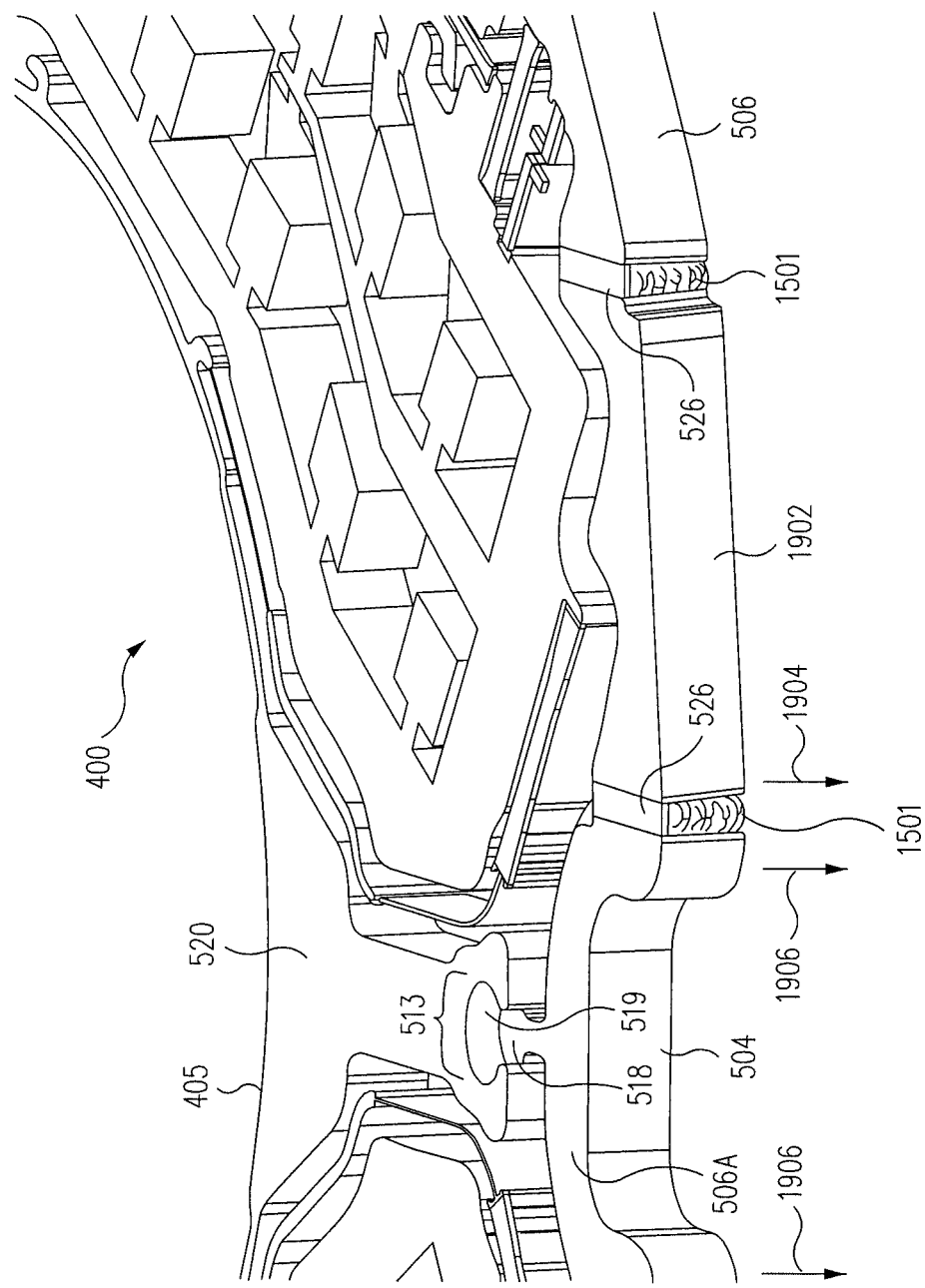
FIG. 19 illustrates the ball-in-socket snubber and two frame hinges, in accordance with an embodiment.

FIG. 19 illustrates a perspective view of the ball-in-socket 513 and two frame hinges 526, in accordance with an embodiment. The frame hinges 526 may be hinge flexures in the otherwise substantially rigid outer frame 506. The frame hinges 526 permit the outer frame 506 to deform out-of-plane while maintained desired rigidity in-plane.

With reference to FIGS. 20-31, electrical routing and contact through the kinematic mount flexures 502 is discussed, in accordance with several embodiments. Such electrical routing may be used to conduct electricity from the lens barrel 200 to the actuator device 400 in order to facilitate focusing, zooming, and/or optical image stabilization, for example.

Figure 20:
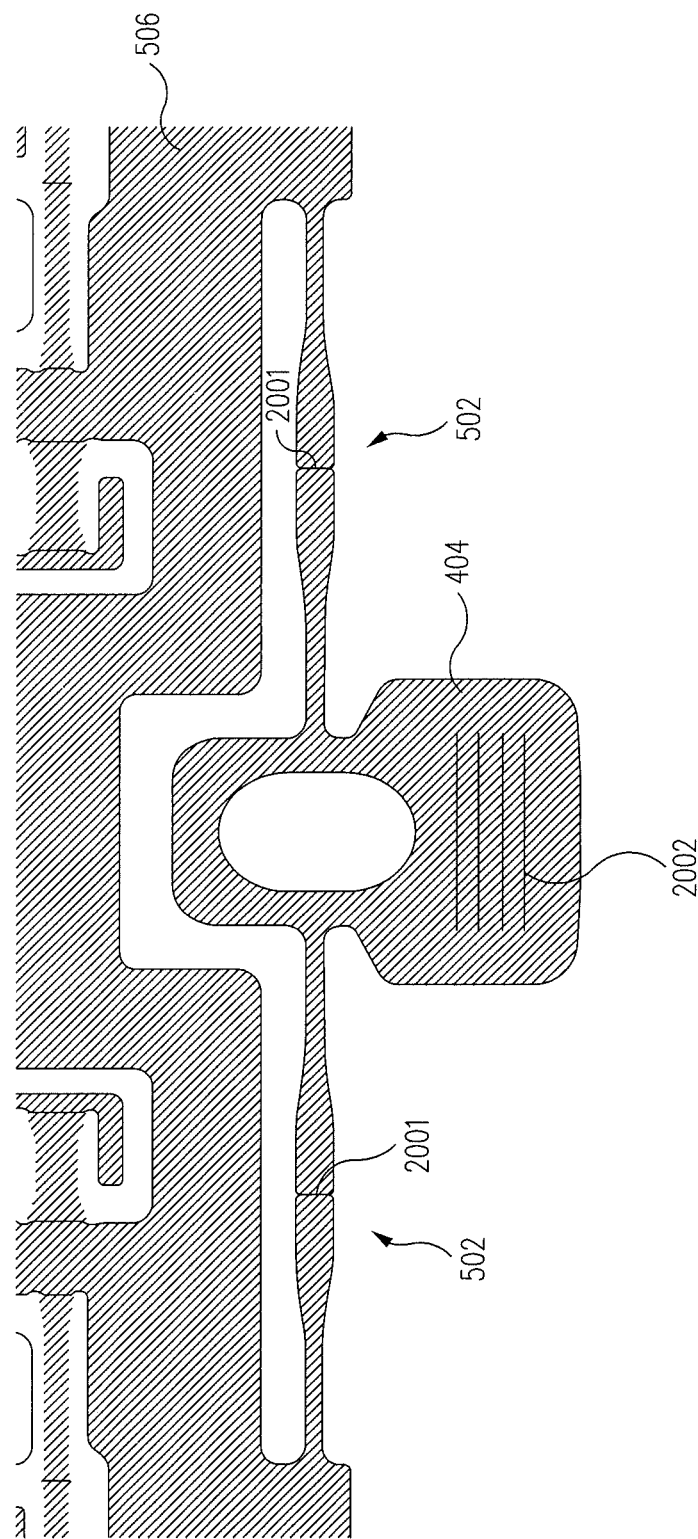
FIG. 20 illustrates a kinematic mount flexure having an electrical contact, in accordance with an embodiment.

FIG. 20 illustrates a top view of the kinematic mount flexures 502 having the electrical contact 404 formed thereto, in accordance with an embodiment. The kinematic mount flexures 502 may be formed to an outer frame 506 of an actuator device 400, for example. Polysilicon trenches 2001 may be formed in the kinematic mount flexures 502 and polysilicon trenches 2002 may be formed in the electrical contact 404. As discussed herein, the kinematic mount flexures 502 and the electrical contact 404 may comprise a single crystalline substrate 2211 (FIGS. 22 and 23) having a layer of polysilicon 2008 (FIGS. 22 and 23) formed thereon.

In some embodiments, the single crystalline substrate 2211 may be electrically isolated from the polysilicon 2008, so as to facilitate a communication of different voltages thereby. For example, the single crystalline substrate 2211 may be used to communicate one voltage to the actuator 550 and the polysilicon 2008 may be used to communicate another voltage to the same actuator 550 to effect actuation thereof.

In some embodiments, at least some portions of the single crystalline substrate 2211 may be in electrical communication with the polysilicon 2008, so as to facilitate the communication of voltage therebetween. For example, the single crystalline substrate 2211 and the polysilicon 2008 of one or more electrical contacts 404 may be in electrical communication with one another such that an electrical connection may be made to either the top (polysilicon 2008) or the bottom (single crystalline substrate 2211) of the electrical contact 404 with the same effect.

The polysilicon trenches 2001 may be formed substantially in a center of each kinematic mount flexure 502 and may be formed substantially perpendicular to a length of the kinematic mount flexures 502, for example. The polysilicon trenches 2001 may be adapted such that the polysilicon trenches 2001 are suitable to electrically isolate the single crystalline substrate 2211 of the kinematic mount flexure 502 on one side of the polysilicon trench 2001 from the single crystalline substrate 2211 of the kinematic mount flexure 502 on the other side of the polysilicon trench 2001.

For example, the polysilicon trenches 2001 may extend completely through and completely across the kinematic mount flexures 502. Thus, in one embodiment, electrical contact (e.g., the application of a voltage) to the single crystalline substrate 2211 of the kinematic mount flexure 502 on one side of the polysilicon trench 2001 does not substantially affect the single crystalline substrate 2211 of the kinematic mount flexure 502 on the other side of the polysilicon trench 2001.

In this manner, desired routing of the voltages used to actuate the actuators 550 may be provided. For example, one voltage may be applied to an electrical contact 404 and may be routed to the actuator 550 via the polysilicon 2008 formed upon the actuator device 400 and may be isolated from the single crystalline substrate 2211 from which the actuator device 400 is formed. The polysilicon trenches 2001 may prevent shorting of a voltage applied to the electrical contact 404 with respect to the single crystalline substrate 2211 of the actuator device 400.

The kinematic mount flexures 502 may be mechanically continuous. Thus, the kinematic mount flexures 502 may facilitate mounting of the actuator device 400 to a lens barrel 200 as discussed herein, for example.

The polysilicon trenches 2002 may be formed in the electrical contact 404 to provide electrical communication through the electrical contact 404. Thus, a voltage applied to one side of the electrical contact 404 may be provided to the other side of the electrical contact 404. Any desired number of the polysilicon trenches 2002 may be formed in the electrical contact 404.

The use of such trenches 2001 and 2002 may provide substantial flexibility in the routing of voltages, such as through the actuator device 400 for the actuation of the actuators 550 thereof, for example. The use of through-the-thickness (top to bottom) polysilicon or another conductive material 2008 filled trenches 2002 may provide flexibility in the routing of voltages from one surface of the actuator device 400 to the other surface thereof. Such trenches 2002 may be used at any desired location and are not limited in location to the electrical contacts 404.

Figure 21:
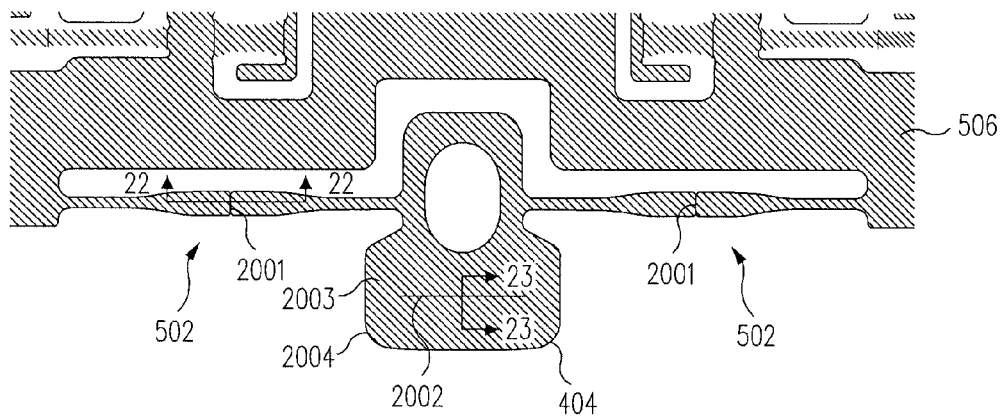
FIG. 21 illustrates the kinematic mount flexure having the electrical contact, in accordance with an embodiment.

FIG. 21 illustrates the kinematic mount flexure 502, in accordance with an embodiment. A single polysilicon trench 2002 may be formed in the electrical contact 404 such that the polysilicon trench 2002 extends completely through the electrical contact 404 and does not completely cross the electrical contact 404 (e.g., such that the polysilicon trench 2002 does not separate the electrical contact 404 into two electrically isolated portions). The polysilicon trench 2002 may be used to provide electrical communication between surfaces of the electrical contact. For example, the polysilicon trench 2002 may be used to provide electrical communication between a top surface 2003 and a bottom surface 2004 of the electrical contact 404.

Figure 22:
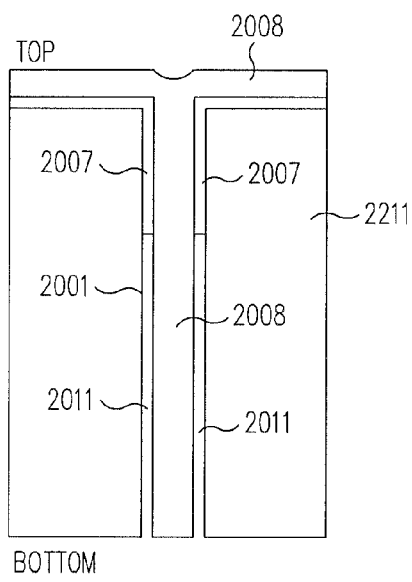
FIG. 22 illustrates a cross-section of the kinematic mount flexure taken along line 22 of FIG. 21, in accordance with an embodiment.

FIG. 22 illustrates a cross-section of the kinematic mount flexure 502 taken along line 22 of FIG. 21, in accordance with an embodiment. The polysilicon trench 2001 formed in the single crystalline substrate 2211 may have an oxide layer 2007 formed thereon. The polysilicon 2008 may be formed upon the oxide layer 2007. In one embodiment, the single crystalline substrate 2211 of the kinematic mount flexure 502 may be formed of doped single crystalline silicon and the polysilicon 2008 may be formed of a doped polysilicon. Thus, the single crystalline substrate 2211 of the kinematic mount flexure 502 and the polysilicon 2008 of the kinematic mount flexure 502 may both be at least partially conductive and may be used to route voltages (such as to the actuators 550, for example). The oxide layer 2007 may electrically isolate the polysilicon 2008 from the single crystalline substrate 2211 of the kinematic mount flexure 502.

An undercut 2011 may be formed in the trench 2001 by removing a portion of the oxide layer 2007. The portion of the oxide layer 2007 may be removed during an etching process, for example.

Figure 23:
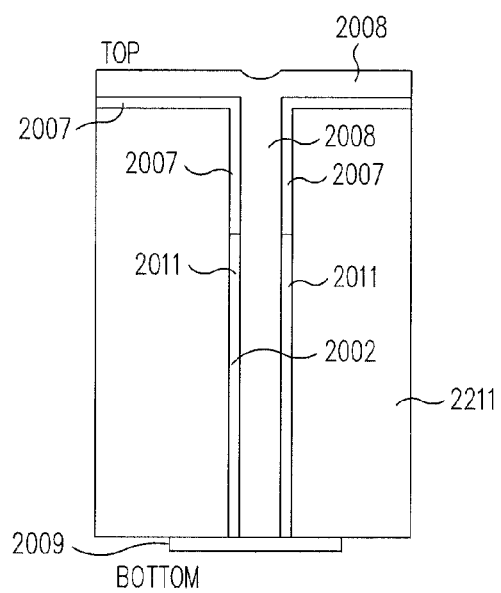
FIG. 23 illustrates a cross-section of the electrical contact taken along line 23 of FIG. 21, in accordance with an embodiment.

FIG. 23 illustrates a cross-section of the electrical contact taken along line 23 of FIG. 21, in accordance with an embodiment. The polysilicon trench 2002 may have the oxide layer 2007 formed thereon. The polysilicon 2008 may be formed upon the oxide layer 2007. The electrical contact 404 may be formed of doped single crystalline polysilicon and the polysilicon 2008 may be formed of doped polysilicon. Thus, the electrical contact 404 and the polysilicon 2008 may be at least partially conductive and may be used to route voltages. The oxide layer 2007 may be used to electrically isolate the polysilicon 2008 from the electrical contact 404.

A metal contact pad 2009 may be in electrical communication with both the polysilicon 2008 and the single crystalline silicon 2211. Thus, the metal contact pad 2009 may be used to apply a voltage to both surfaces (top and bottom) of the electrical contact 404.

Use of the trenches 2001 and 2002 permits use of the metal contact pad 2009 on either side of the electrical contact 404. Thus, use of the trenches 2001 and 2002 enhances the flexibility of providing voltages to the actuator device 400.

An undercut 2011 may be formed in the trench 2002 by removing a portion of the oxide layer 2007. A portion of the oxide layer 2007 may be removed during an etching process, for example.

Figure 24:
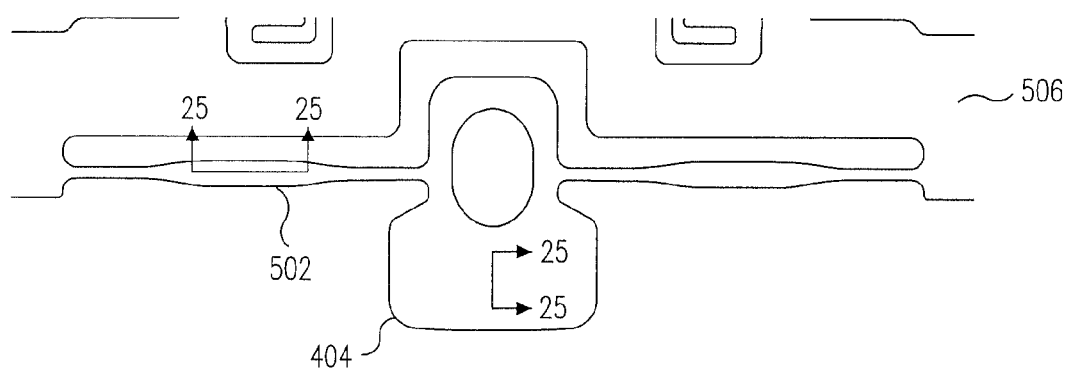
FIG. 24 illustrates the kinematic mount flexure having the electrical contact, in accordance with an embodiment.

FIG. 24 illustrates the kinematic mount flexure 502 having no polysilicon trench 2001 formed therein and the electrical contact 404 having no polysilicon trench 2002 formed therein, in accordance with an embodiment. Thus, the single crystalline silicon substrate 2211 (see FIG. 25), for example, is electrically and mechanically continuous. According to an embodiment, electrical connection may be made to either desired surface (e.g., top or bottom) of the electrical contact 404.

Figure 25:
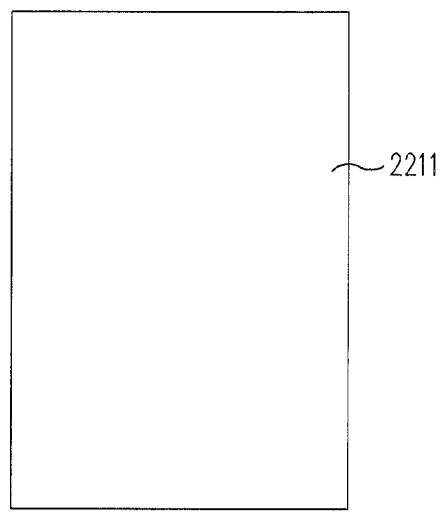
FIG. 25 illustrates a cross-section of the electrical contact taken along line 25 of FIG. 24, in accordance with an embodiment.

FIG. 25 illustrates a cross-section of the electrical contact taken along line 25 of FIG. 24, in accordance with an embodiment. The single crystalline silicon substrate 2211, for example, is electrically and mechanically continuous since no polysilicon trench 2002 is formed therein.

FIG. 26 illustrates the kinematic mount flexure 502 having the electrical contact 404, in accordance with an embodiment. A polysilicon layer 2701 may be formed upon the kinematic mount flexures 502 and/or the electrical contact 404. The polysilicon layer 2701 may provide electrical communication from the electrical contact 404 to the actuators 550, for example.

FIG. 27 illustrates a cross-section of the electrical contact taken along line 27 of FIG. 26, in accordance with an embodiment. The polysilicon layer 2701 may be formed upon an oxide layer 2702 to electrically isolate polysilicon layer 2701 from a single crystalline substrate 2703, for example. Thus, an electrical connection providing one voltage to the polysilicon layer 2701 may be made via the top of the electrical contact 404 and an electrical connection providing a different voltage to the single crystalline substrate 2703 may be made via the bottom of the electrical contact 404.

FIG. 28 illustrates a cross-section of the electrical contact 404 taken along line 28 of FIG. 26, in accordance with an embodiment. The polysilicon layer 2701 may extend over the top surface of the electrical contact 404 and down along at least one side thereof. The polysilicon layer 2701 may be electrically isolated from the single crystalline substrate 2703 by the oxide layer 2702. A portion of the oxide layer 2702 may be etched away during processing, forming an undercut 2801. A metal contact pad 2802 may be formed to the single crystalline substrate 2703 to facilitate electrical contact therewith.

Figure 29:
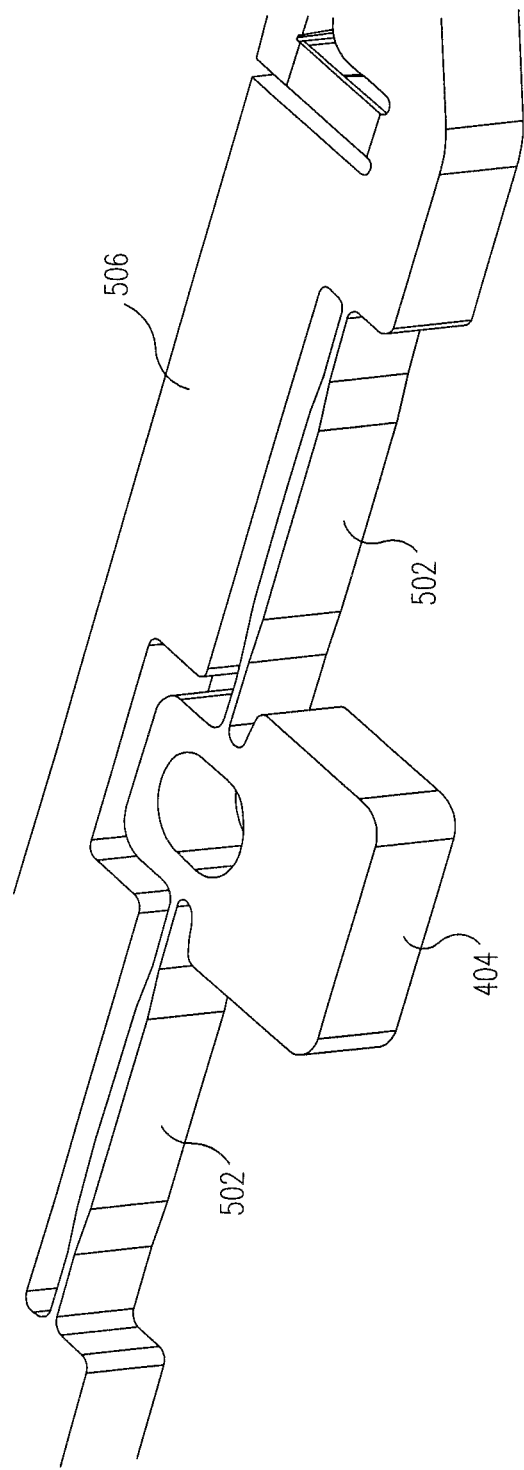
FIG. 29 illustrates the kinematic mount flexure having the electrical contact, in accordance with an embodiment.

FIG. 29 illustrates the kinematic mount flexure 502 having the electrical contact 404, in accordance with an embodiment. The electrical contact 404 and the kinematic mount flexure 502 may facilitate mounting of the actuator device 400, such as within a lens barrel 200, as discussed herein. The electrical contact 404 and the kinematic mount flexure 502 may facilitate electrical communication between the lens barrel and actuators 550 of the actuator device, as discussed herein. The flexures 502 may, for example, accommodate manufacturing imperfections or tolerances of the actuator device 400 and/or the lens barrel 200 while mitigating stress upon the actuator device 400 caused by such imperfections.

Figure 30:
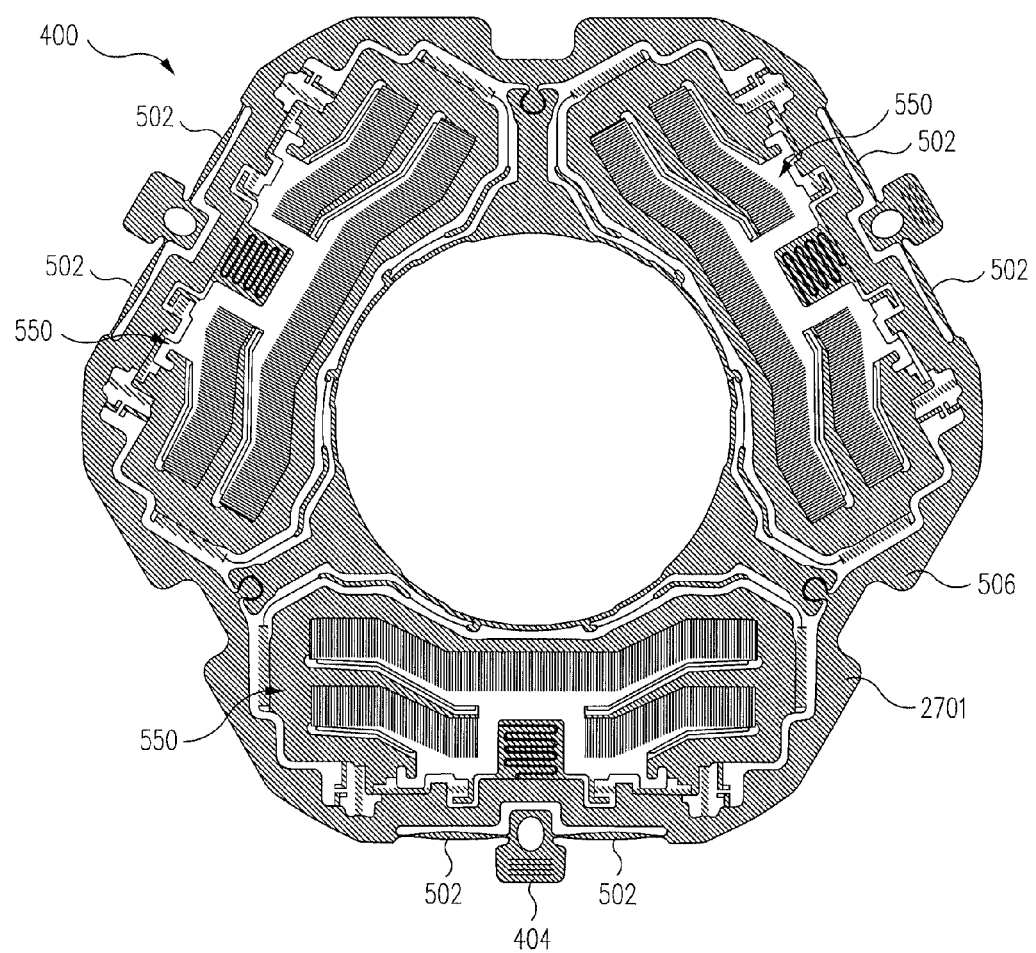
FIG. 30 illustrates the actuator device having the kinematic mount flexure, in accordance with an embodiment.

FIG. 30 illustrates the actuator device 400 having the kinematic mount flexures 502, in accordance with an embodiment. The hatched sections of the actuator device 400 shown in FIG. 30 indicate where the top layer of polysilicon layer 2701 may be formed in an embodiment where the polysilicon layer 2701 is continuous among all three actuators 550. Thus, a single electrical signal (e.g., voltage) may readily be applied to all three actuators 550 to effect substantially identical and substantially simultaneous control thereof. That is, the three actuators 550 may tend to move substantially in unison with respect to one another in response to the single electrical signal.

Figure 31:
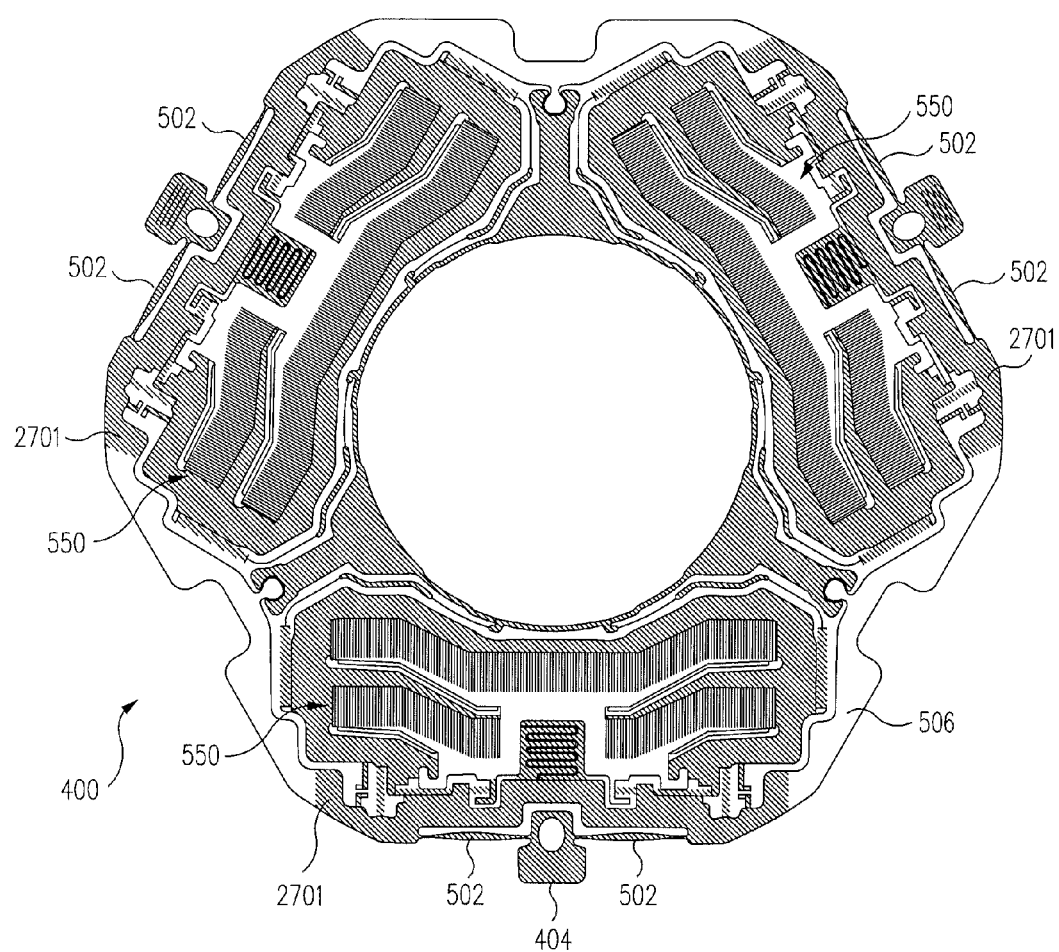
FIG. 31 illustrates the actuator device having the kinematic mount flexure, in accordance with an embodiment.

FIG. 31 illustrates the actuator device 400 having the kinematic mount flexures 502, in accordance with an embodiment. The hatched sections of the actuator device 400 shown in FIG. 31 indicate where the top layer of polysilicon layer 2701 may be formed in an embodiment where the polysilicon layer 2701 is discontinuous among all three actuators 550. Thus, separate electrical signals (e.g., voltage) may readily be applied independently to each of the actuators 550 to effect substantially independent control thereof. That is, the three actuators 550 may be controlled so as to move substantially in non-unison with respect to one another in response to the different electrical signals.

With reference to FIGS. 32-58, methods for separating structures, such as MEMS structures, are discussed in accordance with several embodiments. Separated structures may be used to provide mechanical and/or electrical isolation thereof, such as for structures of the actuator device 400, for example. Structures made of the same material may be separated from one another. Structures made of different materials may be separated from one another. Structures may be separated to facilitate relative motion to one another. Structures may be separated to define a desired device or structure by discarding a separated structure. Structures may be separated to allow different voltages to be present at each structure.

Figure 57:
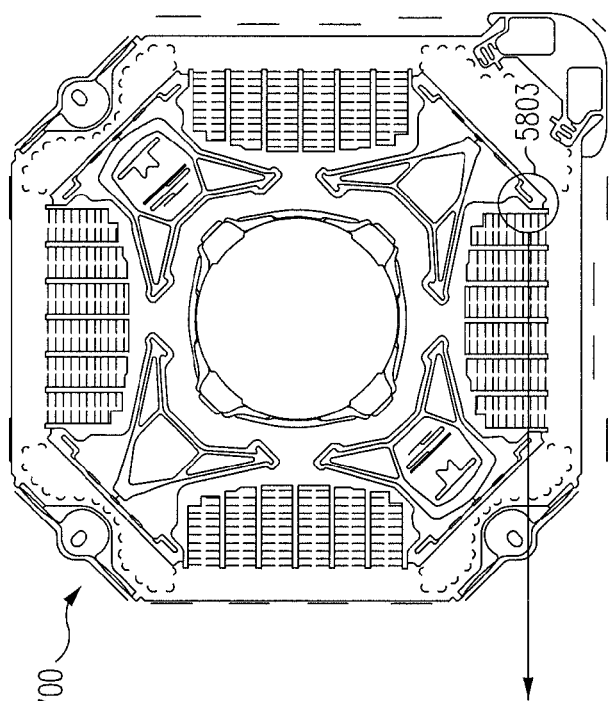
FIG. 57 illustrates an example of a use of a pinch or separation, in accordance with an embodiment.
Figure 58:
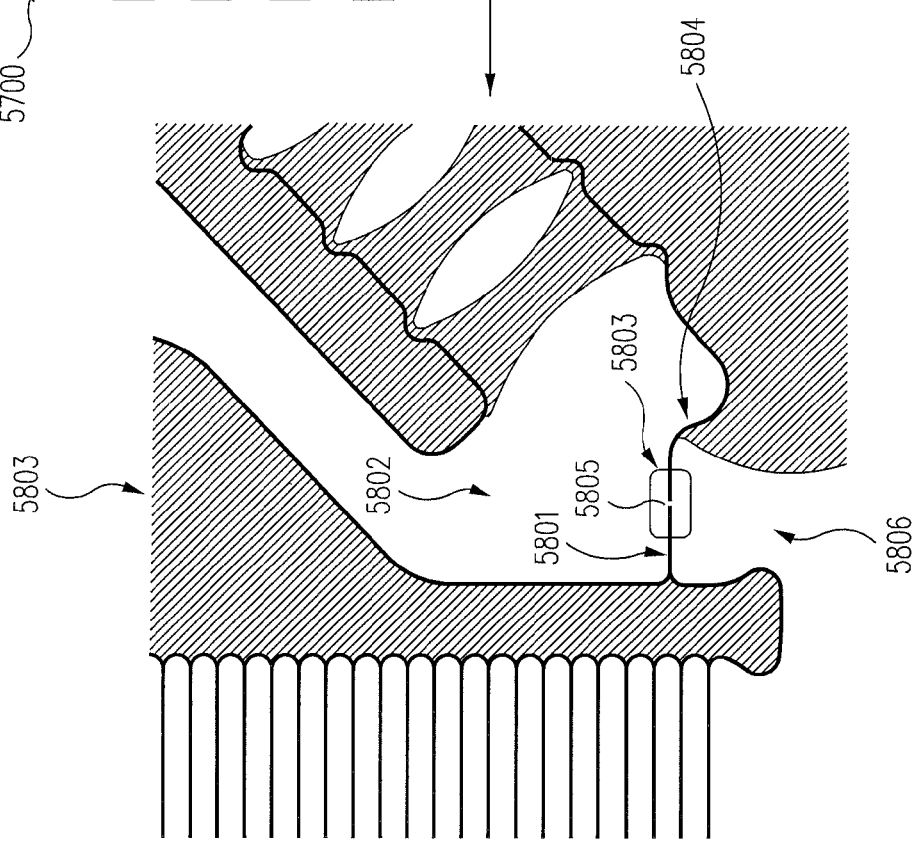
FIG. 58 illustrates an enlarged view of an example of the pinch or separation, in accordance with an embodiment.

FIGS. 32-48 illustrate an example of an embodiment for forming one type of the separated structures. FIGS. 49-56 illustrate an example of an embodiment for forming another type of the separated structures. FIGS. 57 and 58 illustrate an example of the use of the separated structures in the fabrication of the actuator device 400.

FIG. 32 illustrates a perspective view of a substrate 3202 having a trench 3201 formed therein, in accordance with an embodiment. The substrate 3202 may be a first semiconductor material. For example, the substrate 3202 may be single crystalline silicon. The substrate 3202 may be any desired type of semiconductor material. The substrate 3202 may be a non-semiconductor material, such as a metal.

The trench 3201 may have a narrow portion or pinch 3203 formed therein. The trench 3201 may be etched into the substrate 3202. For example, a deep reactive-ion etching (DRIE) process may be used to form the trench 3202. Examples of DRIE processes are disclosed in U.S. patent application Ser. No. 11/365,047, filed Feb. 28, 2002, and in U.S. patent application Ser. No. 11/734,700, filed Apr. 12, 2007 all of which are incorporated herein by reference in their entirety.

In one embodiment, the trench 3201 may be etched part of the way from the top of the substrate 3202 to the bottom thereof. In another embodiment, the trench 3201 may be etched completely through the substrate 3202 (e.g., all of the way from the top of the substrate 3202 to the bottom thereof). FIG. 36 shows the trench 3201 etched part of the way from the top of the substrate 3202 to the bottom thereof. A bottom portion 3501 (see FIG. 39) of the substrate 3202 through which the trench 3201 does not extend may be removed during subsequent processing, as discussed herein. The trench 3201 may have any desired length. The trench 3201, as well as any other trench discussed herein, may be locally etched, such as via the DRIE process.

FIG. 33 illustrates a top view of the substrate 3202 with the trench 3201 having the pinch 3203 formed therein, in accordance with an embodiment. A gap 3205 may be defined by the pinch 3203. The pinch 3203 may be formed on either one side or both sides of the trench 3201. The gap 3205 may be defined as a portion of the trench 3201 that is narrower than adjacent portions of the trench 3201.

FIG. 34 illustrates a cross-sectional view of the substrate 3202 with the trench 3201 having the pinch 3203 formed therein, in accordance with an embodiment. The cross-sectional view of FIG. 34 is taken along line 34 of FIG. 33. As may be seen, the trench 3202, including the gap 3205, tapers slightly from top to bottom. A taper angle "I" may result from the DRIB process when the trench 3201 is etched into the substrate 3202. In one embodiment, the taper angle "I" may be less than one degree. For example, the taper angle "I" may be in the range of approximately 0.6 to approximately 0.8 degrees. The taper angle "I" is exaggerated for clarity in the figures.

FIG. 35 illustrates a cross-sectional view of the substrate 3202 with the trench 3201 having the pinch 3203 formed therein, in accordance with an embodiment. The cross-sectional view of FIG. 35 is taken along line 35 of FIG. 33. A bottom portion 3501 of the substrate 3202 is defined beyond the bottom of the trench 3201. The bottom portion 3501 may be removed during subsequent processing such that after removal the trench 3201 extends completely through the substrate 3202.

FIG. 36 illustrates a perspective view of the substrate 3202 having an oxide layer 3601 formed within the trench 3201, in accordance with an embodiment. The oxide layer 3601 may comprise silicon dioxide, for example. In one embodiment, the oxide layer 3601 may be formed by a thermal growth process, in which case the thermal growth process consumes some of the silicon substrate 3202. The oxide layer 3601 may substantially fill the gap 3205 (see FIG. 33). The oxide layer 3601 may completely fill the gap 3205. By filling the gap 3205, the oxide layer 3601 facilitates the separation of a subsequently formed polysilicon material into two separate portion thereof.

FIG. 37 illustrates a top view of the substrate 3202 having the oxide layer 3601 formed therein, in accordance with an embodiment. As may be seen, the oxide 3601 defines four regions. The oxide layer 3601 separates the substrate 3202 into two regions and separates the trench 3601 into two regions (each of which may be filled with polysilicon or any other material), as discussed in further detail herein.

FIG. 38 illustrates a cross-sectional view of the substrate 3202 having the oxide layer 3601 formed therein, in accordance with an embodiment. The cross-sectional view of FIG. 38 is taken along line 38 of FIG. 37.

FIG. 39 illustrates a cross-sectional view of the substrate 3202 having the oxide layer 3601 formed therein, in accordance with an embodiment. The cross-sectional view of FIG. 39 is taken along line 39 of FIG. 37. As discussed herein, a bottom portion 3501 of the substrate 3202 may be removed during subsequent processing such that the trench 3201 will then extend completely through the substrate 3202.

Figure 40:
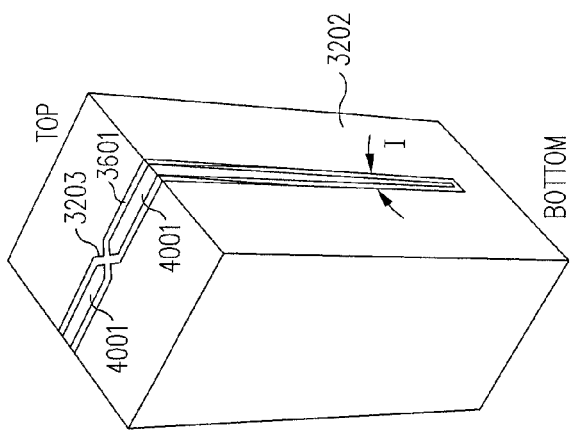
FIG. 40 illustrates a perspective view of the substrate having a polysilicon formed upon the oxide layer, in accordance with an embodiment.

FIG. 40 illustrates a perspective view of the substrate 3202 having a second semiconductor material, such as a polysilicon 4001, formed upon oxide layer 3601, in accordance with an embodiment. Thus, the substrate 3202 and the material with which the trench 3201 is filled may comprise a first semiconductor material and a second semiconductor material. The first semiconductor material and the second semiconductor material may be the same semiconductor materials or may be different semiconductor materials. The first semiconductor material and the second semiconductor material may be any desired semiconductor materials. Non-semiconductor materials may be used as discussed herein.

Figure 41:
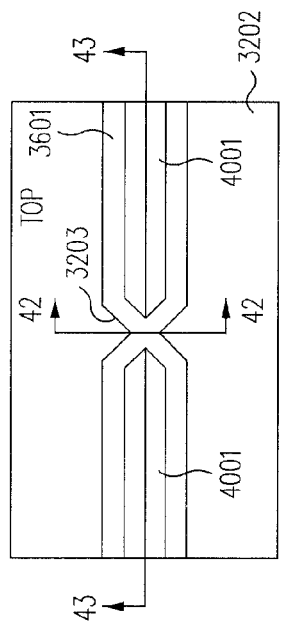
FIG. 41 illustrates a top view of the substrate, in accordance with an embodiment.

FIG. 41 illustrates a top view of the substrate 3202 having the polysilicon 4001 formed upon oxide layer 3601, in accordance with an embodiment same as FIG. 38.

Figure 42:
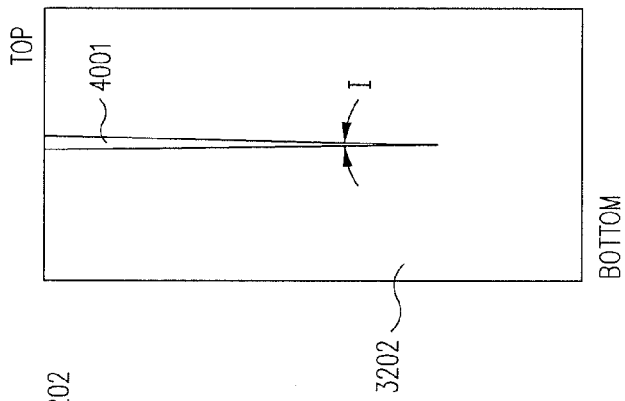
FIG. 42 illustrates a cross-sectional view of the substrate taken along line 42 of FIG. 41, in accordance with an embodiment.

FIG. 42 illustrates a cross-sectional view of the substrate 3202 the polysilicon 4001 formed upon oxide layer 3601, in accordance with an embodiment. The taper angle "I" as shown may be exaggerated for clarity.

Figure 43:
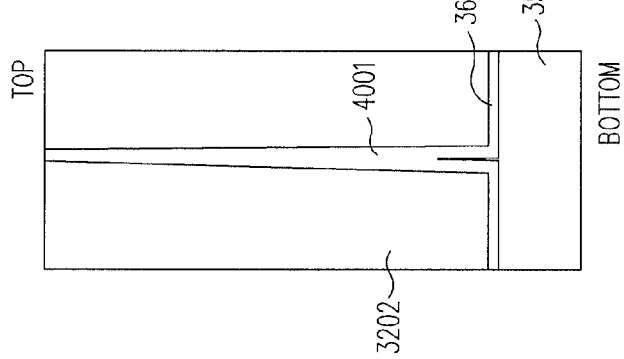
FIG. 43 illustrates a cross-sectional view of the substrate taken along line 43 of FIG. 41, in accordance with an embodiment.

FIG. 43 illustrates a cross-sectional view of the substrate 3202 having the polysilicon formed upon oxide layer 3601, in accordance with an embodiment.

FIG. 44 illustrates a perspective view of the substrate 3202 (including portions 3202a and 3202b) after a wafer thinning and oxide removal process, in accordance with an embodiment. During the wafer thinning process, the bottom portion 3501 (see FIG. 43) of the substrate 3202 may be removed such that the trench 3201 extends completely through the substrate 3202.

FIG. 45 illustrates a top view of substrate 3202 the after wafer thinning and oxide removal, in accordance with an embodiment. The taper angle "I" and a consumption of the silicon during the thermal growth process cooperate to separate the polysilicon 4001 into two portions 4001a and 4001b. In one embodiment, the separation is at the thinnest part of the trench 3201 (i.e., at the pinch 3203).

FIG. 46 illustrates a bottom view of the substrate 3202 after the wafer thinning and oxide removal process, in accordance with an embodiment. All or a portion of the oxide 3601 may be removed.

FIG. 47 illustrates a cross-sectional view of the substrate 3202 after the wafer thinning and oxide removal process, in accordance with an embodiment. The taper angle "I" is exaggerated for clarity in the figures.

FIG. 48 illustrates a cross-sectional view of the substrate 3202 after the wafer thinning and oxide removal process, in accordance with an embodiment the taper angle "I" is exaggerated for clarity in the figures. As shown, the single crystalline silicon substrate 3202 may be separated into two portions 3202a and 3202b and the polysilicon 4001 may each be separated into two portions 4001a and 4001b. Each portion 3202a and 3202b of the substrate 3202 and t each portion 4001a and 4001b of the polysilicon 4001 may be mechanically and/or electrically isolated from each other portion thereof. Indeed, each portion 3202a and 3202b of the substrate 3202 may be mechanically and/or electrically isolated from each other, and from each portion 4001a and 4001b of the polysilicon 4001. Each portion 4001a and 4001b of the polysilicon 4001 may be mechanically and/or electrically isolated from each other, and from each portion 3202a and 3202b of the substrate 3202. Thus, structures made from the same material may be separated from one another and structures made from different material may be separated from one another.

In the embodiments discussed with reference to FIGS. 32-48 above, the use of the pinch 3203 facilitates the separation of two portions of the polysilicon 4001 with respect to one another. In the embodiments discussed with respect to FIGS. 49-56, an etch process facilitates the separation of two portions of a polysilicon 5101 with respect to one another.

Figure 49:
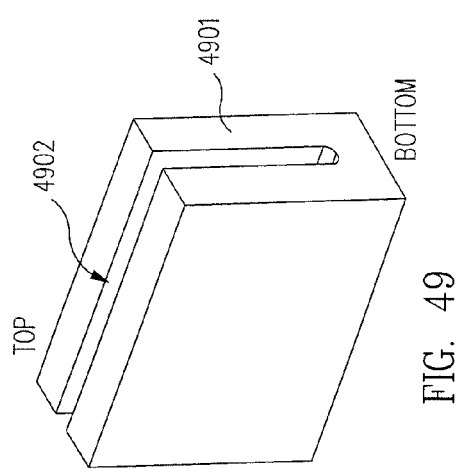
FIG. 49 illustrates a substrate after a deep reactive-ion etch (DRIE) trench etch process, in accordance with an embodiment.

FIG. 49 illustrates the result of a DRIE trench etch process, in accordance with an embodiment. A substrate 4901 may comprise a first semiconductor as discussed herein. A trench 4902 may be formed in the substrate 4901.

Figure 50:
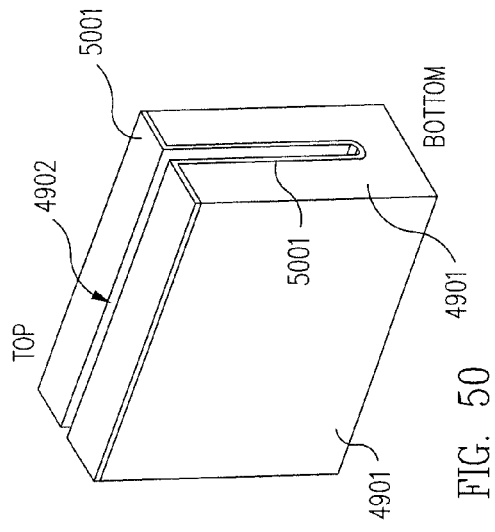
FIG. 50 illustrates the substrate after a thermal oxidation process, in accordance with an embodiment.

FIG. 50 illustrates the result of a thermal oxidation process, in accordance with an embodiment. An oxide layer 5001 may be formed in the trench 4902 as discussed herein. The oxide layer 5001 may also be formed upon a top of the substrate 4901.

Figure 51:
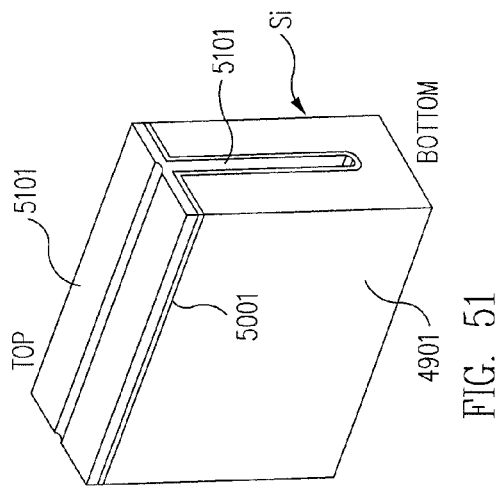
FIG. 51 illustrates the substrate after a polysilicon deposition process, in accordance with an embodiment.

FIG. 51 illustrates the result of a polysilicon deposition process, in accordance with an embodiment. A polysilicon 5101 may be deposited over the oxide layer 5001. The polysilicon 5101 may fill the trench 4902 and may extend over the entire top of the substrate 4901 or over a portion of the top of the substrate 4901.

Figure 52:
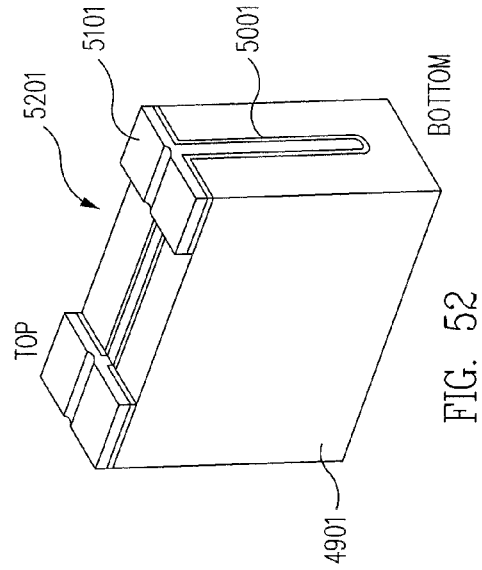
FIG. 52 illustrates the substrate after an oxide etch process and surface polysilicon etch, in accordance with an embodiment.

FIG. 52 illustrates the result of an oxide etch process, in accordance with an embodiment. A portion of the polysilicon 5101 and a substantially corresponding portion of the oxide layer 5001 may be removed, such as by etching. The removal of the polysilicon 5101 and the oxide layer 5001 may form a trough 5201.

Figure 53:
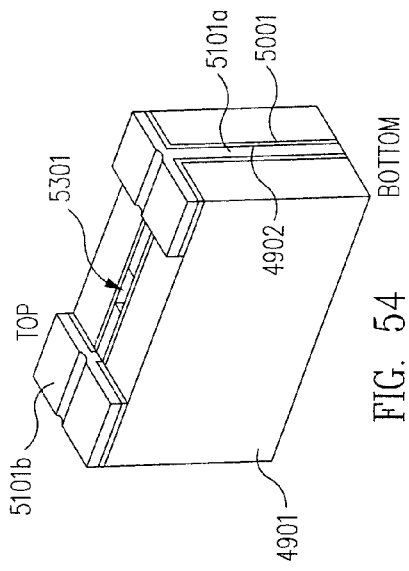
FIG. 53 illustrates the substrate after the DRIE etch process has formed a separation in the polysilicon, in accordance with an embodiment.

FIG. 53 illustrates the result of a pinch off DRIE etch process, in accordance with an embodiment. The etch process may result in the formation of a pinch or gap 5301 that separates the polysilicon 5101 into two portions 5101a and 5101b. At this point in processing, the trench 4902 may not extend completely from a top to a bottom of the substrate 4901.

The gap 5201 is functionally similar to the pinch 3203 of FIG. 33. The gap 5201 facilitates the separation of portions 5101a and 5101b of the polysilicon 5101 from one another.

Figure 54:
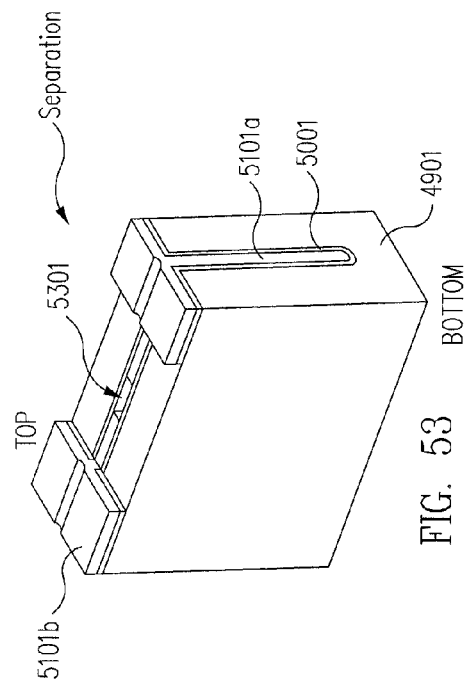
FIG. 54 illustrates the substrate after the wafer thinning process, in accordance with an embodiment.

FIG. 54 illustrates the result of a wafer thinning process, in accordance with an embodiment. The wafer thinning process may be used to remove a sufficient portion of the bottom of the substrate 4901 such that the trench 4902 extends completely from the top to the bottom of the substrate 4901.

Figure 55:
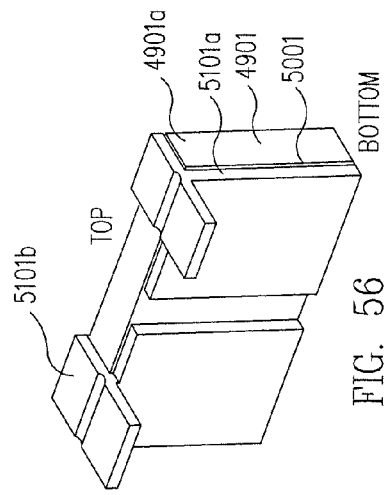
FIG. 55 illustrates the substrate after an isotropic oxide etch process, in accordance with an embodiment.

FIG. 55 illustrates the result of an isotropic oxide etch process applied to the substrate 4901, in accordance with an embodiment. The isotropic oxide etch may be use to removed a portion of the oxide layer 5001. The isotropic oxide etch process may release four structures (i.e., the two portions 4901a and 4901b of the substrate 4901 and the two portions 5101a and 5101b of the polysilicon 5101) from each other. Thus, the four structures may be mechanically and/or electrically isolated from one another. The isotropic oxide etch process may be used to selectively release or separate any desired structures or portions of structures from one another.

Figure 56:
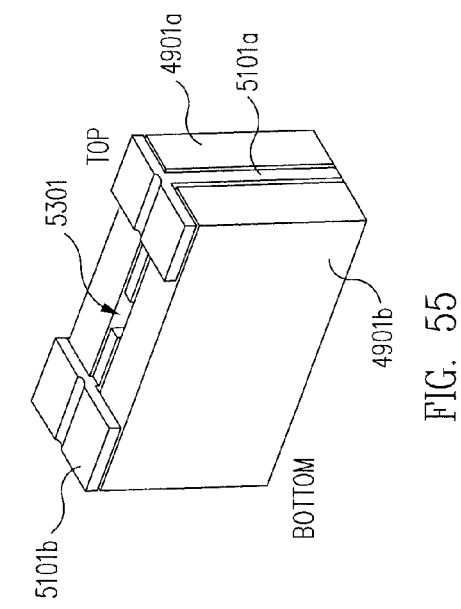
FIG. 56 illustrates the substrate after a separation has been formed in the polysilicon, in accordance with an embodiment.

FIG. 56 illustrates a separation in the polysilicon 5101, in accordance with an embodiment. As shown, both the single crystalline silicon substrate 4901 and the polysilicon 5101 may be separated into two portions each. Each of the two portions 4901a and 4901b of the single crystalline substrate 4901 may be mechanically and electronically isolated from one another and from each of the two portions 5101a and 5101b of the polysilicon 5101. Each of the two portions 5101a and 5101b of the polysilicon 5101 may be mechanically and electrically isolated from one another and from each of the two portions 4901a and 4901b of the single crystalline substrate 4901. One portion of the substrate 4901 is not shown in FIG. 56 for clarity.

FIG. 57 illustrates an example of a use of a pinch or separation 5805 (see FIG. 58) to separate structures of an actuator device 5700, in accordance with an embodiment. In one embodiment, actuator device 5700 may be used to implement actuator device 400. The separation 5805 occurs in the circle 5803 at the lower right corner of the actuator device 5700.

FIG. 58 illustrates an enlarged view of an example of the use of the separation 5301 or pinch 3203 to facilitate the separation of structures, in accordance with an embodiment. In this example, moving polysilicon structures 5801 are separated from stationary polysilicon structures 5804 and stationary single crystalline structures 5806. Advantage may be taken of the mechanical separation of the moving polysilicon structures 5801 with respect to the stationary polysilicon structures 5804 to facilitate movement of the moving polysilicon structures 5801 with respect to the stationary polysilicon structures 5804. Advantage may be taken of the electrical separation of the moving polysilicon structures 5801 with respect to the stationary polysilicon structures 5804 to facilitate the application of different voltages to the moving polysilicon structures 5801 and the stationary polysilicon structures 5804.

A silicon fillet 5802 may fall off or be removed from the actuator device 5700 during fabrication thereof and thus may not form a part thereof. The silicon fillet 5802 is material that is removed from the single crystalline substrate 4901 to form the actuator device 400. Again, the separation 5805 is shown prior to etching thereof. After etching, the moving polysilicon

5801 will be free to move with respect to the stationary polysilicon 5804. Thus, the moving polysilicon 5801 will be separated from the stationary polysilicon 5804 as discussed with respect to FIGS. 32-56.

With reference to FIGS. 59-66, a guard trench 5901 is discussed, in accordance with several embodiments. The guard trench 5901 may be used for supporting a polysilicon layer 5905 (see FIG. 61) during the etching of an oxide layer 5904 (FIG. 60) and for limiting the resulting etch of the oxide layer 5904 behind the guard trench 5901, for example. In one embodiment, the guard trench 5901 may be a blind trench that provides an increased path length of the oxide layer 5904 to be etched such that the etch is inhibited from extending to portions of the oxide layer 5904 where etching is not desired. The use of the guard trench 5901 permits a larger tolerance or variation in etch parameters (such as etchant, etchant concentration, temperature, duration) without the variation undesirably affecting device operation or performance.

Figure 59:
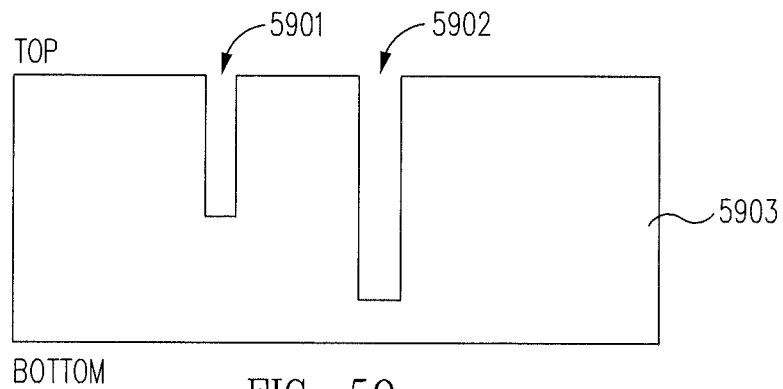
FIG. 59 illustrates a guard trench formed in a substrate proximate a regular trench, in accordance with an embodiment.

FIG. 59 illustrates a guard trench 5901 formed proximate a regular trench 5902 in a substrate 5903, in accordance with an embodiment. The regular trench 5902 may provide any designed function. For example, the polysilicon in the trench may concentrate voltages across the actuator device 400 to one or more actuators 550. The guard trench 5901 may be deeper than the regular trench 5902, the same depth as the regular trench 5902, or shallower than the regular trench 5902. The guard trench 5901 may be substantially parallel with respect to the regular trench 5902 or may be non-parallel with respect to the regular trench 5902. The guard trench 5901 and/or the regular trench 5902 may be formed by a DRIE process or by any other desired method.

Figure 60:
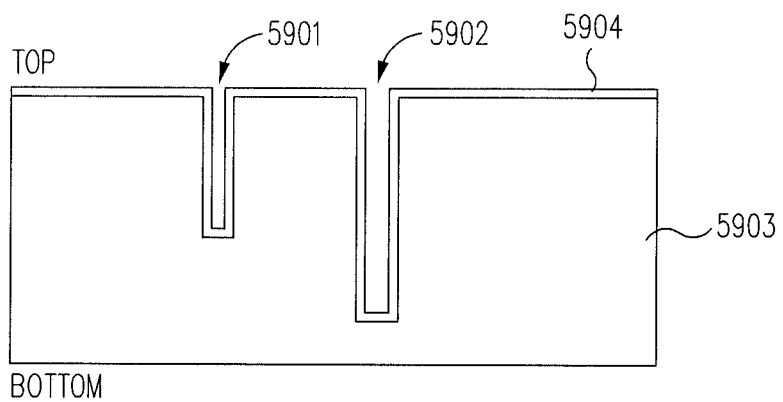
FIG. 60 illustrates the oxide layer formed in the guard trench and the regular trench, in accordance with an embodiment.

FIG. 60 illustrates an oxide layer 5904 formed in the guard trench 5901 and the regular trench 5902, in accordance with an embodiment. The oxide layer 5904 may comprise silicon dioxide and may be formed by a thermal oxidation process.

Figure 61:
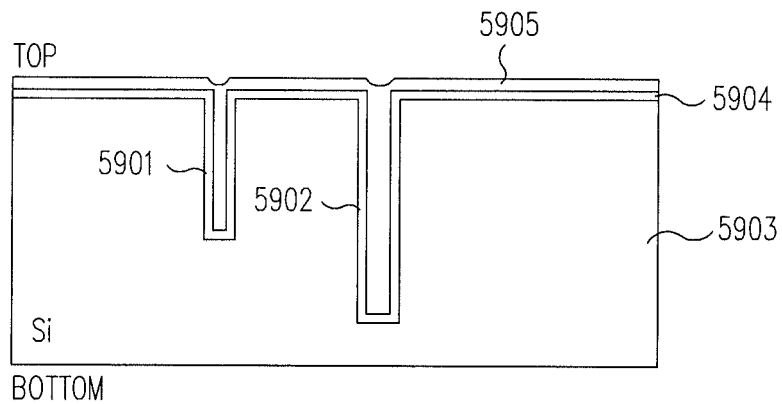
FIG. 61 illustrates polysilicon formed upon the oxide layer, in accordance with an embodiment.

FIG. 61 illustrates a polysilicon 5905 formed upon the oxide layer 5904, in accordance with an embodiment. The polysilicon 5905 may completely fill the guard trench 5901 and/or the regular trench 5902.

Figure 62:
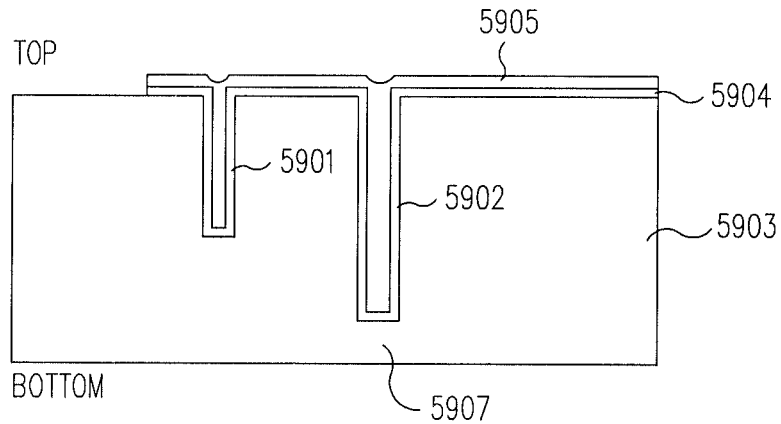
FIG. 62 illustrates the oxide layer and the polysilicon after surface etching, in accordance with an embodiment.

FIG. 62 illustrates the oxide layer 5904 and the polysilicon 5905 after surface etching, in accordance with an embodiment. During surface etching a portion of the oxide layer 5904 and the polysilicon 5905 may be removed from the top surface of the substrate 5903. For example, a portion of the oxide layer 5904 and the polysilicon 5905 may be removed from the top surface of the substrate 5903 to facilitate a desired routing of voltages upon a surface of an actuator device 6500 (see FIG. 65).

Figure 63:
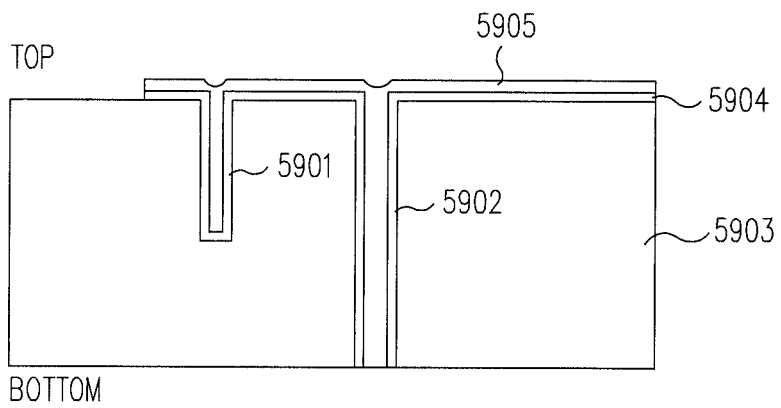
FIG. 63 illustrates the substrate after wafer thinning, in accordance with an embodiment.

FIG. 63 illustrates the substrate 5903 after a wafer thinning process, in accordance with an embodiment. During the wafer thinning process, a bottom portion 5907 (see FIG. 62) of the substrate 5903 may be removed. Removal of the bottom portion 5907 of the substrate 5903 may result in the regular trench 5902 and/or the guard trench 5901 extending from a top surface of the substrate to a bottom surface of the substrate 5903. For example, removal of the bottom portion of the substrate 5903 may result in the regular trench 5902 extending from the top surface of the substrate 5903 to the bottom surface of the substrate 5903 and the guard trench 5901 not extending from the top surface of the substrate 5903 to the bottom surface of the substrate 5903. Thus, the guard trench 5901 may be a blind trench and the regular trench 5902 may be a through trench, for example.

Figure 64:
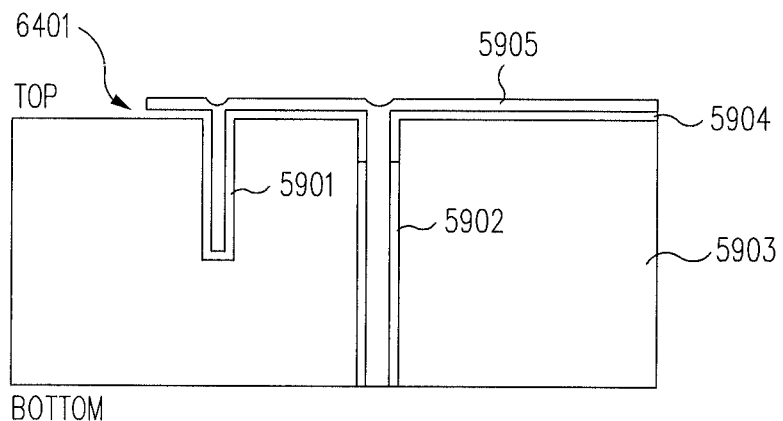
FIG. 64 illustrates the substrate, oxide layer, and polysilicon after an isotropic oxide etch, in accordance with an embodiment.

FIG. 64 illustrates the substrate 5903, the oxide layer 5904, and the polysilicon 5905 after an isotropic oxide etch, in accordance with an embodiment. After the isotropic etch, a portion of the polysilicon 5905 may be released by the formation of an undercut 6401.

The guard trench 5901 inhibits the undercut 6401 from propagating to the regular trench such that the polysilicon 5905 proximate the regular trench 5902 is not released from the substrate 5903 and thus remains substantially attached thereto. In this manner, the guard trench 5901 tends to protect the regular trench 5902 from undesirable undercut and release. The guard trench can assure mechanical support to the top ploy layer 5905, and/or prevents the overhanging ploy layer from contacting the silicon surface and causing an electrical short.

Figure 65:
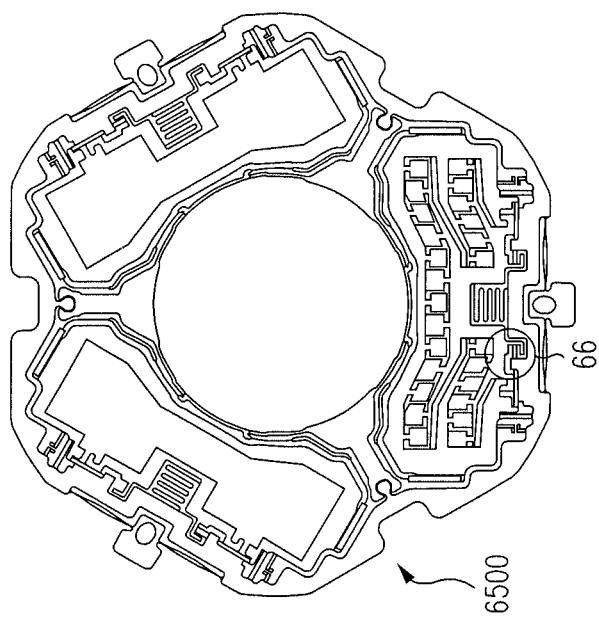
FIG. 65 illustrates an actuator device having the guard trench, in accordance with an embodiment.

FIG. 65 illustrates an actuator device 6500 having the guard trench 5901, in accordance with an embodiment. In one embodiment, actuator device 6500 may be used to implement actuator device 400. The guard trench 5901 is not shown in FIG. 65 and is shown in an enlarged view of the area within a circle 66 of FIG. 65.

Figure 66:
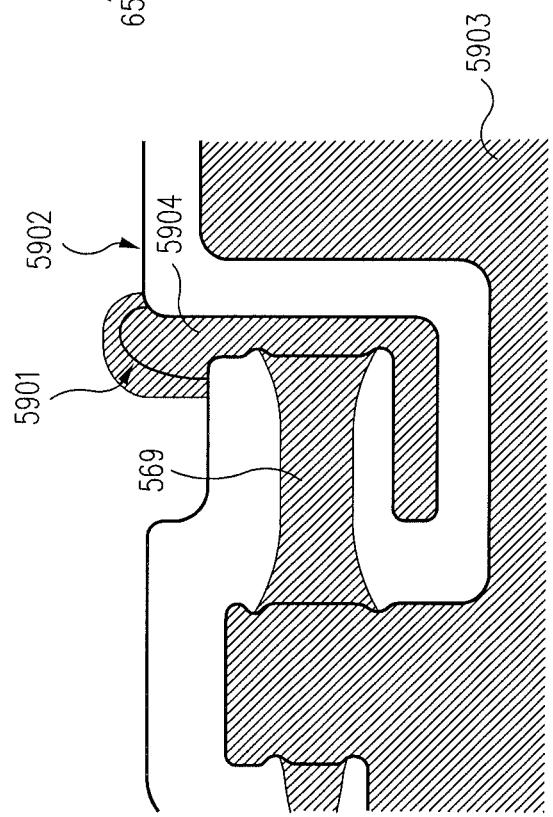
FIG. 66 illustrates an enlarged view of the guard trench, in accordance with an embodiment.

FIG. 66 illustrates the enlarged view of the guard trench 5901, in accordance with an embodiment. The guard trench 5901 is formed proximate the regular trench 5902 in the substrate 5903. In FIG. 66, the guard trench 5901 is irregular (e.g., curved) in shape and not parallel to the regular trench 5902. The guard trench 5901 tends to maintain the oxide layer 5904 in an area upon the substrate 5903 where the oxide layer 5904 is used to connect a flexure, such as a deployment torsional flexure 509, or after flexure.

FIGS. 67-74 illustrate some processes that may be used to form various embodiments disclosed herein. Those skilled in the art will appreciate that various other processes may be used. Thus, the discussion of such processes is by way of illustration only and not by way of limitation.

Figure 67:
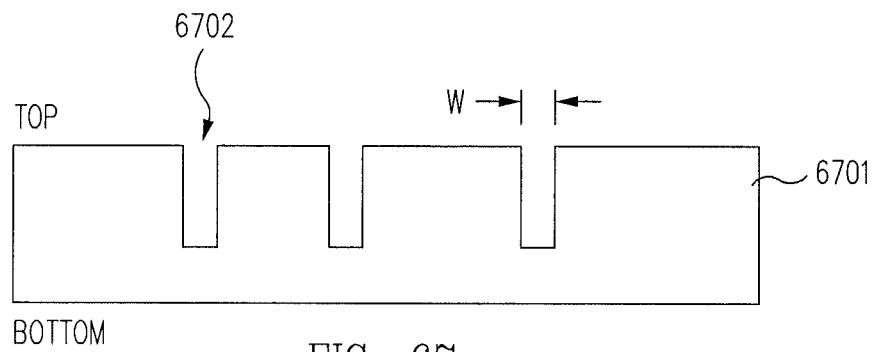
FIG. 67 illustrates a DRIE process, in accordance with an embodiment.

FIG. 67 illustrates a DRIE process, in accordance with an embodiment. The DRIE process may be used to form a plurality of trenches 6702 in a substrate 6701. The trenches 6702 may be etched in the substrate 6701 as part of a process for forming the actuator device 400 (see FIG. 5A), for example.

Figure 68:
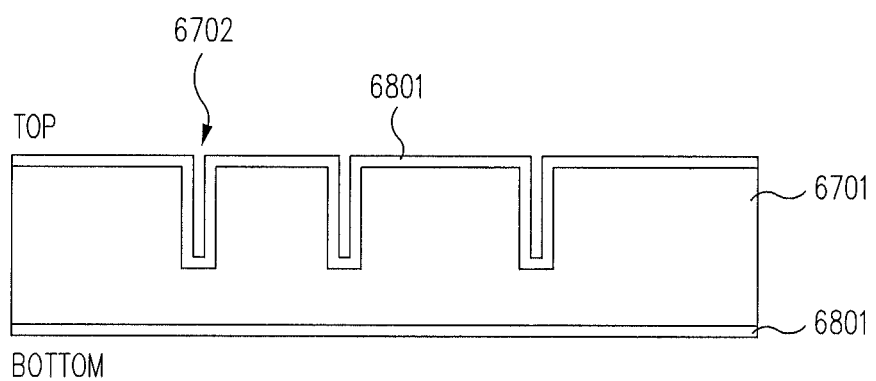
FIG. 68 illustrates a linear oxide growth process, in accordance with an embodiment.

FIG. 68 illustrates a linear oxide growth process, in accordance with an embodiment. An oxide layer 6801 may be formed over one (e.g., the top) surface of the substrate 6701. The oxide layer 6801 may be formed over both (e.g., the top and bottom) surfaces of the substrate 6701. The oxide layer 6801 may only partially fill the trenches 6702. The oxide layer 6801 may be comparatively thin with respect to a width, "W", (see FIG. 67) of the trenches 6702.

Figure 69:
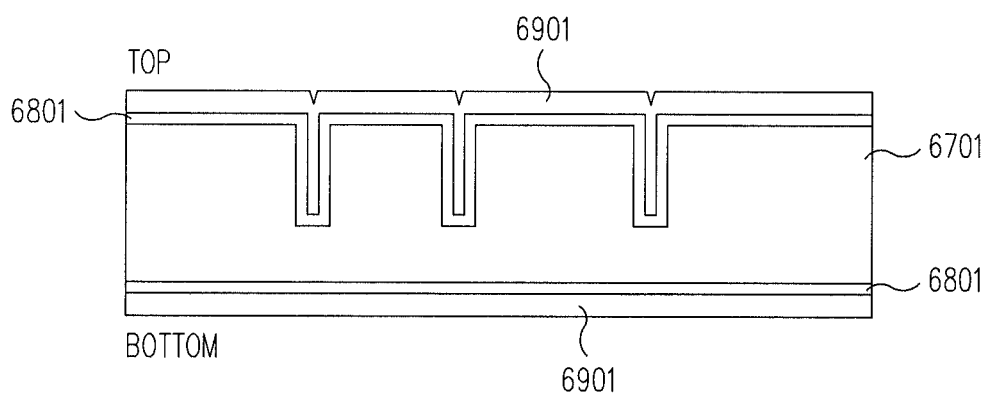
FIG. 69 illustrates a polysilicon deposition process, in accordance with an embodiment.

FIG. 69 illustrates a polysilicon (other materials are contemplated) deposition process, in accordance with an embodiment. Polysilicon 6901 may be formed over the oxide layer 6801 on one (e.g., the top) surface of the substrate 6701. The polysilicon 6901 may be formed over the oxide layers 6801 on both (e.g., the top and bottom) surfaces of the substrate 6701. The polysilicon 6901 may completely fill the trenches 6702.

Figure 70:
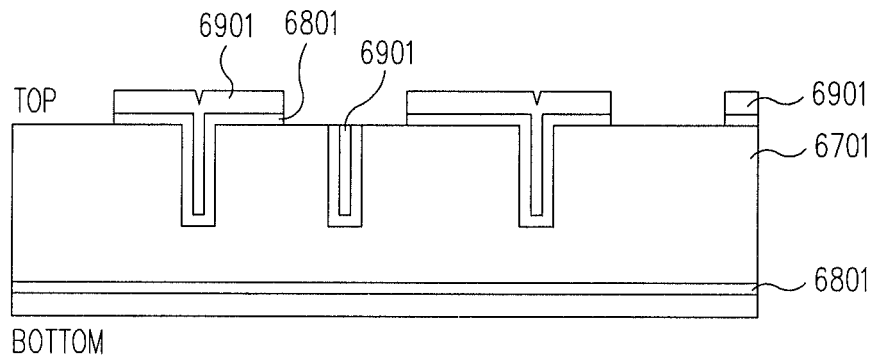
FIG. 70 illustrates a polysilicon and oxide etch process, in accordance with an embodiment.

FIG. 70 illustrates a polysilicon and oxide etch process, in accordance with an embodiment. Selected portions of the polysilicon 6901 and/or oxide layer 6801 may be removed via etching. Portions of the polysilicon 6901 and/or oxide layer 6801 that are to remain may be masked to prevent etching thereof.

In this manner, polysilicon conductors may be patterned. The polysilicon conductors may be formed inside and/or outside of the trenches 6702. The polysilicon conductors may be used to communicated voltages, such as from one location to another location of the actuator device 400. Thus, the polysilicon conductors may be used to facilitate actuation of the actuators 550.

Figure 71:
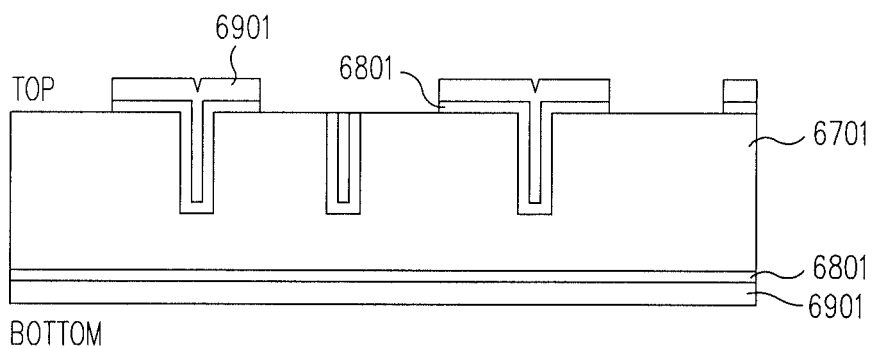
FIG. 71 illustrates a DRIE process, in accordance with an embodiment.

FIG. 71 illustrates a DRIE process, in accordance with an embodiment. The DRIE process may be used to substantially remove the polysilicon 6901 and/or the oxide layer 6801 from one or more of the trenches 6702. A mask may be used to determine what portions of the polysilicon 6901 and/or the oxide layer 6801 are removed. Removal of the polysilicon 6901 and/or oxide layer 6801 from a trench 6702 may facilitate the formation of a pinch or separation that facilitates the separation of the substrate 6701 into two portions 6701a and 6701b (see FIG. 73).

Selective removal of the oxide layer 6801 may provide a separation of a predetermined distance (i.e., the thickness of the oxide layer 6801). For example, the oxide layer 6801 may have a thickness of approximately 2 microns to 4 microns (such as 3 microns, for example) and may be removed to provide a separation between the remaining polysilicon 6901 and the substrate 6701 of this distance.

Figure 72:
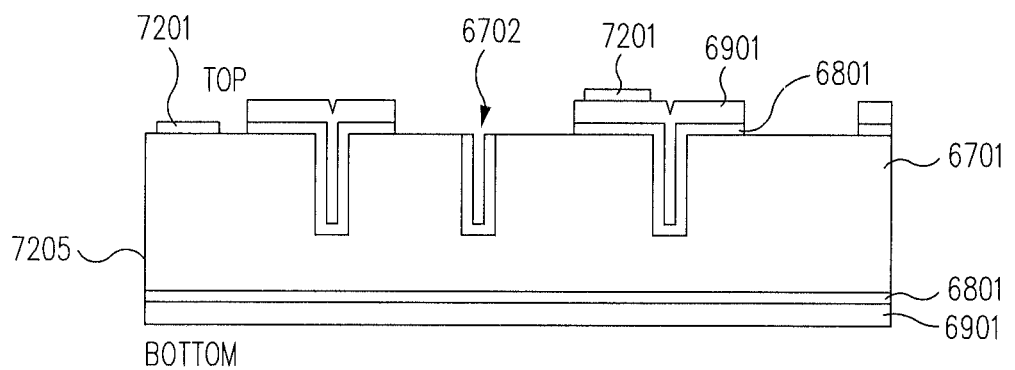
FIG. 72 illustrates a metallization process, in accordance with an embodiment.

FIG. 72 illustrates a metallization process, in accordance with an embodiment. Metal conductors, contacts, and/or bond pads 7201 may be formed upon selected portion of the substrate 6701, the oxide layer 6801, and/or the polysilicon 6901. Such bond pads 7201 may facilitate electrical connection from the lens barrel 200 (see FIG. 2) to the actuator device 400, for example.

Figure 73:
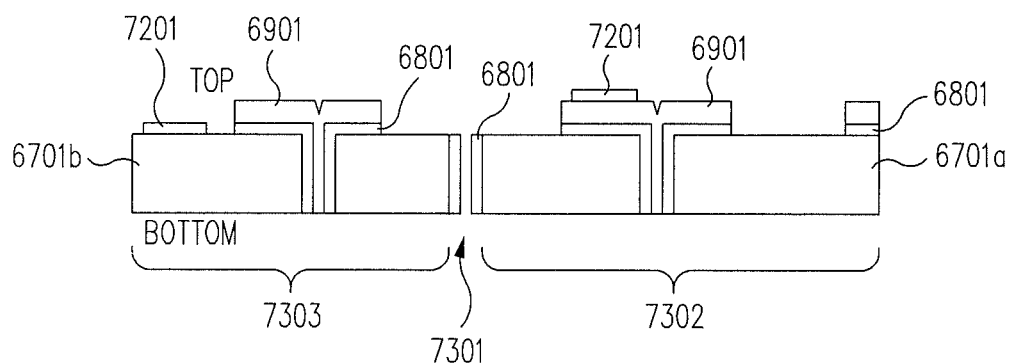
FIG. 73 illustrates a wafer thinning process, in accordance with an embodiment.

FIG. 73 illustrates a wafer thinning process, in accordance with an embodiment. A bottom portion 7205 (see FIG. 72) of the substrate 6701 may be removed such that one or more of the trenches 6801 extend completely from the top of the substrate 6701 to the bottom in manner that separates the substrate into two portions 6701a and 6701b thereof. The two portions 6701a and 6701b may be mechanically and/or electrically isolated with respect to one another.

Removal of the polysilicon 6901 from a trench 6702 may facilitate the formation of a pinch or separation that facilitates the separation of the substrate 6701 into two portions 6701a and 6701b (see FIG. 73), thus forming two separated structures or devices 7302 and 7303.

Figure 74:
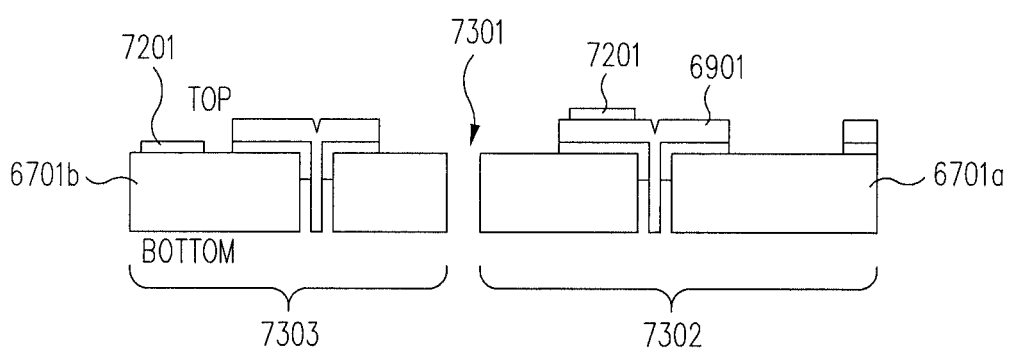
FIG. 74 illustrates isotropic oxide etch process, in accordance with an embodiment.

FIG. 74 illustrates isotropic oxide etch process, in accordance with an embodiment. The isotropic oxide etch process may be used to remove and/or undercut the oxide layer 6801 from the two portions 6701a and/or 6701b of the substrate 6701.

The selective removal of the oxide layer 6801 may facilitate the fabrication of desired structures, as discussed herein. For example, the lateral snubber assembly 1001 of FIG. 10 may be formed using such processing.

Single crystalline silicon and polysilicon are discussed herein as examples of materials from which structures may be fabricated. Such discussion is by way of example only and not by way of limitation. Various other semiconductor materials and various non-semiconductor (e.g. conductor or non-conductor) materials may be used.

Although the actuator disclosed herein is described as a MEMS actuator, such description is by way of example only and not by way of limitation. Various embodiments may include non-MEMS actuators, components of non-MEMS actuators, and/or features of non-MEMS actuators.

Thus, an actuator suitable for use in a wide variety of different electronic devices may be provided. Motion control of the actuator and/or items moved by the actuator may also be provided. As such, an enhanced miniature camera for use in electronic devices may be provided.

According to various embodiments, smaller size and enhanced shock resistance for miniature cameras are provided. Enhanced fabrication techniques may be used to provide these and other advantages. Thus, such fabrication techniques may additionally enhance the overall quality and reliability of miniature cameras while also substantially reducing the cost thereof.

Where applicable, the various components set forth herein may be combined into composite components and/or separated into sub-components. Where applicable, the ordering of various steps described herein may be changed, combined into composite steps, and/or separated into sub-steps to provide features described herein.

Embodiments described herein illustrate but do not limit the disclosure. It should also be understood that numerous modifications and variations are possible in accordance with the principles of the disclosure.

What is claimed is:

1. A device comprising:
a flexure comprised of a first material and interconnecting two structures;
a trench disposed in the flexure and separating the first material into a first portion and a second portion thereof;
a second material disposed in the trench and extending over a top portion of the first material;
a third material disposed on the second material;
wherein the trench and the second material cooperate to electrically isolate the first portion and the second portion from one another; and
wherein the flexure is configured to restrict motion along one direction while allowing motion along another direction for one of the two structures with respect to the other of the two structures.

2. The device as recited in claim 1, wherein the third material facilitates electrical contact between a contact on one side of the flexure and an actuator on another side of the flexure.

3. The device as recited in claim 1, wherein the trench is formed substantially perpendicular to a length of the flexure, wherein the first material is single crystalline silicon and wherein the third material is polysilicon.

4. The device as recited in claim 1, wherein the trench is formed by a deep reactive-ion etching (DRIE) process.

5. The device as recited in claim 1, further comprising a pad comprised of single crystalline silicon and disposed upon the first portion;
an additional trench formed through the pad;
a layer of additional material disposed within the additional trench; and
polysilicon disposed upon the layer of additional material and extending from an upper surface of the pad to a bottom surface of the pad.

6. The device as recited in claim 5, further comprising a metal contact in electrical communication with the polysilicon, wherein the metal contact is formed upon the pad and wherein the pad and an outer frame are on opposite sides of the flexure.

7. An electronic device comprising the device of claim 1, wherein the second material comprises oxide.

8. The device of claim 1, further comprising:
the two structures;
an outer frame;
an actuator formed to the outer frame;
wherein the first material comprises a first semiconductor material;
wherein the flexure is formed to the outer frame, the flexure interconnecting the outer frame with a structure;
wherein the second material comprises an electrically insulating material;
wherein the third material comprises a second semiconductor material; and
wherein the outer frame comprises the one of the two structures.

9. The system as recited in claim 8, wherein the second semiconductor material facilitates electrical contact between a contact on the flexure and the actuator.

10. The system as recited in claim 8, wherein the trench is formed substantially perpendicular to a length of the flexure, wherein the first semiconductor material is single crystalline silicon, and wherein the second semiconductor material is polysilicon.

11. The system as recited in claim 8, wherein the trench is formed by a deep reactive-ion etching (DRIE) process.

12. The system as recited in claim 8, further comprising:
a pad comprised of single crystalline silicon and formed upon the first portion;
an additional trench formed through the pad;
an electrically insulating layer formed within the additional trench; and
polysilicon formed upon the electrically insulating layer within the additional trench and extending from an upper surface of the pad to a bottom surface of the pad.

13. The system as recited in claim 12, further comprising a metal contact in electrical communication with the polysilicon, wherein the structure comprises a pad, the metal contact is formed upon the pad, and wherein the pad and the outer frame are on opposite sides of the flexure.

14. An electronic device comprising the system of claim 8, wherein the electrically insulating layer comprises oxide.

15. A method comprising:
forming a flexure that interconnects two structures;
forming a trench within the flexure;
forming an electrically insulating layer within the trench;
forming a conductive material upon the electrically insulating layer; and
wherein the flexure is configured to restrict motion along one direction while allowing motion along another direction for one of the two structures with respect to the other of the two structures.

16. The method as recited in claim 15, wherein:
the forming a flexure comprises forming a flexure comprised of a first semiconductor material; and
the forming a conductive material upon the electrically insulating layer comprises forming a conductive material comprised of a second semiconductor material.

17. The method as recited in claim 15, wherein the conductive material facilitates electrical contact between a contact on one side of the flexure and an actuator on another side of the flexure.

18. A method comprising:
applying a voltage to an actuator via a trench of a flexure of the actuator;
wherein the flexure attaches the actuator to a lens barrel of a device; and
moving a structure with the actuator based on the voltage.

19. The method as recited in claim 18, further comprising:
providing the actuator and the lens barrel;
wherein the structure comprises an optical element.

20. The method as recited in claim 18, wherein a conductor in the trench facilitates electrical contact between a contact on one side of the flexure and the actuator on another side of the flexure.

* * * * *